United States Patent
Choi et al.

(10) Patent No.: US 11,637,174 B2
(45) Date of Patent: Apr. 25, 2023

(54) INTEGRATED CIRCUIT DEVICE AND METHOD OF MANUFACTURING THE SAME

(71) Applicant: Samsung Electronics Co., Ltd., Suwon-si (KR)

(72) Inventors: Yoonyoung Choi, Seoul (KR); SangJae Park, Seoul (KR); Dongkyun Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 274 days.

(21) Appl. No.: 17/036,731

(22) Filed: Sep. 29, 2020

(65) Prior Publication Data
US 2021/0296431 A1    Sep. 23, 2021

(30) Foreign Application Priority Data
Mar. 18, 2020  (KR) .................. 10-2020-0033309

(51) Int. Cl.
*H01L 49/02*  (2006.01)
*H01L 27/108*  (2006.01)

(52) U.S. Cl.
CPC ........ *H01L 28/91* (2013.01); *H01L 27/10808* (2013.01); *H01L 28/40* (2013.01)

(58) Field of Classification Search
CPC ... H01L 28/40; H01L 28/60; H01L 28/90–92; H01L 27/10805; H01L 27/10852; H01L 27/10808; H01L 28/91; H01L 27/10847
See application file for complete search history.

(56) References Cited

U.S. PATENT DOCUMENTS

| | | | |
|---|---|---|---|
| 8,841,195 B2 | 9/2014 | Sun et al. | |
| 9,099,402 B2 | 8/2015 | Abatchev et al. | |
| 9,159,729 B2 | 10/2015 | Kim et al. | |
| 2013/0140265 A1 | 6/2013 | Kim et al. | |
| 2016/0155793 A1* | 6/2016 | Kim | H01L 27/10852 |
| | | | 257/532 |

FOREIGN PATENT DOCUMENTS

| | | |
|---|---|---|
| JP | 2011166071 A | 8/2011 |
| KR | 100450678 B1 | 10/2004 |

(Continued)

*Primary Examiner* — Jose R Diaz
(74) *Attorney, Agent, or Firm* — Harness, Dickey & Pierce, P.L.C.

(57) ABSTRACT

An integrated circuit device including a lower electrode on a substrate, the lower electrode including a first lower electrode portion extending in a first direction perpendicular to a top surface of the substrate and including a first main region and a first top region, and a second lower electrode portion extending in the first direction on the first lower electrode portion and including a second main region and a second top region; a first top supporting pattern surrounding at least a portion of a side wall of the first top region of the first lower electrode portion; and a second top supporting pattern surrounding at least a portion of a side wall of the second top region of the second lower electrode portion, and the second lower electrode portion includes a protrusion protruding outward to the second top supporting pattern.

20 Claims, 48 Drawing Sheets

(56) References Cited

FOREIGN PATENT DOCUMENTS

| | | | |
|---|---|---|---|
| KR | 20110108548 | A | 10/2011 |
| KR | 101178573 | B1 | 8/2012 |
| KR | 20130063072 | A | 6/2013 |
| KR | 20150049506 | A | 5/2015 |
| KR | 101924861 | B1 | 12/2018 |
| KR | 101944479 | B1 | 1/2019 |

\* cited by examiner

A1 – A1'

A1 – A1'

A1 – A1'

B1 – B1'

A1 – A1'

B2 - B2'

A1 – A1'

A1 – A1'

A1 - A1'

A1 – A1'

B1 – B1'

A1 – A1'

A1 – A1'

A1 – A1'

A1 – A1'

A1 – A1'

A1 - A1'

A1 – A1'

B1 – B1'

A1 – A1'

B1 - B1'

A1 – A1'

B1 - B1'

A1 – A1'

B1 - B1'

A1 – A1'

A1 – A1'

A1 – A1'

A2 – A2'

A2 – A2'

B2 - B2'

A2 − A2'

INTEGRATED CIRCUIT DEVICE AND METHOD OF MANUFACTURING THE SAME

CROSS-REFERENCE TO RELATED APPLICATION

This application claims the benefit of Korean Patent Application No. 10-2020-0033309, filed on Mar. 18, 2020, in the Korean Intellectual Property Office, the disclosure of which is incorporated herein in its entirety by reference.

BACKGROUND

The inventive concepts relates to an integrated circuit device and a method of manufacturing the integrated circuit device, and more particularly, to an integrated circuit device including a capacitor structure and a method of manufacturing the integrated circuit device including the capacitor structure.

Due to downscaling of integrated circuit devices, sizes of capacitor structures included in such integrated circuit devices are also decreasing. Accordingly, the development of a device having an increased capacitance and improved electrical properties despite decrease in a size of a capacitor structure is beneficial.

SUMMARY

The inventive concepts relate to providing integrated circuit devices including lower electrodes having a relatively great height while reducing bridge failure between a plurality of lower electrodes even when distances between the plurality of lower electrodes are relatively small.

The inventive concepts relate to providing methods of manufacturing an integrated circuit device including lower electrodes having a relatively great height while reducing bridge failure between a plurality of lower electrodes even when distances between the plurality of lower electrodes are relatively small.

According to an aspect of the inventive concepts, there is provided an integrated circuit device including: a lower electrode arranged on a substrate, the lower electrode including: a first lower electrode portion extending in a first direction perpendicular to a top surface of the substrate and including a first main region and a first top region, and a second lower electrode portion extending in the first direction on the first lower electrode portion and including a second main region and a second top region; a first top supporting pattern surrounding at least a portion of a side wall of the first top region of the first lower electrode portion; and a second top supporting pattern surrounding at least a portion of a side wall of the second top region of the second lower electrode portion, and the second lower electrode portion includes a protrusion protruding outward to the second top supporting pattern.

According to another aspect of the inventive concepts, there is provided an integrated circuit device including: a lower electrode arranged on a substrate, the lower electrode including a first lower electrode portion extending in a first direction perpendicular to a top surface of the substrate and including a first main region and a first top region, and a second lower electrode portion extending in the first direction on the first lower electrode portion and including a second main region and a second top region; a first top supporting pattern surrounding at least a portion of a side wall of the first top region of the first lower electrode portion; a first middle supporting pattern surrounding at least a portion of the side wall of the first main region of the first lower electrode portion; and a second top supporting pattern surrounding at least a portion of a side wall of the second top region of the second lower electrode portion, and the first lower electrode portion includes a protrusion protruding outward to the first top supporting pattern, and the second lower electrode portion includes a protrusion protruding outward to the second top supporting pattern.

According to another aspect of the inventive concepts, there is provided an integrated circuit device including: a lower electrode arranged on a substrate, the lower electrode including a first lower electrode portion extending in a first direction perpendicular to a top surface of the substrate, and a second lower electrode portion extending in the second direction above the first lower electrode; a first top supporting pattern surrounding an upper portion of a side wall of the first lower electrode portion; a first middle supporting pattern surrounding a portion of the side wall of the first lower electrode portion at a vertical level lower than a bottom surface of the first top supporting pattern; and a second top supporting pattern surrounding an upper portion of a side wall of the second lower electrode, the second lower electrode portion includes a protrusion being in contact with the second top supporting pattern, and the side wall of the first lower electrode portion includes a step portion at a vertical lower than the bottom surface of the first middle supporting pattern.

According to another aspect of the inventive concepts, there is provided a method of manufacturing an integrated circuit device, the method including forming, on a substrate, a mold stack including a first top supporting pattern; forming a first opening penetrating the first mold stack; forming a first lower electrode portion by filling a conductive material in the first opening; forming a second mold including comprising a second top supporting pattern on the first mold stack and the first lower electrode portion; forming a second opening penetrating the second mold stack; forming a second lower electrode portion by filling a conductive material in the second opening; exposing a portion of a side wall of the second lower electrode portion by removing a portion of the second mold stack; and forming a protrusion of the second lower electrode portion by performing a trimming process at a portion of the side wall of the exposed second lower electrode portion.

BRIEF DESCRIPTION OF THE DRAWINGS

Embodiments of the inventive concepts will be more clearly understood from the following detailed description taken in conjunction with the accompanying drawings in which:

FIGS. 29 through 33B are cross-sectional views showing a manufacturing method of an integrated circuit device according to process orders, according to example embodiments; and particularly, FIGS. 29, 30, 31A, 32A and 33A show cross-sections corresponding to the cross-section taken along line A2-A2' shown in FIG. 8, and FIGS. 31B, 32B, and 33B show cross-sections corresponding to cross-section taken along line B2-B2' shown in FIG. 2.

DETAILED DESCRIPTION OF THE EMBODIMENTS

Hereinafter, example embodiments of the inventive concepts will be described in detail with reference to the accompanying drawings.

Figure 1:
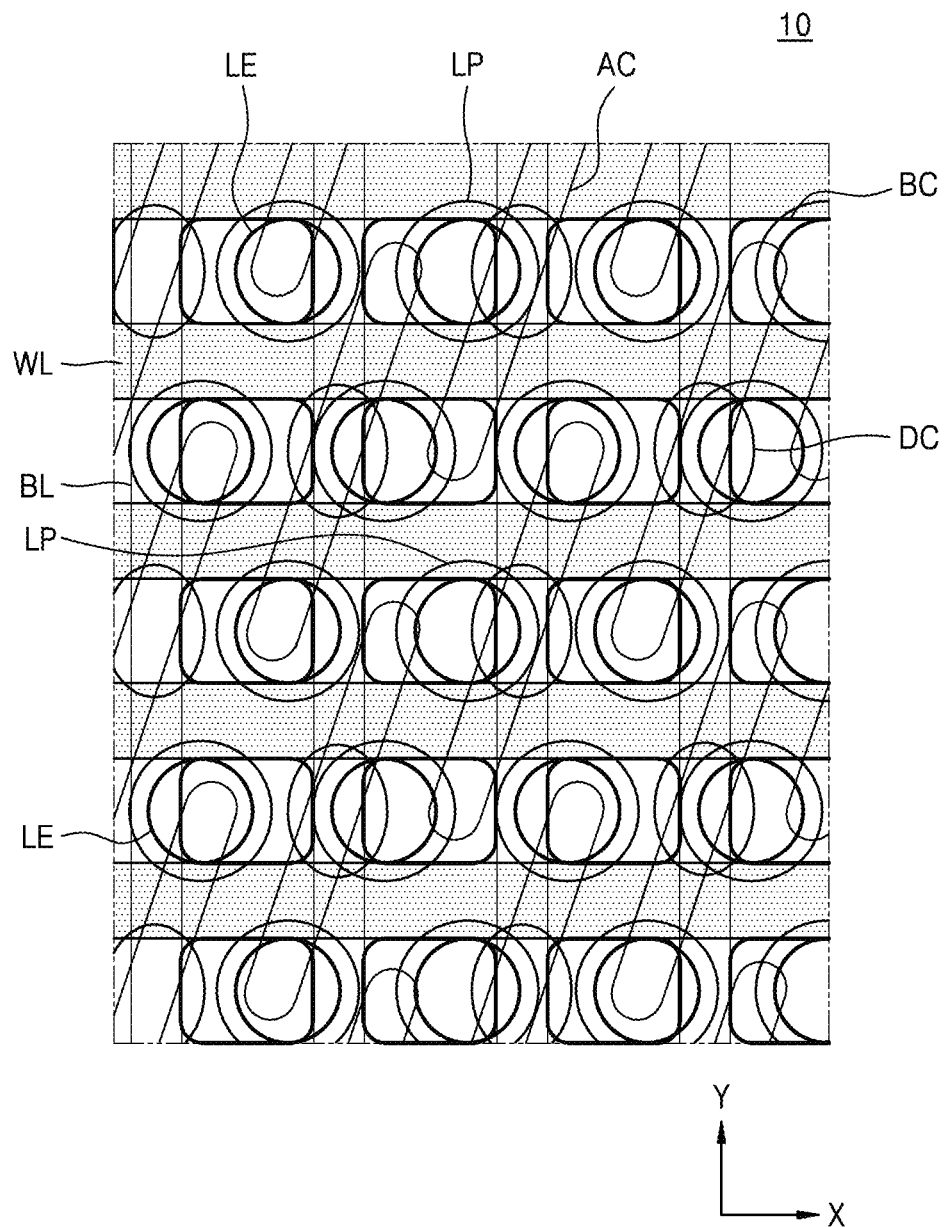
FIG. 1 is a layout diagram illustrating some configurations of an integrated circuit device according to example embodiments.

FIG. 1 is a layout diagram of some configurations of an integrated circuit device 10 according to example embodiments.

Referring to FIG. 1, a plurality of active regions AC each having a relatively long island shape including a short axis and a long axis may be arranged. A plurality of word lines WL may extend in a first direction (the X direction) across the plurality of active regions AC. A direct contact DC may be arranged above a portion of the active region AC arranged between the plurality of word lines WL, and a plurality of bit lines BL may extend in a second direction (the Y direction) above the direct contact DC. A buried contact BC may be arranged above a portion of the active region AC arranged between a plurality of bit lines BL, and a lower electrode LE may be arranged above the buried contact BC. A landing pad LP may be selectively arranged above the lower electrode LE and the buried contact BC.

Figure 2:
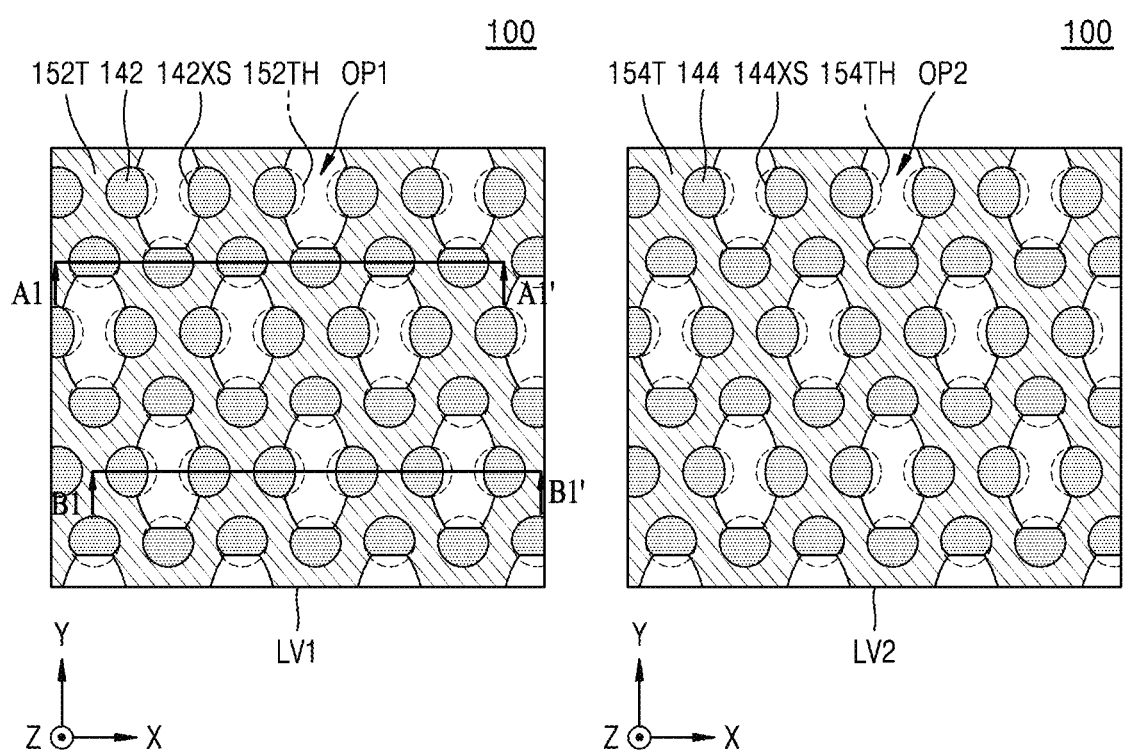
FIG. 2 illustrates top-plan views of some configurations of an integrated circuit device according to example embodiments.
Figure 3A:
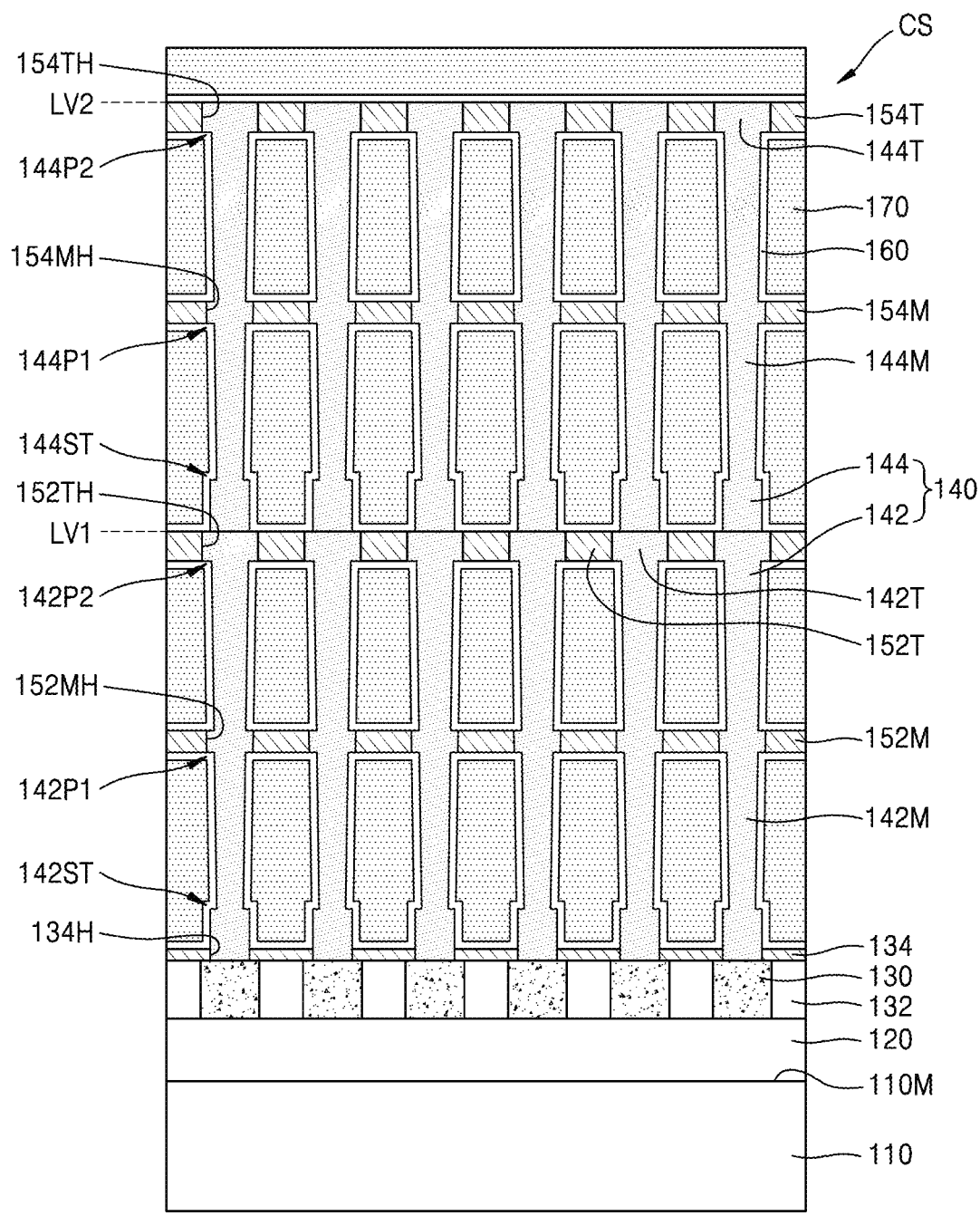
FIG. 3A is a cross-sectional view taken along line A1-A1' shown in FIG. 2.
Figure 3B:
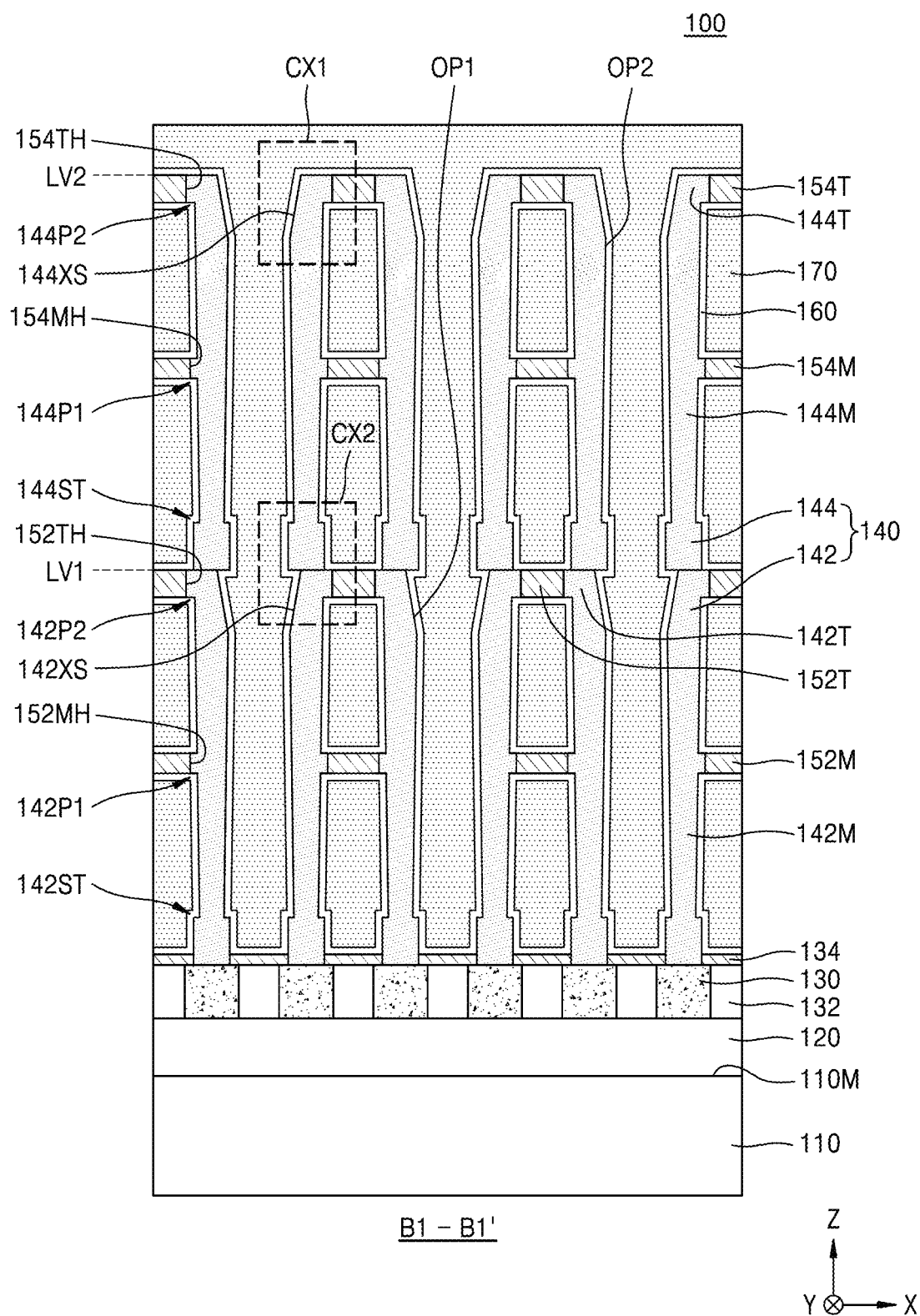
FIG. 3B is a cross-sectional view taken along line B1-B1' shown in FIG. 2.
Figure 3C:
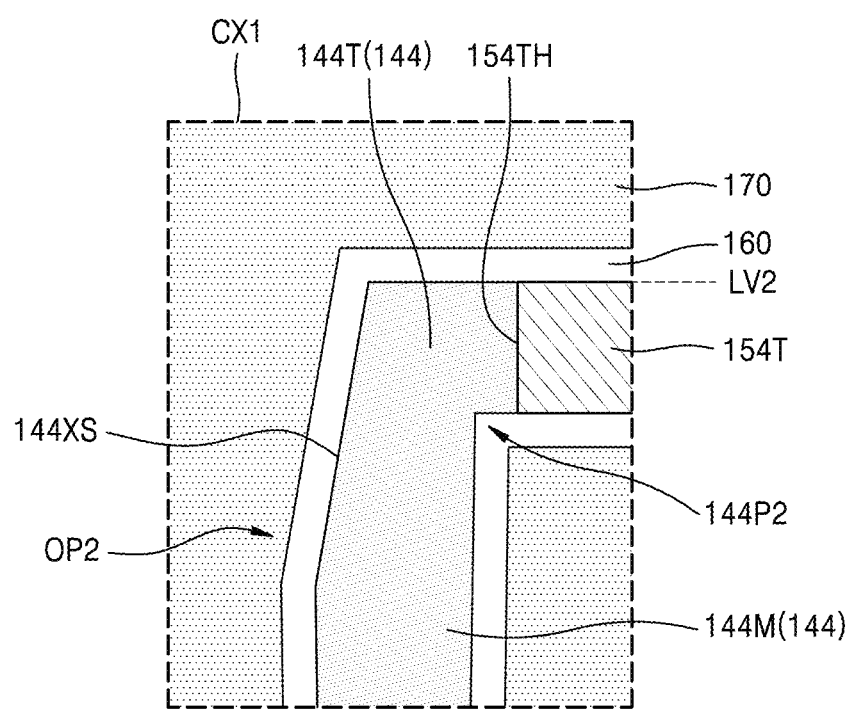
FIG. 3C is an enlarged view of region CX1 shown in FIG. 3B.

FIG. 2 illustrates top-plan views of some configurations of an integrated circuit device 100 according to example embodiments. The left view of FIG. 2 is a top-plan view seen from a first vertical level LV1, and the right view of FIG. 2 is a top-plan view seen from a second vertical level LV2. FIG. 3A is a cross-sectional view taken along line A1-A1' shown in FIG. 2, FIG. 3B is a cross-sectional view taken along line B1-B1' shown in FIG. 2, FIG. 3C is an enlarged view of region CX1 shown in FIG. 3B, and FIG. 3D is an enlarged view of region CX2 shown in FIG. 3B.

Figure 3D:
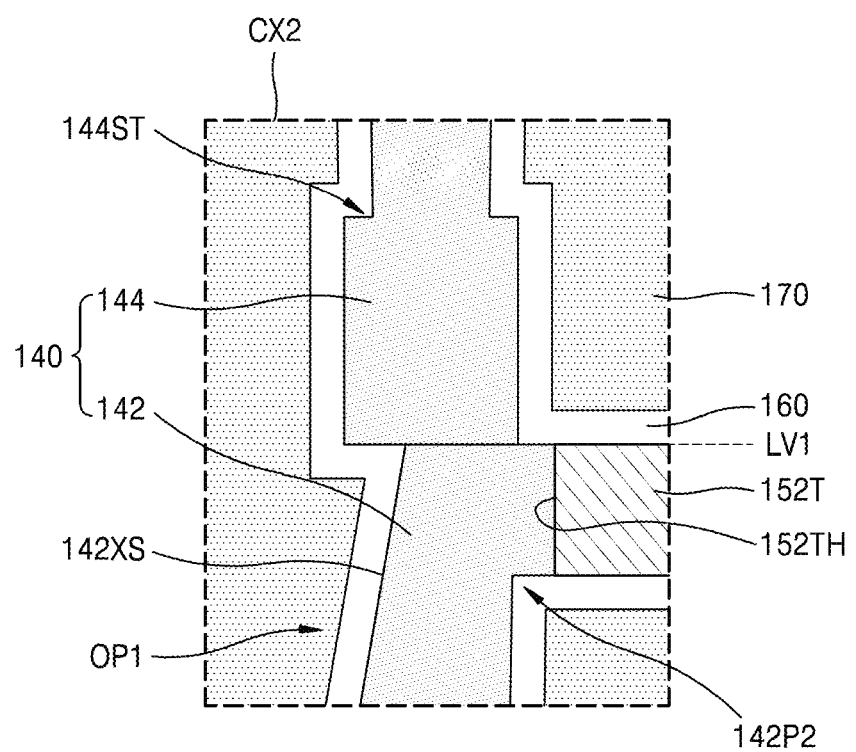
FIG. 3D is an enlarged view of region CX2 shown in FIG. 3B.

Referring to FIGS. 2 through 3D, the integrated circuit device 100 may correspond to a portion of the integrated circuit device 10 shown in FIG. 1. A substrate 110 may include the active region AC (see FIG. 1) defined by an isolation layer (not shown). In example embodiments, the substrate 110 may include a semiconductor material such as silicon (Si), germanium (Ge), or silicon-germanium (SiGe), silicon carbide (SiC), gallium arsenide (GaAs), indium arsenide (InAs), or indium phosphide (InP). In example embodiments, the substrate 110 may include a conductive region, for example a well doped with impurities or a structure doped with impurities.

Although not shown, a plurality of gate line trenches (not shown) extending in the first direction (the X direction) may be formed above the substrate 100, and the plurality of word lines WL (see FIG. 1) may be arranged in the plurality of gate line trenches. The plurality of word lines WL may include a gate insulating layer (not shown) and a gate electrode (not shown).

A lower structure 120 may be arranged on a top surface 110M of the substrate 100. For example, the plurality of bit lines BL, the buried contacts BC, and the direct contacts DC described with reference to FIG. 1 may be included in the lower structure 120.

Landing pads 130 may be arranged on the lower structure 120. The landing pads 130 may correspond to the landing pads LP described with reference to FIG. 1, and may be arranged apart from each other at preset, or, desired, intervals in the first direction (the X direction) and the second direction (the Y direction). A sidewall of the landing pad 130 may be surrounded by a node isolation insulating layer 132 and may be electrically connected to the active region AC through the direct contact DC. The landing pad 130 may include at least one of metals such as ruthenium (Ru), titanium (Ti), tantalum (Ta), niobium (Nb), iridium (Jr), molybdenum (Mo), and tungsten (W), and conductive metal nitride such as titanium nitride (TiN), tantalum nitride (TaN), niobium nitride (NbN), molybdenum nitride (MoN), and tungsten nitride (WN). In some embodiments, the landing pad 130 may include TiN.

An etch stopping layer 134 may be formed on the landing pad 130 and the node isolation insulating layer 132. The etch stopping layer 134 may include an opening 134H exposing a top surface of the landing pad 130.

A capacitor structure CS may be arranged on the etch stopping layer 134. The capacitor structure CS may include a lower electrode 140 electrically connected to the landing pad 130, a dielectric layer 160 conformally covering the lower electrode 140, and an upper electrode 170 above the dielectric layer 160.

The lower electrode 140 may be arranged above the landing pad 130, and a bottom portion of the lower electrode 140 may be arranged in the opening 134H of the etch stopping layer 134. A width of the bottom portion of the lower electrode 140 may be less than a width of the landing pad 130, and accordingly, a whole bottom surface of the lower electrode 140 may contact the landing pad 130.

In example embodiments, the lower electrode 140 may include a first lower electrode portion 142 arranged on the landing pad 130 and a second lower electrode portion 144 arranged on the first lower electrode portion 142. The first lower electrode portion 142 and the second lower electrode portion 144 may extend to relatively greater heights in a third direction (the Z direction) that is perpendicular to the top surface 110M of the substrate 110.

The first lower electrode portion 142 may include a first main region 142M and a first top region 142T. The first top region 142T of the first lower electrode portion 142 may be surrounded by a first top supporting pattern 152T, and a portion of a side wall of the first main region 142M of the first lower electrode portion 142 may be surrounded by a first middle supporting pattern 152M. For example, the first top supporting pattern 152T may include a first opening 152TH, and the first top region 142T of the first lower electrode portion 142 may be arranged in the first opening 152TH. For example, the first middle supporting pattern 152M may include a second opening 152MH, and a portion of the side wall of first main region 142M of the first lower electrode portion 142 may be arranged in the second opening 152MH. The first top supporting pattern 152T and the first middle supporting pattern 152M may function as supporting members to prevent or reduce the likelihood that the first lower electrode portion 142, which have a relatively high aspect ratio, from tilting or collapsing toward another first lower electrode portion 142 adjacent to the first lower electrode portion 142.

In example embodiments, as shown in FIG. 3A, a top surface of the first top supporting pattern 152T may be at a first vertical level LV1, and a top surface of the first top region 142T may be at a same, or substantially the same, level as that of the top surface (that is, at the first vertical level LV1) of the first top supporting pattern 152T. Otherwise, unlike shown in FIG. 3A, the top surface of the first top region 142T may be at a level higher than that of the top surface (that is, at a level higher than the first vertical level LV1) of the first top supporting pattern 152T.

The second lower electrode portion 144 may include a second main region 144M and a second top region 144T. The second main region 144M may be arranged on the top surface of the first top region 142T of the first lower electrode portion 142 and may extend in a direction identical to a direction in which the first lower electrode portion 142 extends. The second top region 144T of the second lower electrode portion 144 may be surrounded by a second top supporting pattern 154T, and a portion of a side wall of the second main region 144M of the second lower electrode portion 144 may be surrounded by a second middle supporting pattern 154M. For example, the second top supporting pattern 154T may include a third opening 154TH, and the second top region 144T of the second lower electrode portion 144 may be arranged in the third opening 154TH. For example, the second middle supporting pattern 154M may include a fourth opening 154MH, and a portion of the side wall of the second main region 144M of the second lower electrode portion 144 may be arranged in the fourth opening 154MH.

In example embodiments, as shown in FIG. 3A, a top surface of the second top supporting pattern 154T may be at the second vertical level LV2, and a top surface of the second top region 144T may be at a level identical to that of the top surface of the second top supporting pattern 154T (that is, the second vertical level LV2). Otherwise, unlike shown in FIG. 3A, the top surface of the second top region 144T may be at a level higher than that of the top surface of the second top supporting pattern 154T (that is, at a level higher than the second vertical level LV2).

The first main region 142M of the first lower electrode portion 142 may include a first protrusion 142P1 being in contact with the first middle supporting pattern 152M, and the first top region 142T of the first lower electrode portion 142 may include a second protrusion 142P2 being in contact with the first top supporting pattern 152T. The first protrusion 142P1 and the second protrusion 142P2 may protrude outward with respect to the side wall of the first main region 142M, the first protrusion 142P1 may be surrounded by the first middle supporting pattern 152M, and the second protrusion 142P2 may be surrounded by the first top supporting pattern 152T. The first top region 142T includes the second protrusion 142P2, and therefore, a width of the first top region 142T in the first direction (the X direction) may be greater than a width of the first main region 142M in the first direction (the X direction).

The first main region 142M of the first lower electrode portion 142 may include a step portion 142ST at a side wall thereof. The step portion 142ST may be formed at a level lower than that of a bottom surface of the first middle supporting pattern 152.

According to some example embodiments, the step portion 142ST is formed by a first trimming process of removing a preset, or, desired, thickness of the side wall of the first lower electrode portion 142, and at this time, because a portion of the side wall of the first lower electrode portion 142 surrounded by the first middle supporting pattern 152 is not removed, the first protrusion 142P1 may be formed, and because a side wall of the first top region 142T of the first lower electrode 142 surrounded by the first top supporting pattern 152T is not removed, the second protrusion 142P2 may be formed.

The second main region 144M of the second lower electrode portion 144 may include a third protrusion 144P1 being in contact with the second middle supporting pattern 154M, and the second top region 144T of the second lower electrode portion 144 may include a fourth protrusion 144P2 being in contact with the second top supporting pattern 154T. The third protrusion 144P1 and the fourth protrusion 144P2 may protrude outward with respect to the side wall of the second main region 144M, the third protrusion 144P1 may be surrounded by the second middle supporting pattern 154M, and the fourth protrusion 144P2 may be surrounded by the second top supporting pattern 154T. The second top region 144T includes the fourth protrusion 144P2, and therefore, a width of the second top region 144T in the first direction (the X direction) may be greater than a width of the second main region 144M in the first direction (the X direction).

In addition, the second main region 144M of the second lower electrode portion 144 may include a step portion 144ST at a side wall thereof. The step portion 144ST may be formed at a level lower than a bottom surface of the second middle supporting pattern 154M.

According to some example embodiments, the step portion 144ST may be formed by a second trimming process of removing a preset, or desired, thickness of a sidewall of the second lower electrode portion 144. The second trimming may be performed separately from the first trimming process. In other words, the second trimming process may not be performed simultaneously with the first trimming process. At this time, because a portion of a side wall of the second lower electrode 144 surrounded by the second middle supporting pattern 154M is not removed, the third protrusion 144P1 may be formed, and because a portion of a side wall of the second top region 144T of the second lower electrode portion 144 surrounded by the second top supporting pattern 154T is not removed, the fourth protrusion 144P2 may be formed.

As shown in FIGS. 2 and 3B, the first top supporting pattern 152 may define a first mold opening OP1. The first lower electrode 142 may include an inclined surface 142XS formed in the first top region 142T, wherein the inclined surface 142XS may be exposed to the first mold opening OP1 and may not be surrounded by the first top supporting pattern 152T. With respect to the inclined surface 142XS of the first lower electrode portion 142, the bottom portion of the second lower electrode portion 144 may protrude outwards.

According to some example embodiments, the inclined surface 142XS may be formed by a process of forming the first mold opening OP by etching the first top supporting pattern 152T and trimming an exposed portion of the first top region 142T of the first lower electrode portion 142 that is exposed by the first mold opening OP1. By performing the trimming process, a distance between a first top region 142T of the first lower electrode portion 142T and another first top region 142T of the first lower electrode portion 142T adjacent to the first top region 142T may increase, and a material such as an etchant may be easily supplied through the first mold opening OP1.

As shown in FIGS. 2 and 3B, the second top supporting pattern 154T may define a second mold opening OP2. The second lower electrode 144 may include an inclined surface 144XS formed in the second top region 144T2, and the inclined surface 144XS may be exposed to the second mold opening OP2 and may not be surrounded by the second top supporting pattern 154T.

According to some example embodiments, the inclined surface 144XS may be formed by a process of forming the second mold opening OP2 by etching the second top supporting pattern 154T and trimming an exposed portion of the second top region 144T of the second lower electrode portion 144 that is exposed by the second mold opening OP2. The trimming process for forming the inclined surface 144XS may be performed separately from the trimming process for forming the inclined surface 142XS (for example, the trimming process for forming the inclined surface 144XS may not be performed simultaneously with the trimming process for forming the inclined surface 142XS).

As shown in FIGS. 2 and 3A, the first lower electrode portion 142 and the second lower electrode portion 144 may have the form of a pillar or column extending in the vertical direction (the Z direction). At a vertical level lower than the bottom surface of the first top supporting pattern 152T, a horizontal cross-section of the first lower electrode portion 142 may be circular, and at the first vertical level LV1, the horizontal cross-section of the first lower electrode 142 may include a non-circular portion that is defined by the inclined surface 142XS. At a vertical level lower than the bottom surface of the second top supporting pattern 154T, a horizontal cross-section of the second lower electrode portion 144 may be circular, and at the second vertical level LV2, the horizontal cross-section of the second lower electrode portion may include a non-circular portion that is defined by the inclined surface 144XS.

In example embodiments, the first lower electrode portion 142 and the second lower electrode portion 144 may each include at least one of a metal such as ruthenium (Ru), titanium (Ti), tantalum (Ta), niobium (Nb), iridium (Jr), molybdenum (Mo), and tungsten (W), a conductive metal nitride such as titanium nitride (TiN), tantalum nitride (TaN), niobium nitride (NbN), molybdenum nitride (MoN), and tungsten nitride (WN), and a conductive metal oxide such as iridium oxide ($IrO_2$), ruthenium oxide ($RuO_2$), and strontium rutanate ($SrRuO_3$).

The first top supporting pattern 152T, the first middle supporting pattern 152M, the second top supporting pattern 154T, and the second middle supporting pattern 154M may include silicon nitride, silicon oxynitride, silicon boron nitride (SiBN), and/or silicon carbon nitride (SiCN).

The dielectric layer 160 may be arranged on the side wall and the top surface of the lower electrode 140. The dielectric layer 160 may extend from the side wall of the lower electrode 140 to the top surfaces and bottom surfaces of the first top supporting pattern 152T, the first middle supporting pattern 152M, the second top supporting pattern 154T, and the second middle supporting pattern 154M, and may also be arranged on the etch stopping layer 134. The dielectric layer 160 may have a thickness from about 20 to about 100 Å in a direction perpendicular to the top surface of the lower electrode 140, but is not limited thereto.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In example embodiments, the dielectric layer 160 may include at least one of zirconium oxide, hafnium oxide, titanium oxide, niobium oxide, tantalum oxide, yttrium oxide, strontium titanium oxide, barium strontium titanium oxide, scandium oxide, and lanthanide oxides.

The upper electrode 170 covering the lower electrode 140 may be arranged above the dielectric layer 160. The upper electrode 170 may include at least one of a metal such as Ru, Ti, Ta, Nb, Jr, Mo, and W, a conductive metal nitride such as TiN, TaN, NbN, MoN, and WN, and/or a conductive metal oxide such as $IrO_2$, $RuO_2$, and $SrRuO_3$.

Selectively, an interface layer (not shown) may be further formed between the dielectric layer 160 and the upper electrode 170. The interface layer may include at least one of a metal oxide such as titanium oxide, tantalum oxide, niobium oxide, molybdenum oxide, and iridium oxide, or a metal oxynitride such as titanium oxynitride (TiON), tantalum oxynitride (TaON), niobium oxynitride (NbON), or molybdenum oxynitride (MoON).

Generally, according to increase in an aspect ratio of the lower electrode, it is beneficial that a height of a mask pattern used in a process of forming an opening of a mold stack also increases, and therefore, it becomes difficult to precisely adjust a profile of the opening. Particularly, when a top width of the opening is greater than a bottom width thereof, the lower electrode filling the opening may be connected to an adjacent lower electrode and cause bridge failure, and due to a partially greater volume of the lower electrode, a leakage current may be generated through the dielectric layer adjacent to the lower electrode.

However, according to some example embodiments, because the lower electrode 140 is formed in a structure including the first lower electrode portion 142 and the second lower electrode portion 144, a height of the lower electrode 140 may be increased, and therefore, the integrated circuit device 100 may have an increased capacitance. In addition, as the trimming process for decreasing a width of the side wall of the first lower electrode portion 142 and the trimming process for decreasing a width of the side wall of the second lower electrode portion 144 are performed, the first lower electrode portion 142 and the second lower electrode portion 144 may secure a sufficient separation distance from a first lower electrode portion 142 and a second lower electrode portion 144 adjacent to the first lower electrode portion 142 and the second lower electrode portion 144. The sufficient separation distance may be large enough to prevent or reduce the occurrence of leakage current. Accordingly, occurrence of bridge failure or generation of a leakage current may be prevented or reduced, and the integrated circuit device 100 may have improved electrical properties.

Figure 4:
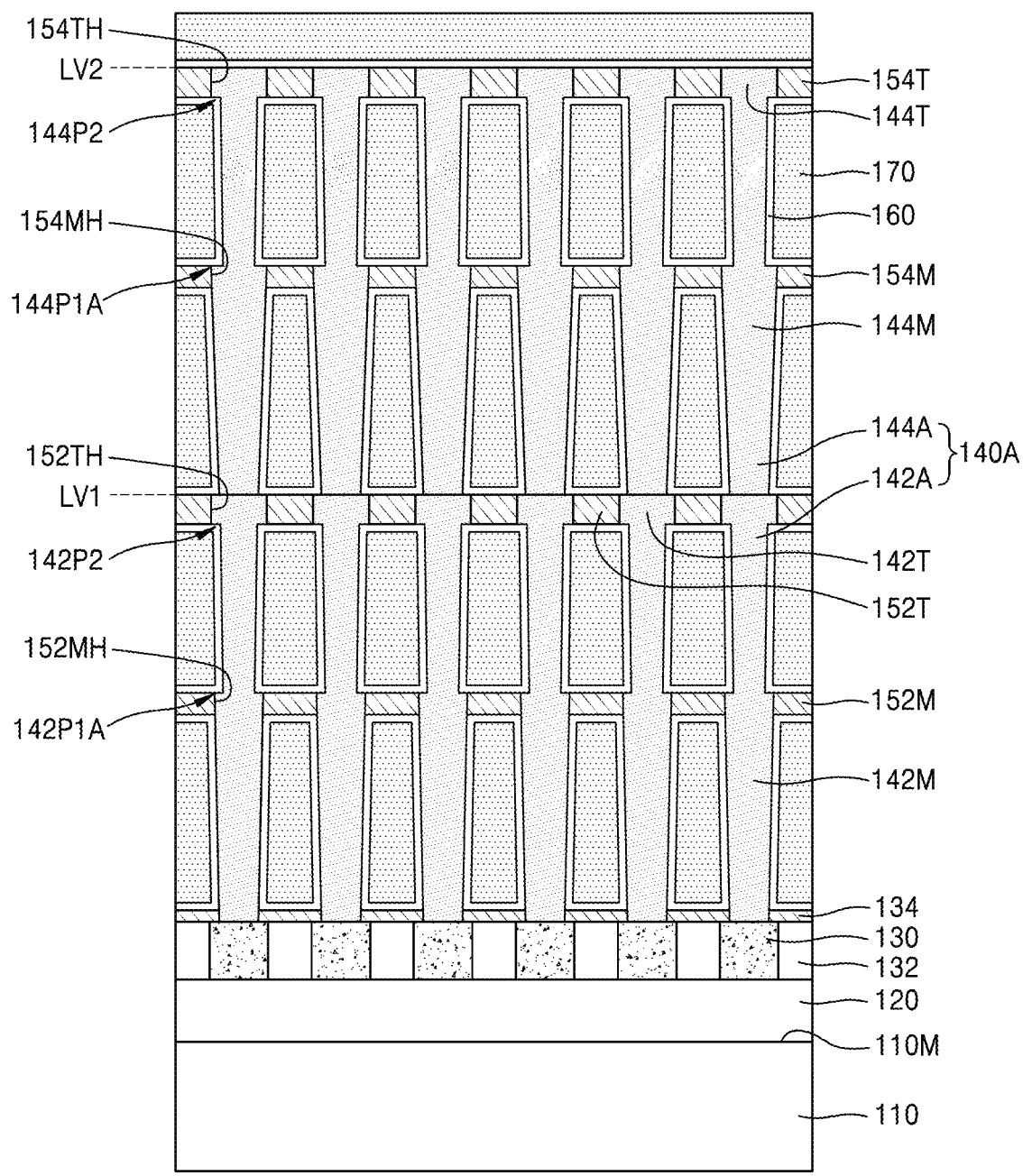
FIG. 4 is a cross-sectional view illustrating an integrated circuit device according to example embodiments.

FIG. 4 is a cross-sectional view of an integrated circuit device 100A according to example embodiments. FIG. 4 illustrates a cross-section corresponding to the cross-section taken along line A1-A1' shown in FIG. 2. In FIG. 4, same reference numerals as those of FIGS. 1 through 3D denote same elements as those of FIGS. 1 through 3D.

Referring to FIG. 4, a lower electrode 140A includes a first lower electrode portion 142A and a second lower electrode portion 144A. The first lower electrode portion 142A includes a first protrusion 142P1A surrounded by the first middle supporting pattern 152M, but the step portion 142ST (see FIG. 3A) arranged at a level lower than the first middle supporting pattern 152M is not formed. In addition, the first protrusion 142P1A protrudes outward with respect to the side wall of the first main region 142M of the first lower electrode portion 142A that is arranged at a level higher than that of the first middle supporting pattern 152M, and may be continuously connected to a side wall of the first main region 142M that is arranged at a level lower than that of the first middle supporting pattern 152M.

In an example embodiment, the first protrusion 142P1A may be formed by a first trimming process of removing a preset, or, desired, thickness of a side wall of the first lower electrode portion 142A. Particularly, the first trimming process may be formed on the side wall of the first lower electrode portion 142A arranged at a level higher than that of the top surface of the first middle supporting pattern 152M in a state where the side wall of the first lower electrode portion 142A, which is arranged at a level lower than that of the first middle supporting pattern 152M, is not exposed, and by doing so, the first protrusion 142P1A and the second protrusion 142P2 may be formed. When a top width of the first lower electrode portion 142A is relatively greater than a bottom width of the first lower electrode portion 142A, occurrence of bridge failure or generation of a leakage current of the first lower electrode portion 142A may be prevented or reduced by performing the first trimming process to decrease the top width of the first lower electrode portion 142A.

In addition, similarly to the first lower electrode portion 142A, the second lower electrode portion 144A also includes the third protrusion 144P1A surrounded by the second middle supporting pattern 154M, but the step portion 144ST (see FIG. 3A), which is arranged at a level lower than that of the second middle supporting pattern 154M, is not formed. In addition, the third protrusion 144P1A may protrude outward with respect to a side wall of the second main region 144M of the second lower electrode portion 144A that is arranged at a level higher than that of the second middle supporting pattern 154M, and may be continuously connected to a side wall of the second main region 144M that is arranged at a level lower than that of the second middle supporting pattern 154M.

In some example embodiments, the third protrusion 144P1A may be formed by a second trimming process of removing a preset, or, desired, thickness of a side wall of the second lower electrode portion 144A. Particularly, the second trimming process may be formed on the side wall of the second lower electrode portion 144A arranged at a level higher than that of the top surface of the second middle supporting pattern 154M in a state where the side wall of the second lower electrode portion 144A, which is arranged at a level lower than that of the second middle supporting pattern 154M, is not exposed, and by doing so, the third protrusion 144P1A and the fourth protrusion 144P2 may be formed. The second trimming process may be performed separately from the first trimming process (for example, the second trimming process may not be performed simultaneously with the first trimming process).

Figure 5A:
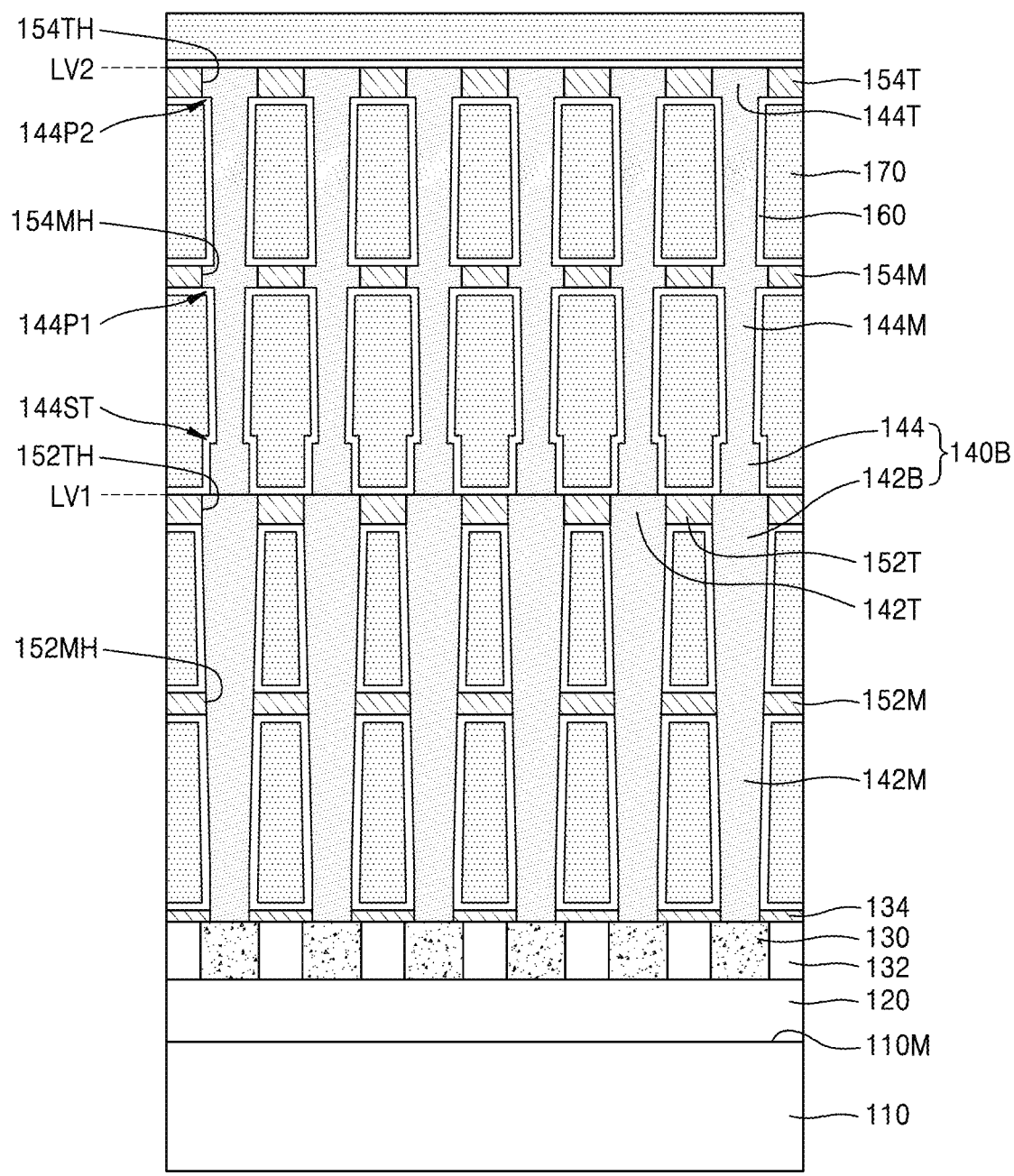
FIGS. 5A and 5B are cross-sectional views each illustrating an integrated circuit device according to example embodiments.
Figure 5B:
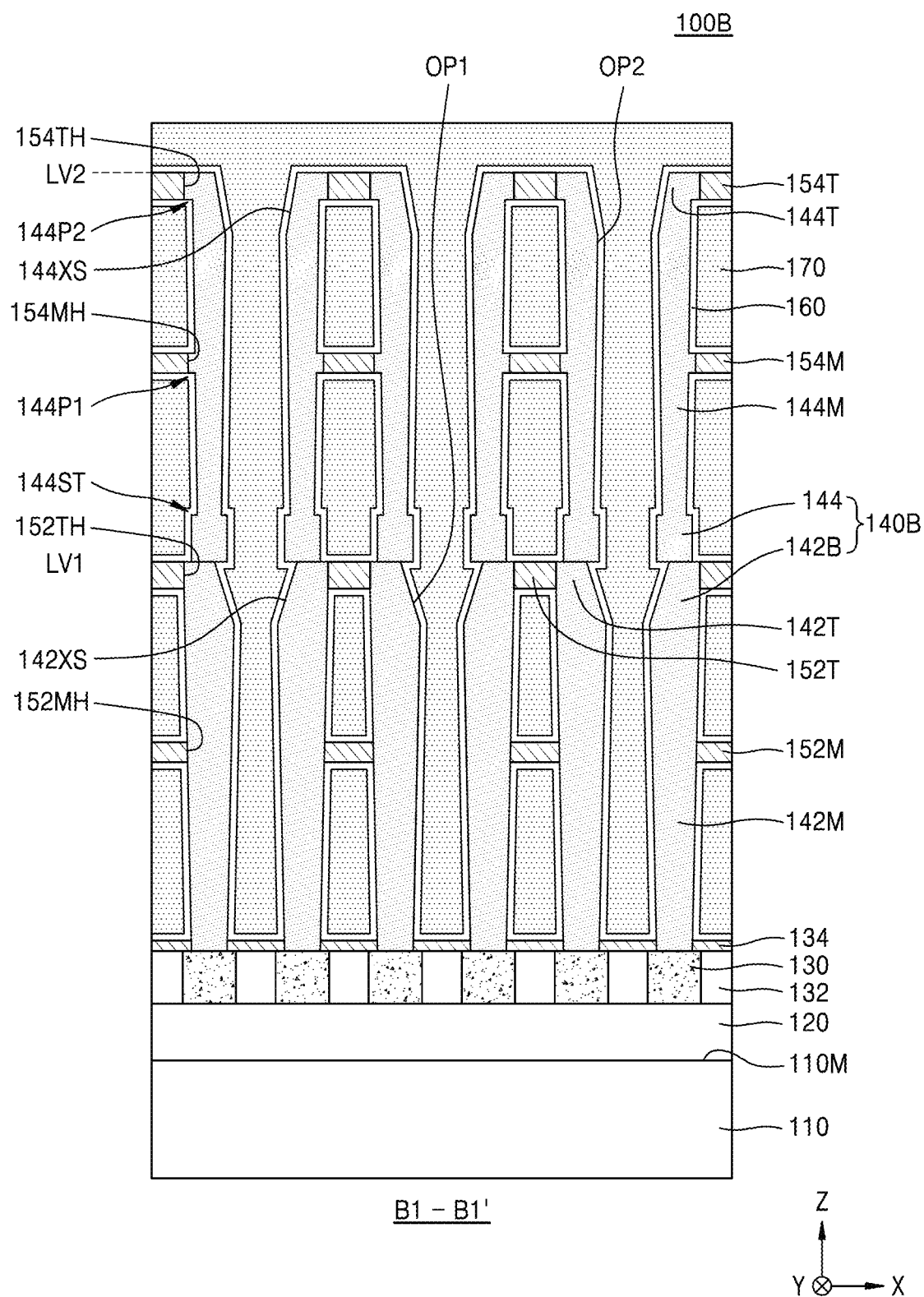

FIGS. 5A and 5B are cross-sectional views each illustrating an integrated circuit device 100B according to example embodiments. FIGS. 5A and 5B illustrate cross-sections corresponding to the cross-sections taken along line A1-A1' and line B1-B1' shown in FIG. 2, respectively. In FIGS. 5A and 5B, same reference numerals as those of FIGS. 1 through 4 denote same elements as those of FIGS. 1 through 4.

Referring to FIGS. 5A and 5B, a lower electrode 140B includes a first lower electrode portion 142B and a second lower electrode portion 144. The first lower electrode portion 142B may not include the first and the second protrusions 142P1 and 142P2 and the step portion 142ST described with reference to FIG. 3A. The side wall of the first top region 142T of the first lower electrode portion 142B may be aligned with the side wall of the first main region 142M of the first lower electrode portion 142B that is arranged at a level lower than the bottom surface of the first top supporting pattern 152T, and may be continuously connected without forming a step or kink. The first lower electrode portion 142B may include the inclined surface 142XS in the first top region 142T.

The second lower electrode portion 144 may include the third and fourth protrusions 144P1 and 144P2 and the step portion 144ST. Particularly, the third protrusion 144P1 may be arranged to be in contact with the second middle supporting pattern 154M, and the fourth protrusion 144P2 may be arranged to be in contact with the second top supporting pattern 154T. The step portion 144ST may be formed at a side wall of the second lower electrode portion 144 at a level lower than the bottom surface of the second middle supporting pattern 154M.

According to some example embodiments, a trimming process for decreasing a width of the first lower electrode portion 142B by removing a preset, or, desired, thickness of the side wall of the first lower electrode portion 142B after forming the first lower electrode portion 142B may not be performed. A trimming process for decreasing a width of the second lower electrode portion 144 by removing a preset, or, desired, thickness of the side wall of the second lower electrode portion 144 after forming the second lower electrode portion 144 may be performed.

According to some example embodiments, the lower electrode 140B may have an increased height, and occurrence of bridge failure or generation of a leakage current of the lower electrode 140B may be prevented or reduced. The integrated circuit device 100B may have improved electrical properties.

Figure 6:
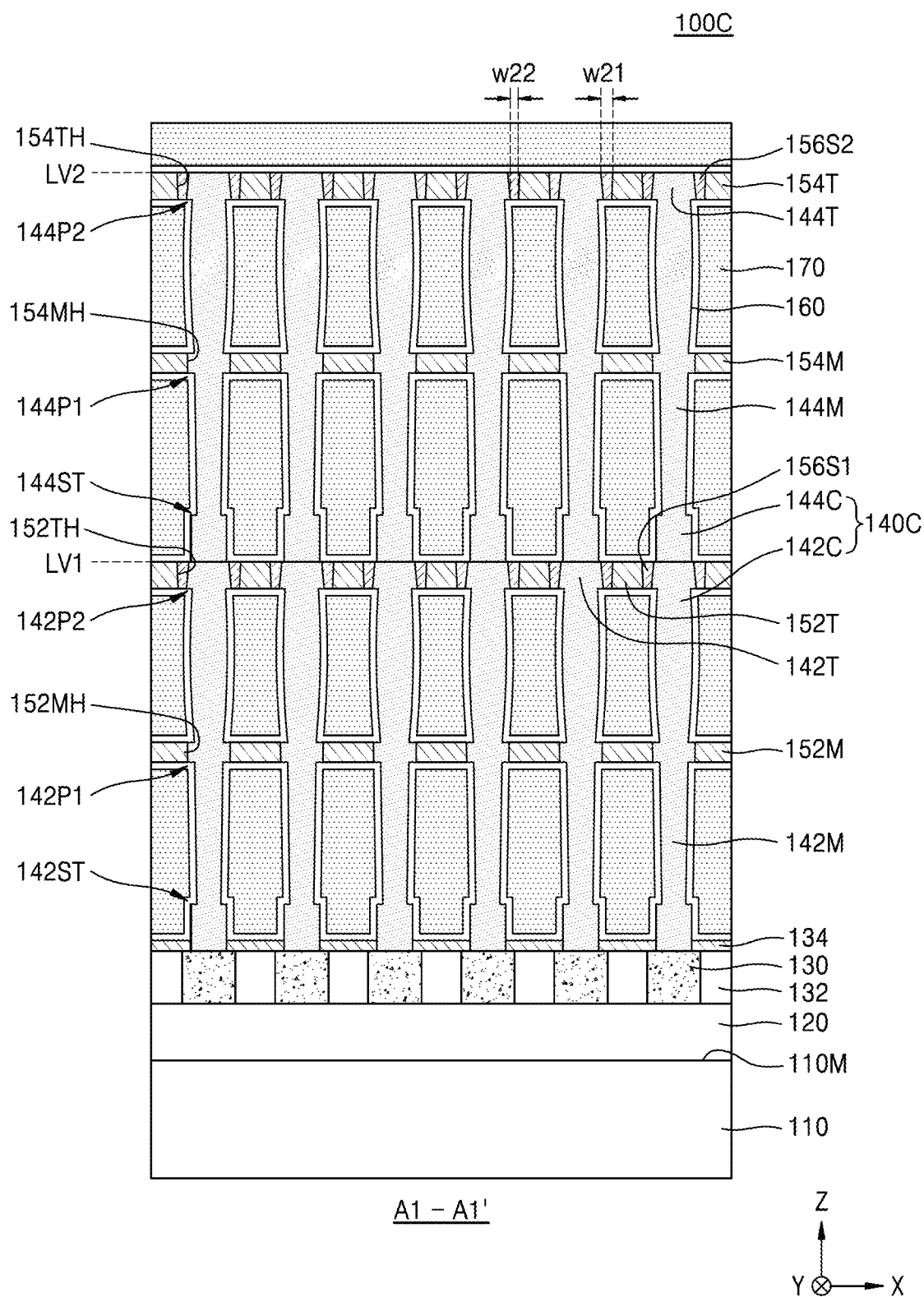
FIG. 6 is a cross-sectional view of an integrated circuit device according to example embodiments.

FIG. 6 is a cross-sectional view of an integrated circuit device 100C according to example embodiments. FIG. 6 shows a cross-section corresponding to the cross-section taken along line A1-A1' shown in FIG. 2. In FIG. 6, same reference numerals as those of FIGS. 1 through 5B denote same elements as those of FIGS. 1 through 5B.

Referring to FIG. 6, a lower electrode 140C includes a first lower electrode portion 142C and a second lower electrode portion 144C, a first spacer 156S1 is arranged between the first top region 142T and the first top supporting pattern 152T of the first lower electrode portion 142C, and a second spacer 156S2 may be arranged between the second top region 144T and the second top supporting pattern 154T of the second lower electrode portion 144C.

In example embodiments, the first spacer 156S1 may be in contact with the second protrusion 142P2 of the first lower electrode portion 142C, and a top surface of the first spacer 156S1 may be at a same, or, substantially the same, level as the top surface of the first lower electrode portion 142C and the top surface of the first top supporting pattern 152T. The second spacer 156S2 may be in contact with the fourth protrusion 144P2 of the second lower electrode portion 144C, and a top surface of the second spacer 156S2 may be at a same, or, substantially the same, level as the top surface of the second lower electrode portion 144C and the top surface of the second top supporting pattern 154T. A horizontal width w21 of the top surface of the second spacer 156S2 may be greater than a horizontal width w22 of the bottom surface of the second spacer 156S2.

In an example embodiment, after forming the spacer film 156L (see FIG. 26) by using a material having poor step coverage around an entrance of the opening MSH1 (see FIG. 26) of the first mold stack MS1 (see FIG. 26), the first lower electrode portion 142C may be formed in the opening MSH1. By doing so, a width of an upper portion of the first lower electrode portion 142C may be decreased, and a sufficient separation distance may be secured between the upper portion of the first lower electrode portion 142C and an upper portion of a first lower electrode portion 142C adjacent thereto.

Figure 7:
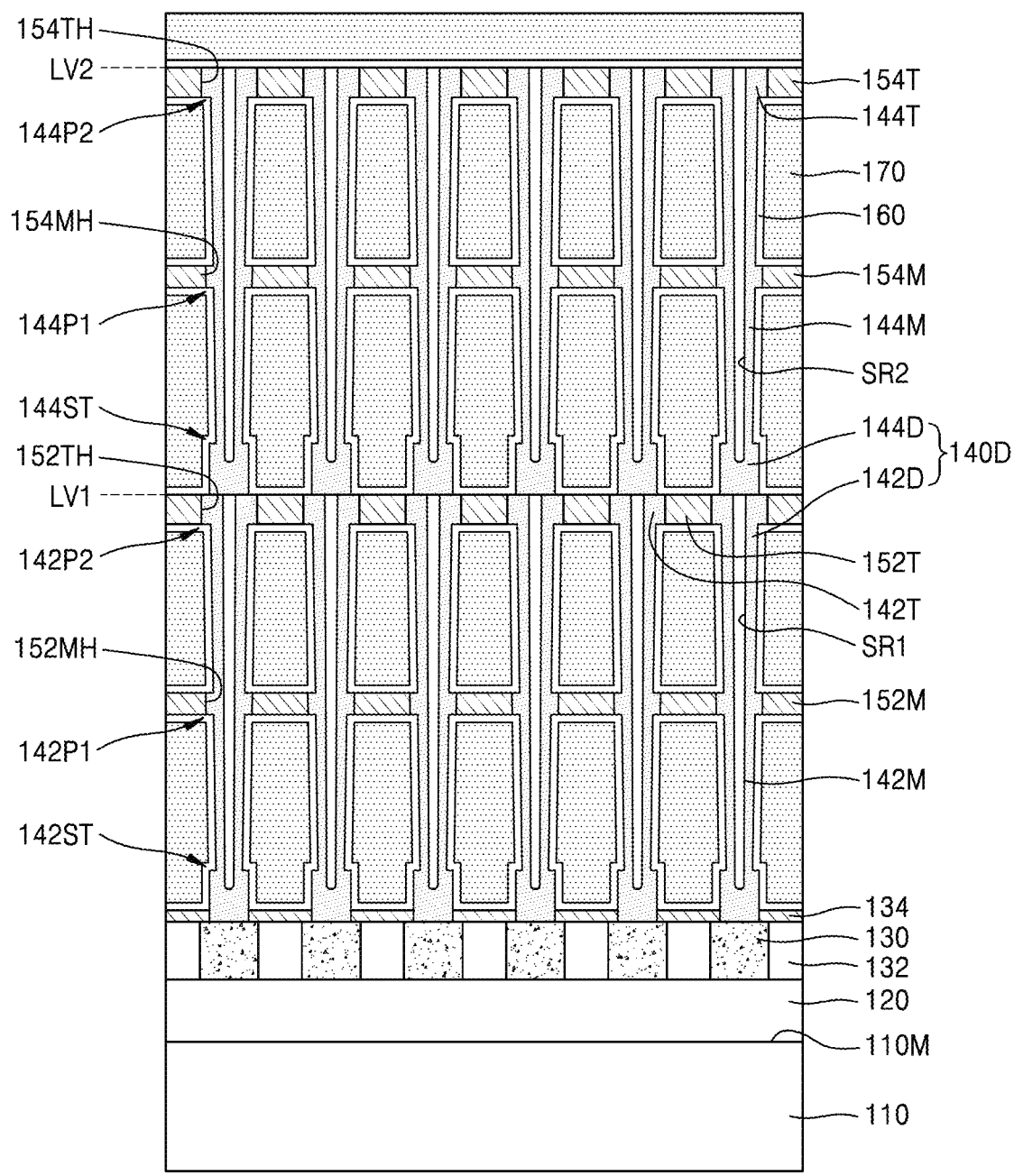
FIG. 7 is a cross-sectional view of an integrated circuit device according to example embodiments.

FIG. 7 is a cross-sectional view of an integrated circuit device 100D according to example embodiments. FIG. 7 shows a cross-section corresponding to the cross-section taken along line A1-A1' shown in FIG. 2. In FIG. 7, same reference numerals as those of FIGS. 1 through 6 denote same elements as those of FIGS. 1 through 6.

Referring to FIG. 7, a first lower electrode 140D may include a first lower electrode portion 142D and a second lower electrode portion 144D, the first lower electrode portion 142D may include a first seam region SR1 therein, and the second lower electrode portion 144D may include a second seam region SR2 therein.

Figure 12:
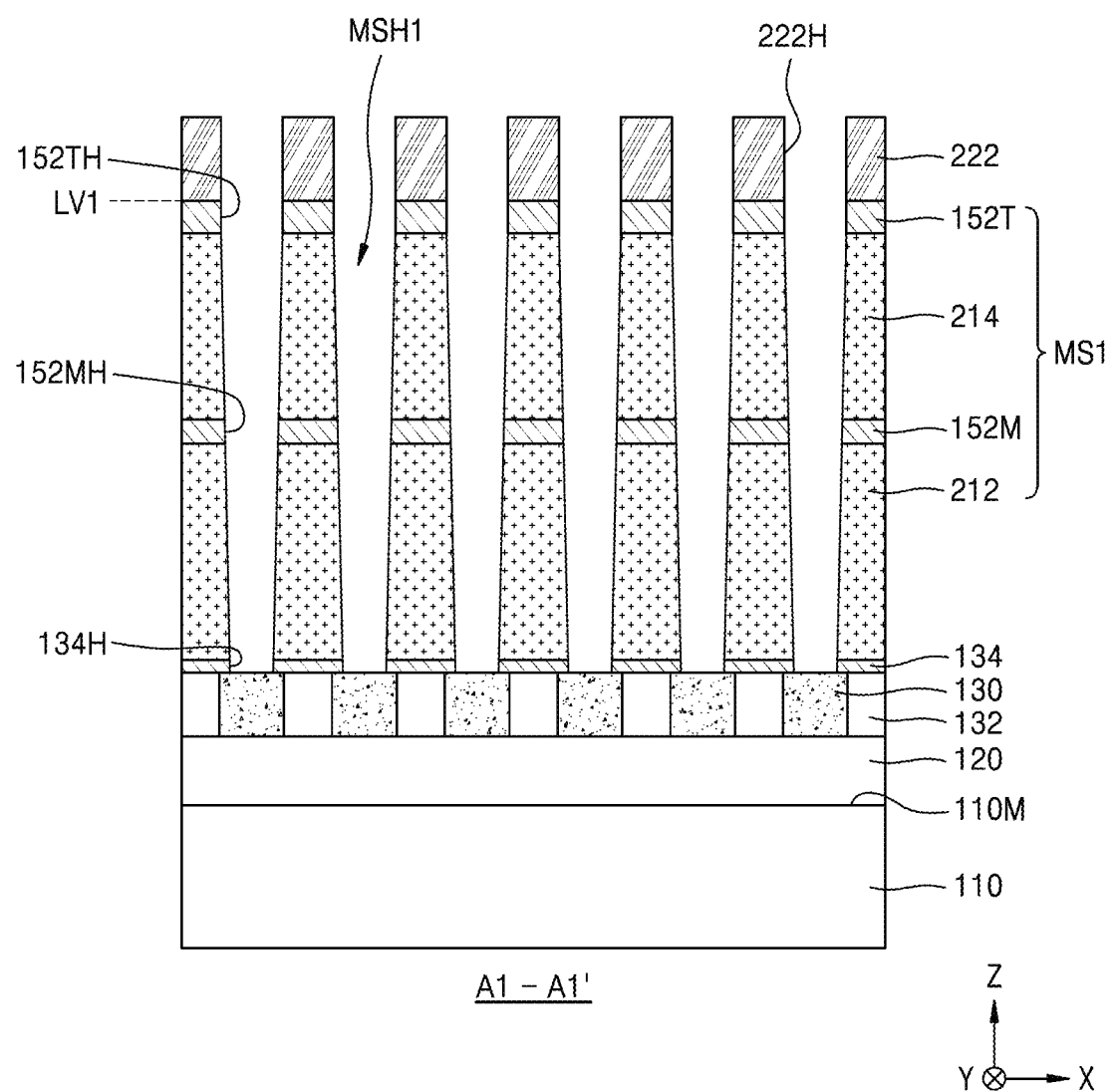

The first seam region SR1 may be an air space that is formed because a conductive material included in the first lower electrode portion 142D does not completely fill the opening MSH1 (see FIG. 12) penetrating the first mold stack MS1 (see FIG. 12). The first seam region SR1 may extend to the first top region 142T of the first lower electrode portion 142D in the direction in which the first lower electrode portion 142D extends (that is, the third direction or the Z direction), but is not limited thereto.

Figure 19:
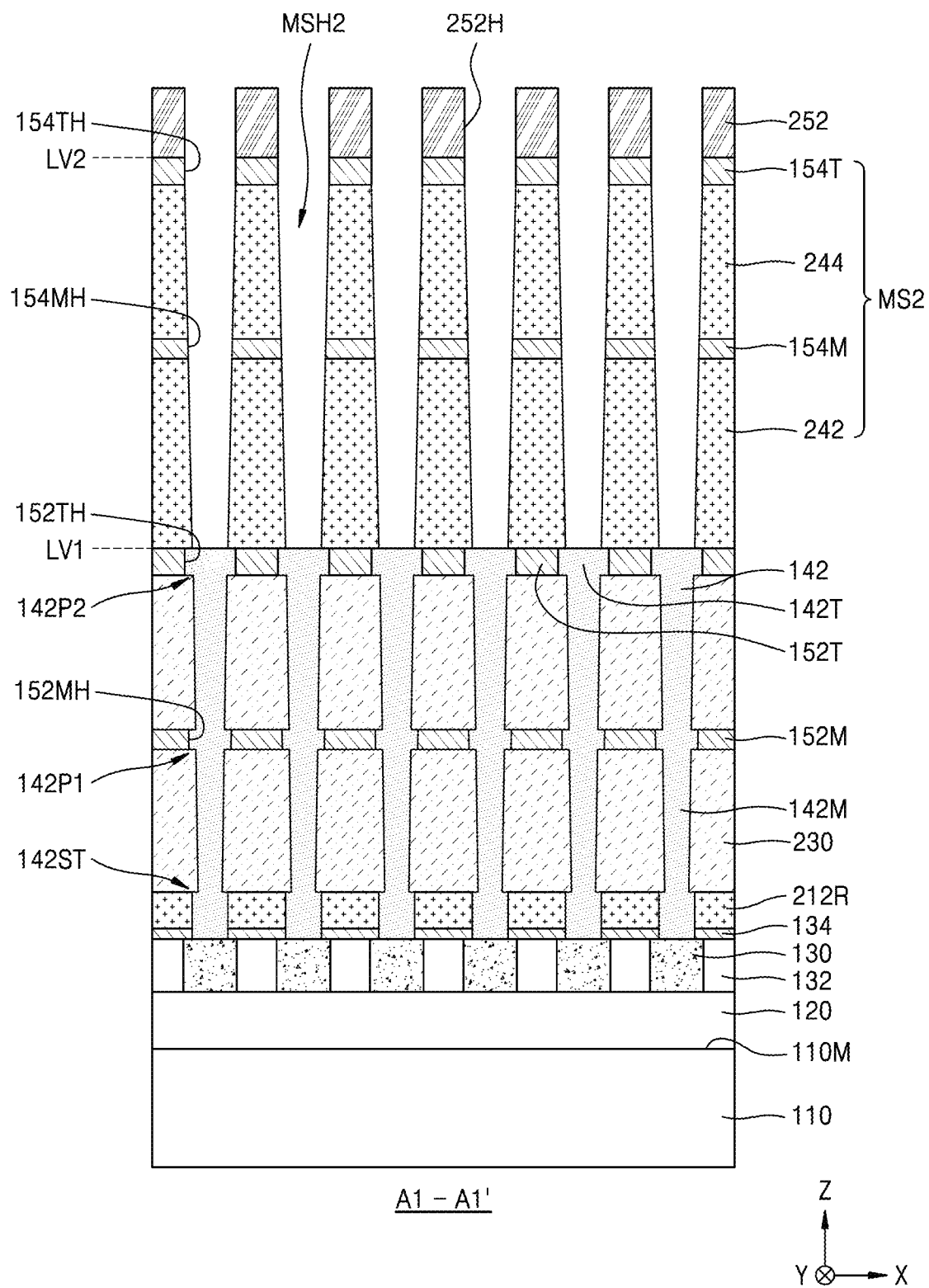

The second seam region SR2 may be an air space that is formed because a conductive material included in the second lower electrode portion 144D does not completely fill the opening MSH2 (see FIG. 19) penetrating the second mold stack MS2 (see FIG. 19). The second seam region SR2 may extend to the second top region 144T of the second lower electrode portion 144D in the direction in which the second lower electrode portion 144D extends (that is, the third direction or the Z direction). The second seam region SR2 may not be arranged at a bottom portion of the second lower electrode portion 144D, and therefore, the second seam region SR2 may not be connected to the first seam region SR1.

Figure 8:
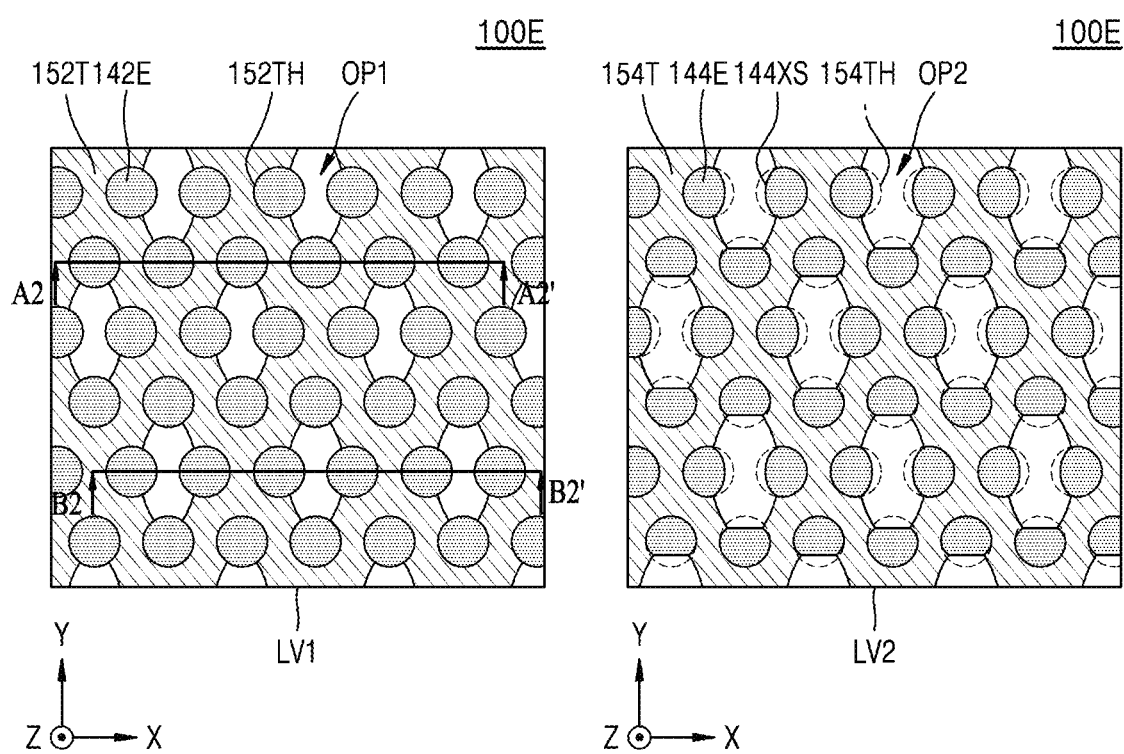
FIG. 8 shows top-plan views of some configurations of an integrated circuit device according to example embodiments.
Figure 9A:
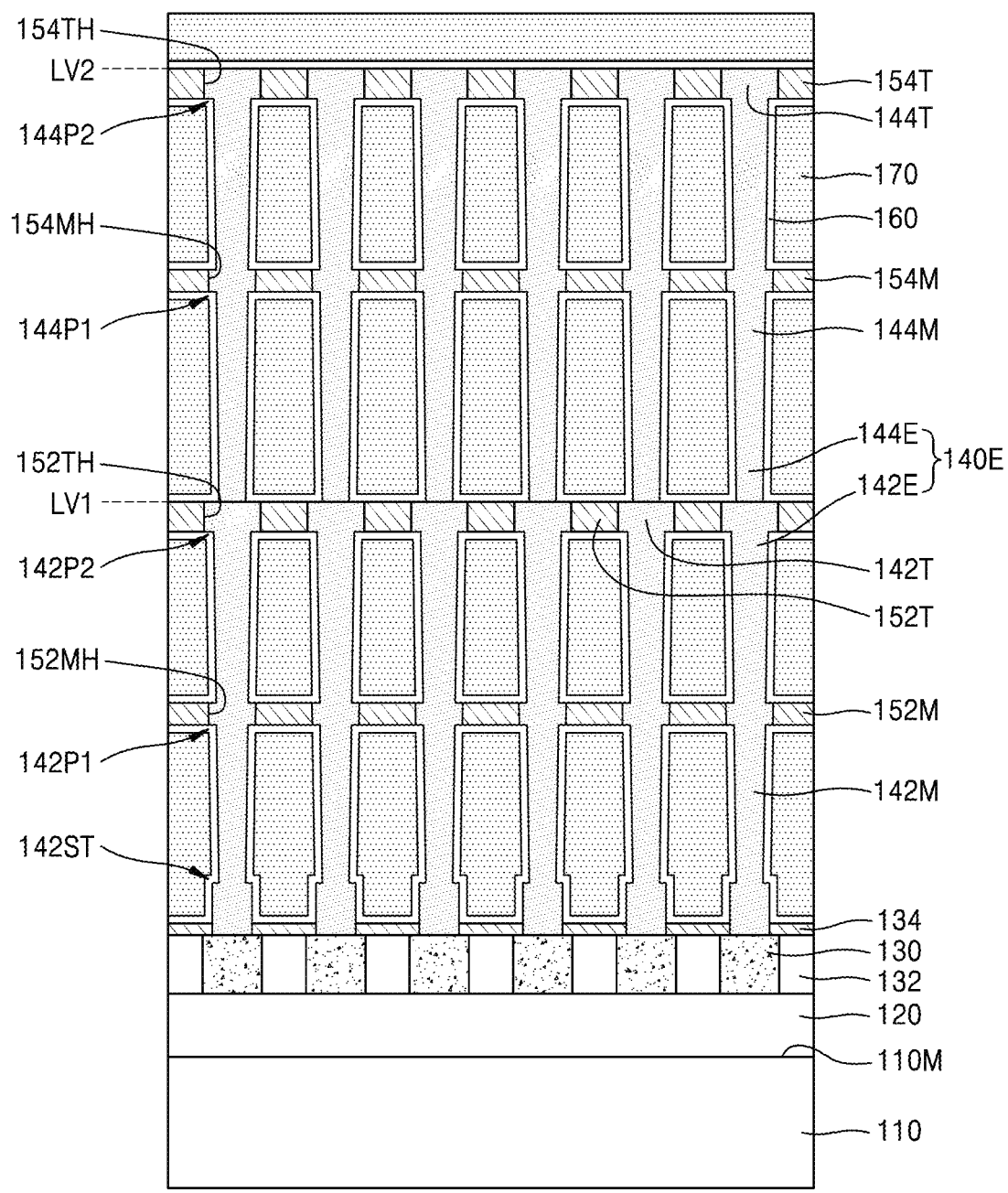
FIG. 9A is a cross-sectional view taken along line A2-A2' shown in FIG. 8.
Figure 9B:
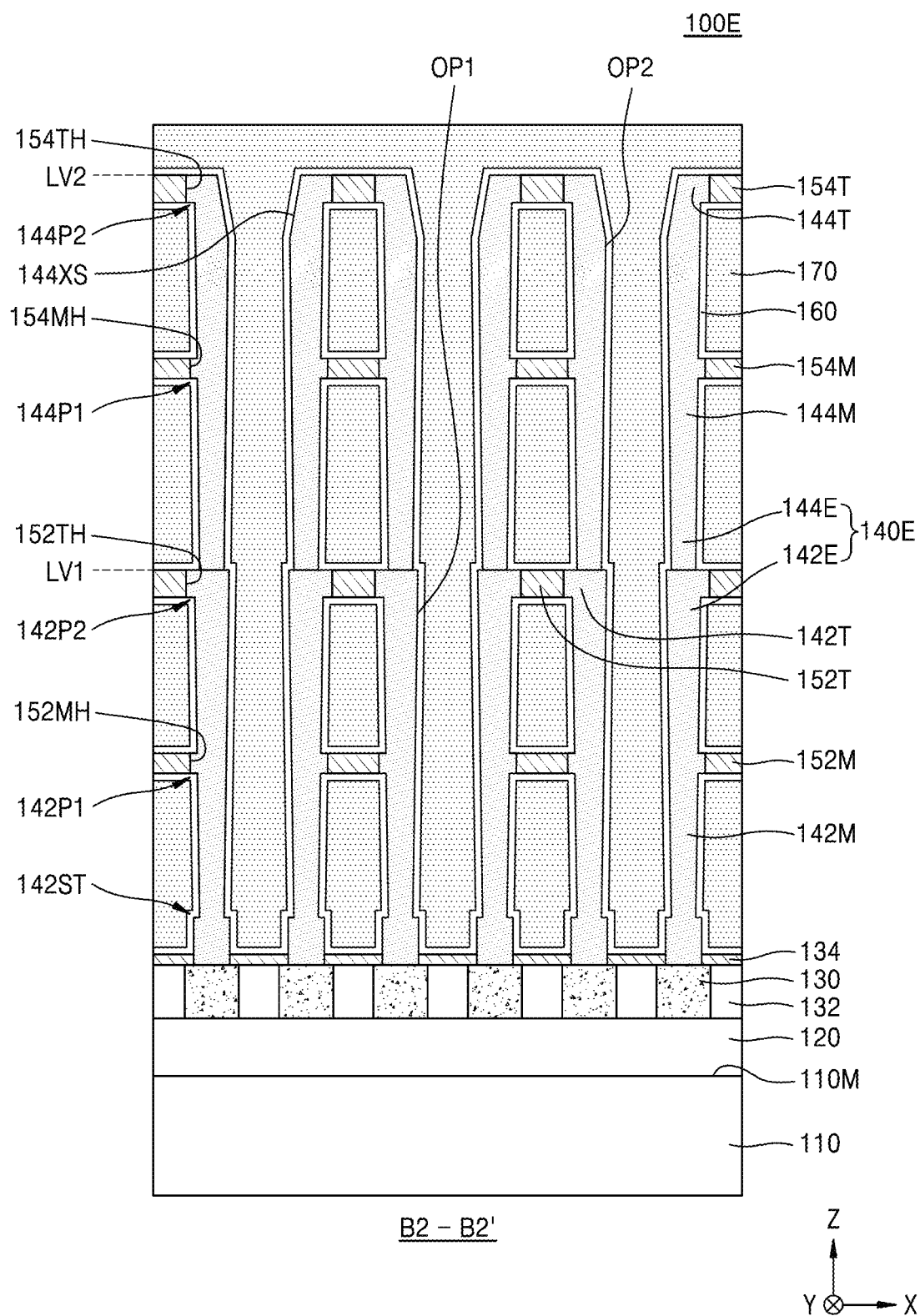
FIG. 9B is a cross-sectional view taken along line B2-B2' shown in FIG. 8.

FIG. 8 shows top-plan views of some configurations of an integrated circuit device 100E according to example embodiments. The left view of FIG. 8 is a top-plan view at the first vertical level LV1, and the right view of FIG. 8 is a top-plan view at the second vertical level LV2. FIG. 9A is a cross-sectional view taken along line A2-A2' shown in FIG. 8, and FIG. 9B is a cross-sectional view taken along line B2-B2' shown in FIG. 8; In FIGS. 8 through 9B, same reference numerals as those of FIGS. 1 through 7 denote same elements as those of FIGS. 1 through 7.

Referring to FIGS. 8 through 9B, a first lower electrode 140E includes a first lower electrode portion 142E and a second lower electrode portion 144E. The first top region 142T of the first lower electrode portion 142E does not include the inclined surface 142XS described with reference to FIG. 3B, and the second lower electrode portion 144E may include the inclined surface 144XS in the second top region 144T.

The first top supporting pattern 152T may define the first mold opening OP1, and the side wall of the first lower electrode portion 142E exposed by the first opening OP1 may protrude outward with respect to a bottom portion of the second lower electrode portion 144E. The second top supporting pattern 154T may define the second mold opening OP2, and the inclined surface 144XS may be arranged at a side wall of the second lower electrode portion 144E exposed by the second mold opening OP2.

Figure 31A:
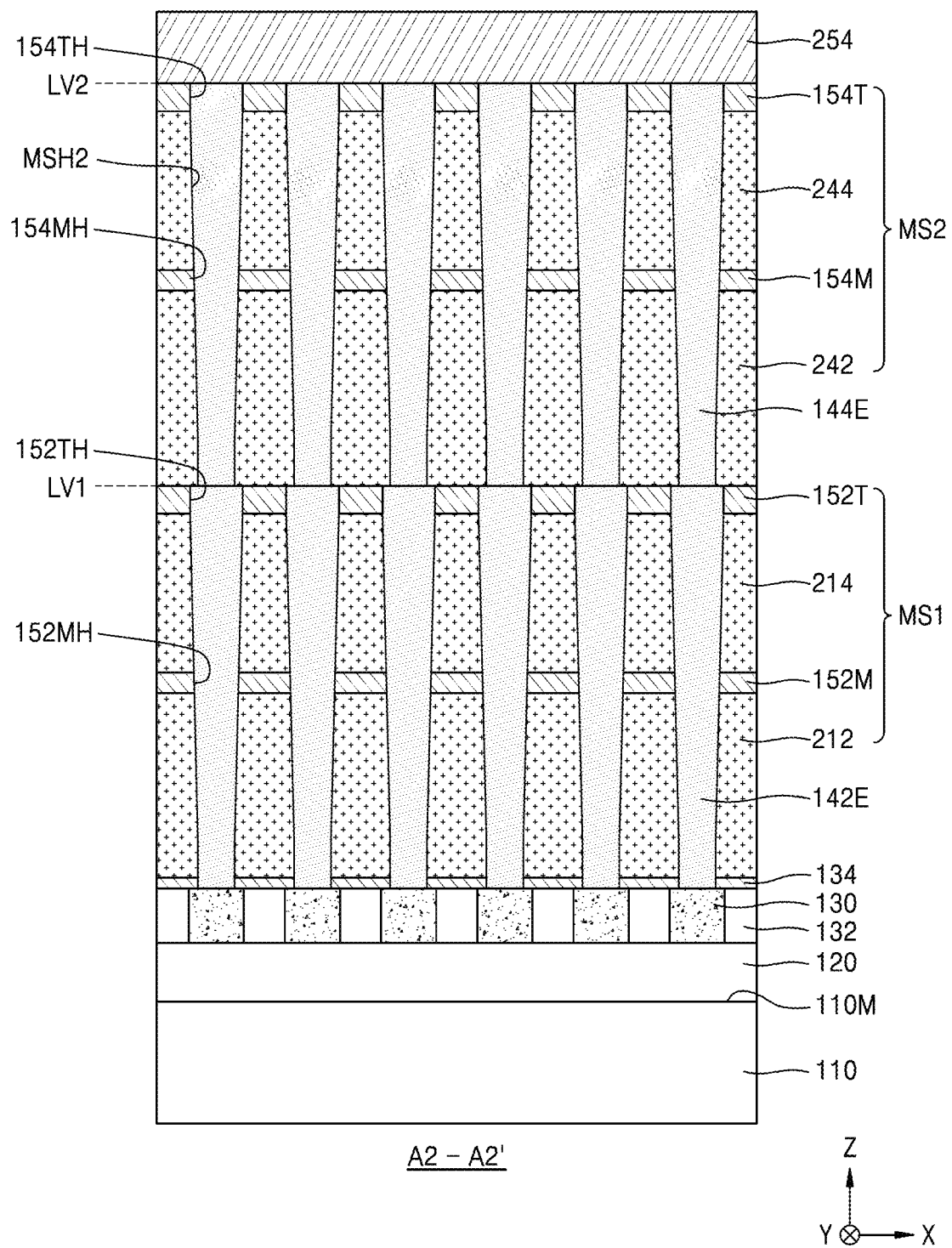

According to some example embodiments, the first lower electrode portion 142E may be formed in the first opening MSH1 (see FIG. 29) in the first mold stack MS1 (see FIG. 29), and next, the second lower electrode portion 144E may be formed in the second opening MSH2 (see FIG. 31a) in the second mold stack MS2 (see FIG. 31A). Next, by using a mask pattern 252 (see FIG. 31A), the second mold opening OP2 may be formed by etching the second top supporting pattern 154T and the second middle supporting pattern 154M, and next, the first mold opening OP1 may be formed by etching the first top supporting pattern 152T and the first middle supporting pattern 152M exposed by the second mold opening OP2. Next, the inclined surface 144XS may be formed by a process of trimming an exposed portion of the second top 144T of the second lower electrode portion 144E that is exposed by the second mold opening OP2.

As shown in FIG. 8, a horizontal cross-section of the first lower electrode portion 142E at the first vertical level LV1 may be circular, and at the second vertical level LV2, a horizontal cross-section of the second lower electrode portion 144E may include a non-circular portion that is defined by the inclined surface 144XS.

Figure 10:
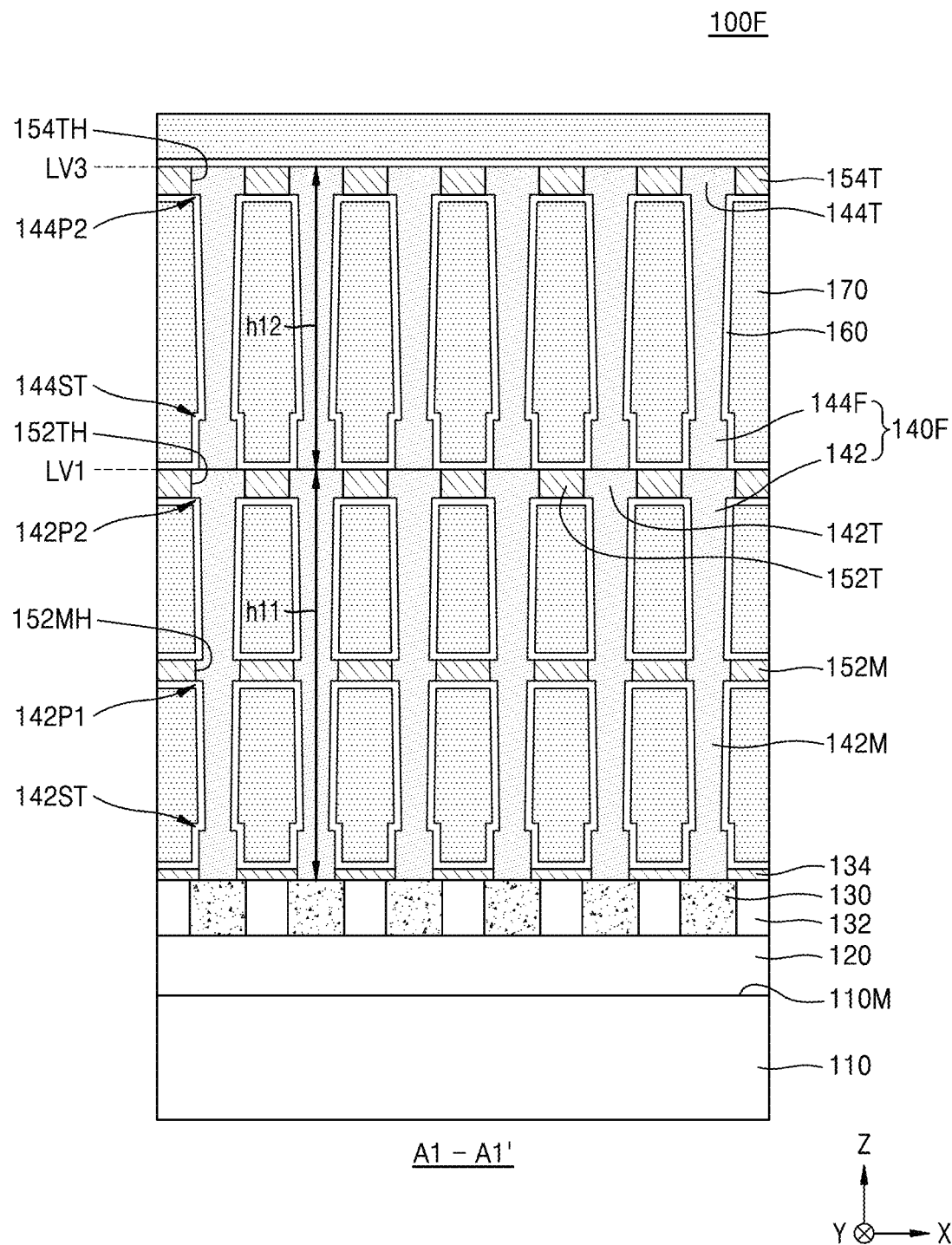
FIG. 10 is a cross-sectional view of an integrated circuit device according to example embodiments.

FIG. 10 is a cross-sectional view of an integrated circuit device 100F according to example embodiments. FIG. 10 shows a cross-section corresponding to the cross-section taken along line A1-A1' shown in FIG. 2. In FIG. 10, same reference numerals as those of FIGS. 1 through 9 denote same elements as those of FIGS. 1 through 6.

Referring to FIG. 10, a lower electrode 140F may include the first lower electrode portion 142 and the second lower electrode portion 144F, and a second height h12 of the second lower electrode portion 144F in a vertical direction may be less than a first height h11 of the first lower electrode portion 142 in a vertical direction. For example, the second height h12 may be, but is not limited to, from about 30% to about 60% of the first height h11.

The second top supporting pattern 154T may be arranged around the second top region 144T of the second lower electrode portion 144F, and the top surface of the second top supporting pattern 154T may be at the third vertical level LV3 that is lower than the second vertical level LV2 (see FIG. 3A) shown in FIG. 3A. The second middle supporting 154M described in connection with FIG. 3A may not be formed on the side wall of the second main region 144M of the second lower electrode portion 144F. Accordingly, the second main region 144M of the second lower electrode portion 144F may not include the third protrusion 144P1 (see FIG. 3A) that is surrounded by the second middle supporting pattern 154M.

Figure 11:
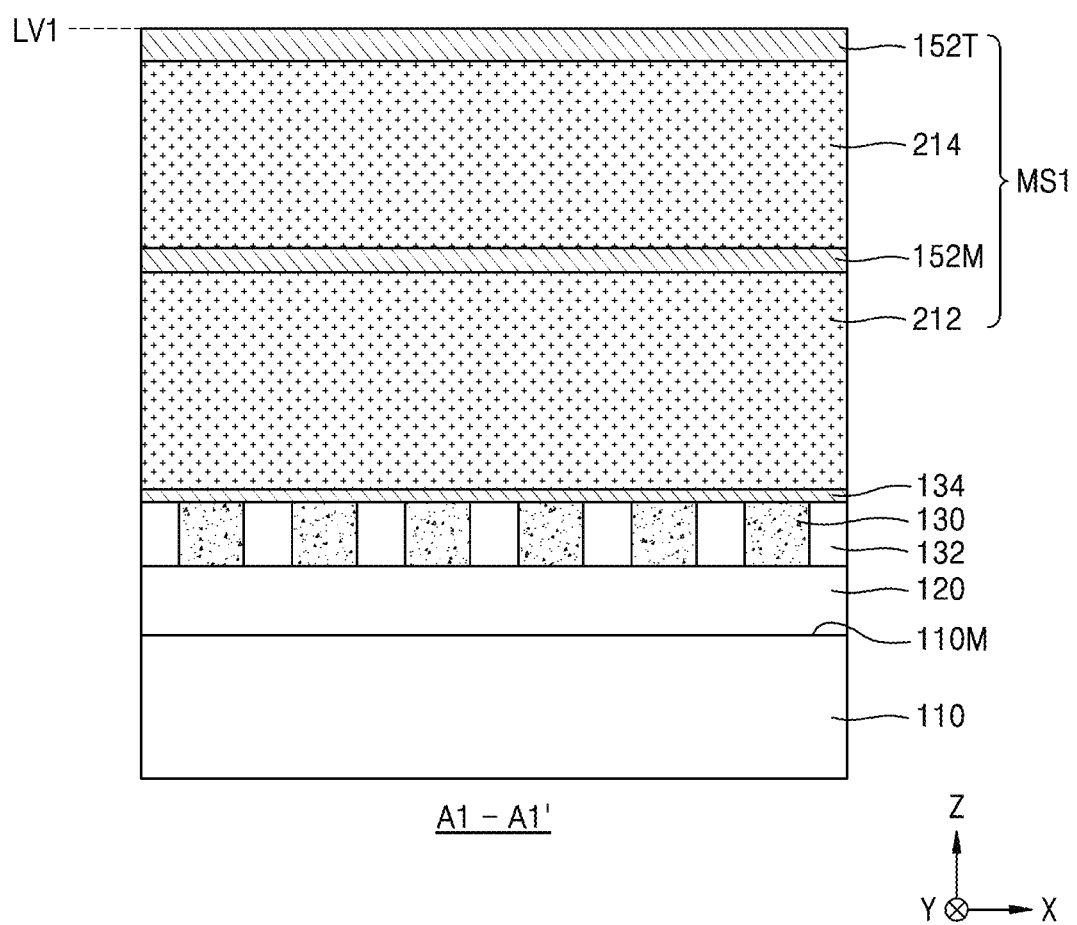
FIGS. 11 through 24B are cross-sectional views respectively showing a manufacturing method of an integrated circuit device according to process order, according to example embodiments; particularly, FIGS. 11 through 13, 14A, 15A, 16A, 17 through 20, 21A, 22A, 23A and 24A respectively show cross-sections corresponding to the cross-section taken along line A1-A1' shown in FIG. 2, and FIGS. 14B, 15B, 16B, 21B, 22B, 23B, and 24B respectively show cross-sections corresponding to the cross-section taken along line B1-B1' shown in FIG. 2.

FIGS. 11 through 24B are cross-sectional views respectively showing a method of manufacturing an integrated circuit device according to process order, according to example embodiments. Particularly, FIGS. 11 through 13, 14A, 15A, 16A, 17 through 20, 21A, 22A, 23A and 24A respectively show cross-sectional views corresponding to the cross-sectional view taken along line A1-A1' shown in FIG. 2, and FIGS. 14B, 15B, 16B, 21B, 22B, 23B, and 24B respectively show cross-sectional views corresponding to the cross-sectional view taken along line B1-B1' shown in FIG. 2;

Referring to FIG. 11, the lower structure 120 may be formed on the top surface 110M of the substrate 110, and the landing pad 130 and the node isolation insulating layer 132 surrounding the side wall of the landing pad 130 may be formed on the lower substrate 120.

Next, the etch stopping layer 134 and the first mold stack MS1 may be sequentially formed on the landing pad 130 and the node isolation insulating layer 132. The first mold stack MS1 may include a first mold layer 212, the first middle supporting pattern 152M, a second mold layer 214, and the first top supporting pattern 152T.

In example embodiments, the first mold layer 212 and the etch stopping layer 134 may include materials having an etch selectivity ratio with respect to each other. For example, when the first mold layer 212 includes silicon oxide, the etch stopping layer 134 may include silicon nitride, silicon oxynitride, and/or silicon carbon nitride (SiCN). In addition, the first and second mold layers 212 and 214 and the first middle supporting pattern 152M may include materials having an etch selectivity ratio with one another, and the first and second mold layers 212 and 214 and the first top supporting pattern 152T may include materials having an etch selectivity ratio with one another. For example, when the first and second mold layers 212 and 214 include silicon oxide, the first middle supporting pattern 152M and the first top supporting pattern 152T may include silicon nitride, silicon oxynitride, silicon boron nitride (SiBN), and/or silicon carbon nitride (SiCN).

Referring to FIG. 12, a first mask pattern 222 including an opening 222H may be formed on the first top supporting pattern 152T, and an opening MSH1 penetrating through the first mold stack MS1 by using the first mask pattern 222.

In example embodiments, the first mask pattern 222 may include polysilicon, silicon nitride, silicon oxide, silicon oxynitride, spin-on-hardmask (SOH), amorphous carbon layer (ALC), or a combination thereof.

The opening MSH1 may extend in the third direction (the X direction) to penetrate the first mold stack MS1, and a portion of the opening MSH1 penetrating the first top supporting pattern 152T may be referred to as a first opening 152TH, and a portion of the opening MSH1 penetrating the first middle supporting pattern 152M may be referred to as a second opening 152MH. After the opening MSH1 is formed, a portion of the etch stopping layer 134 may be removed, and thus, an opening 134H connected to the opening MSH1 may be formed in the etch stopping layer 134. The top surface of the landing pad 130 may be exposed by the opening MSH1 and the opening 134H.

Figure 13:
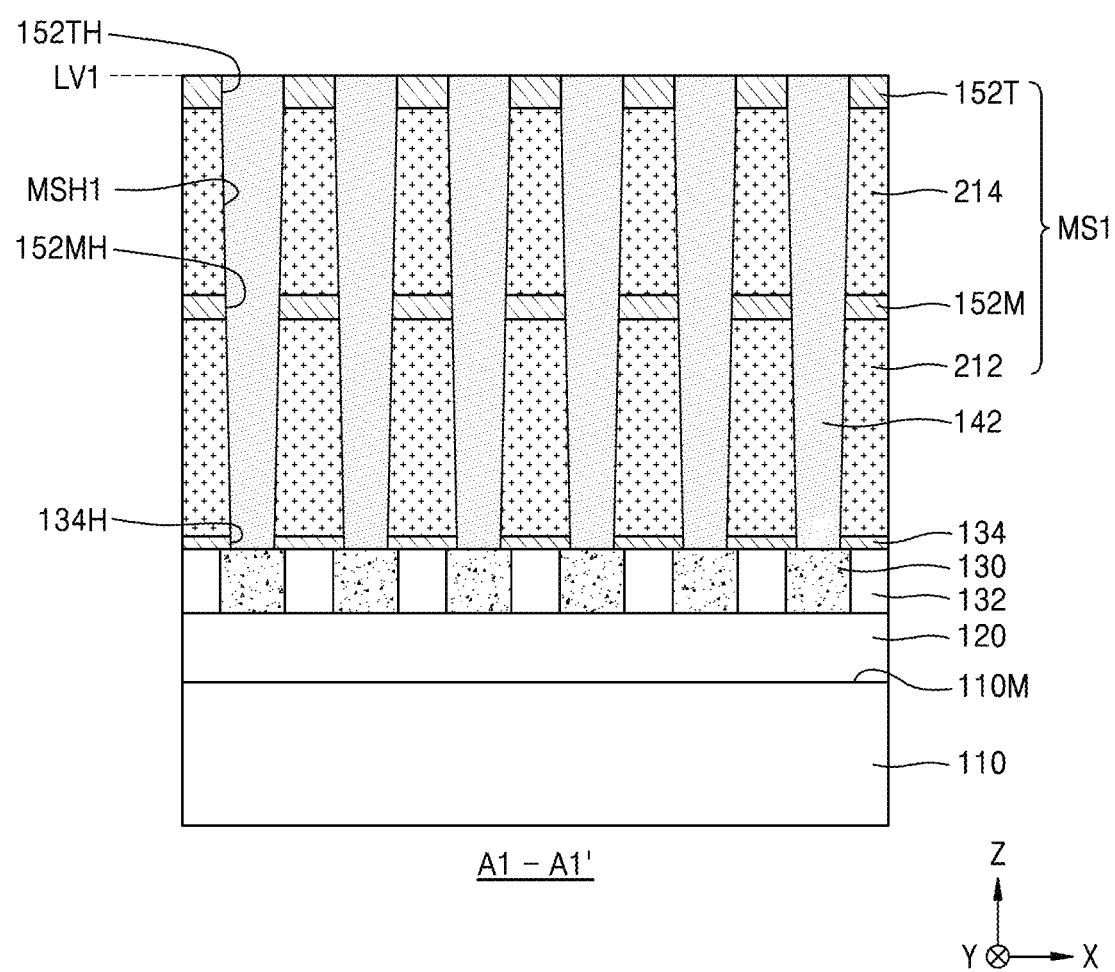

Referring to FIG. 13, a conductive layer (not shown) may be formed on the landing pad 130 and the first mold stack MS1 to fill the openings 134H and MSH1, and the first lower electrode portion 142 may be formed by removing a top portion of the conductive layer until the top surface of the first top supporting pattern 152T is exposed.

For example, a process for forming the first lower electrode portion 142 may include a chemical vapor deposition (CVD) process, a metal organic chemical vapor deposition (MOCVD) process, an atomic layer deposition (ALD) process, or a metal organic atomic layer deposition (MOALD) process.

Figure 14A:
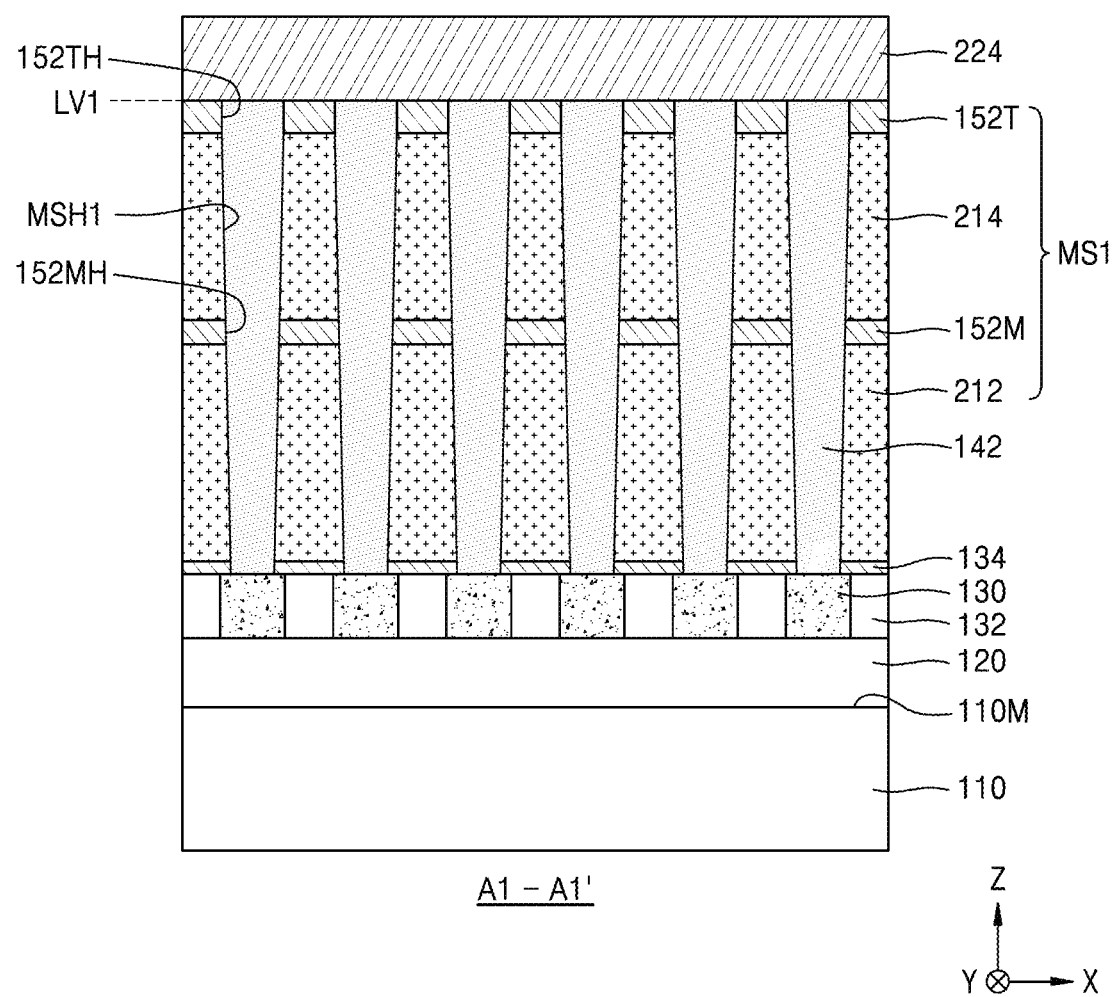
Figure 14B:
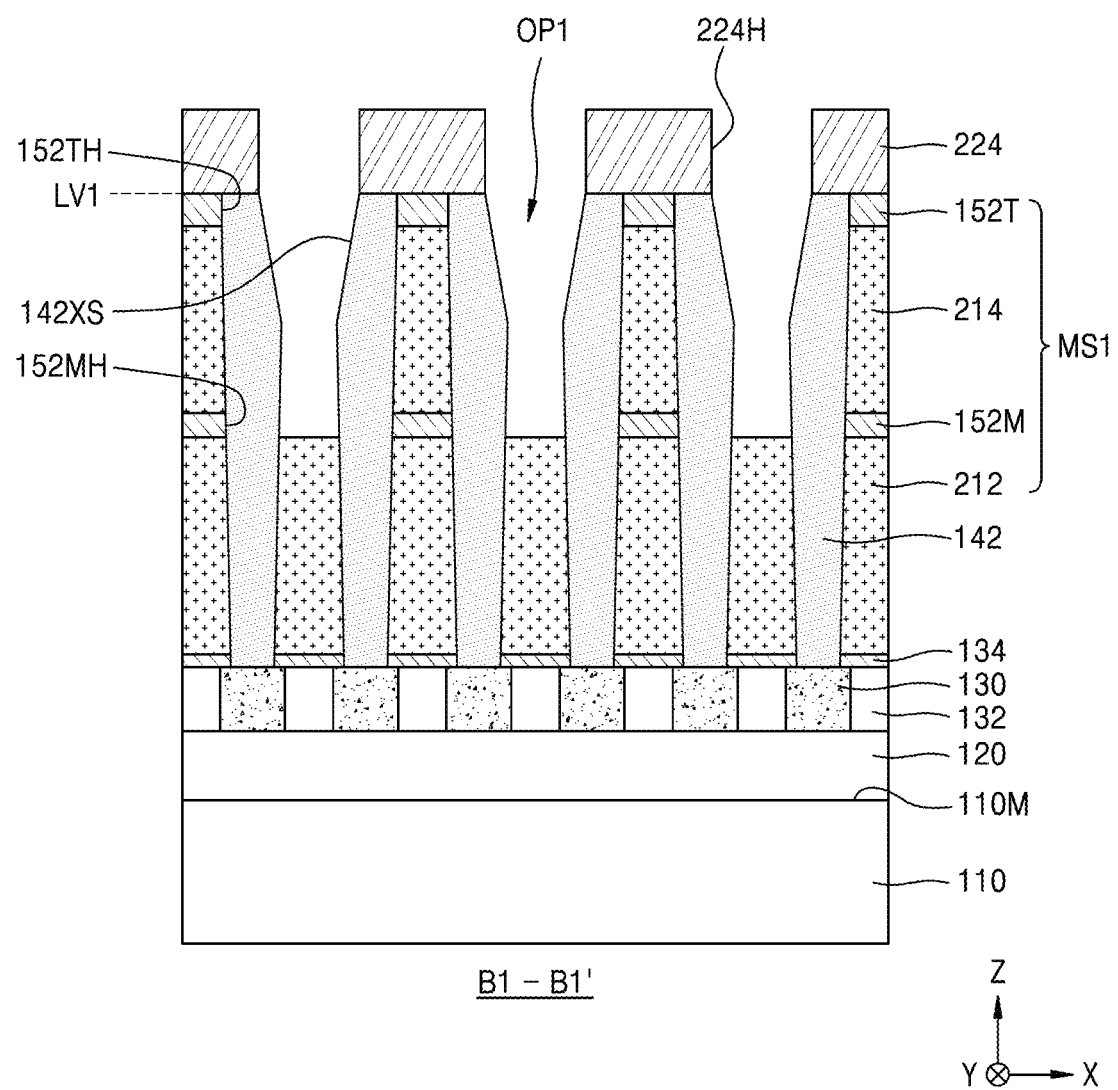

Referring to FIGS. 14A and 14B, a second mask pattern 224 including an opening 224H may be formed on the first lower electrode portion 142 and the first mold stack MS1. Thereafter, the first mold opening OP1 may be formed by removing a portion of each of the first top supporting pattern 152T, the second mold layer 214, and the first middle supporting pattern 152M by using the second mask pattern 224 as an etching mask. In this case, the first mold opening OP1 may be formed to expose a portion of the top surface and a portion of the side wall of the first lower electrode portion 142.

Next, an inclined surface 142XS may be formed at an upper portion of the first lower electrode portion 142 by performing a trimming process on the upper portion of the first lower electrode portion 142 exposed by the first mold opening OP1.

Figure 15A:
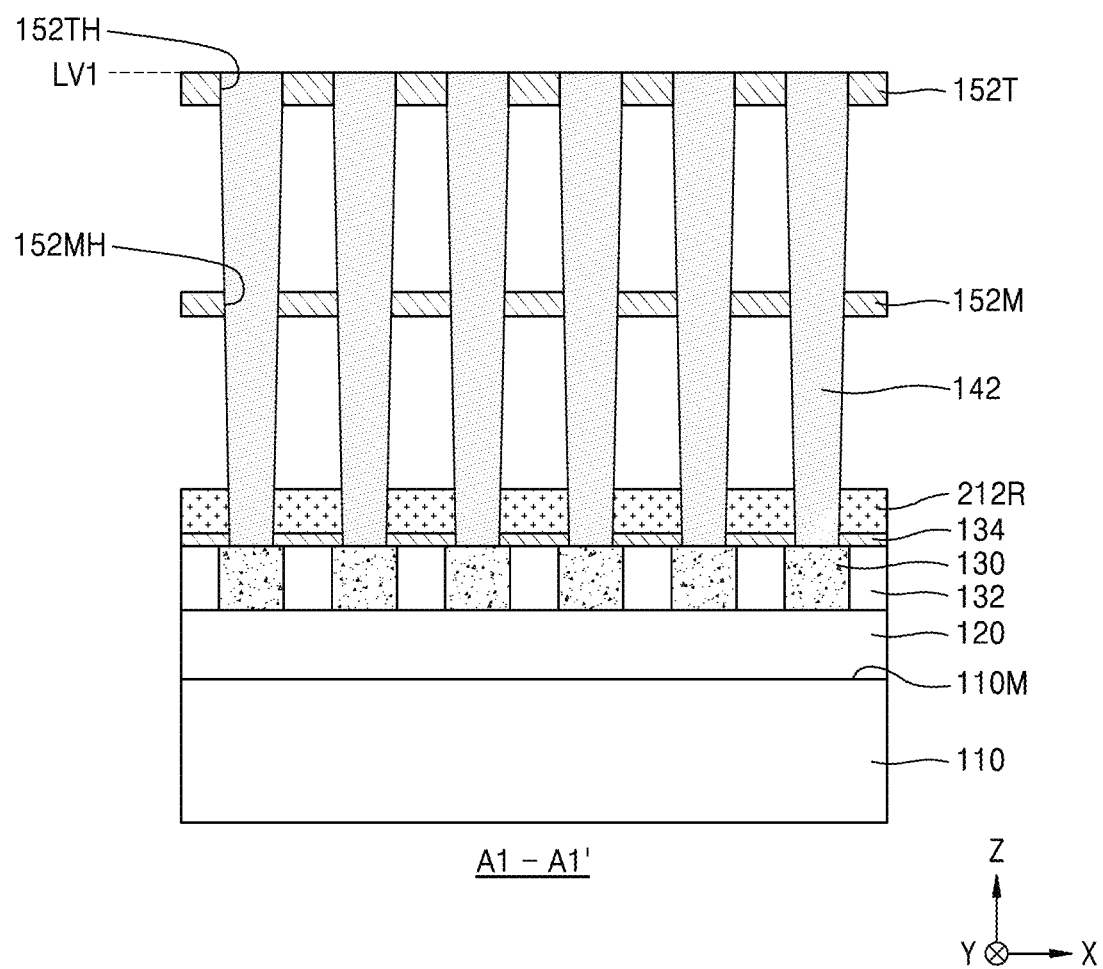
Figure 15B:
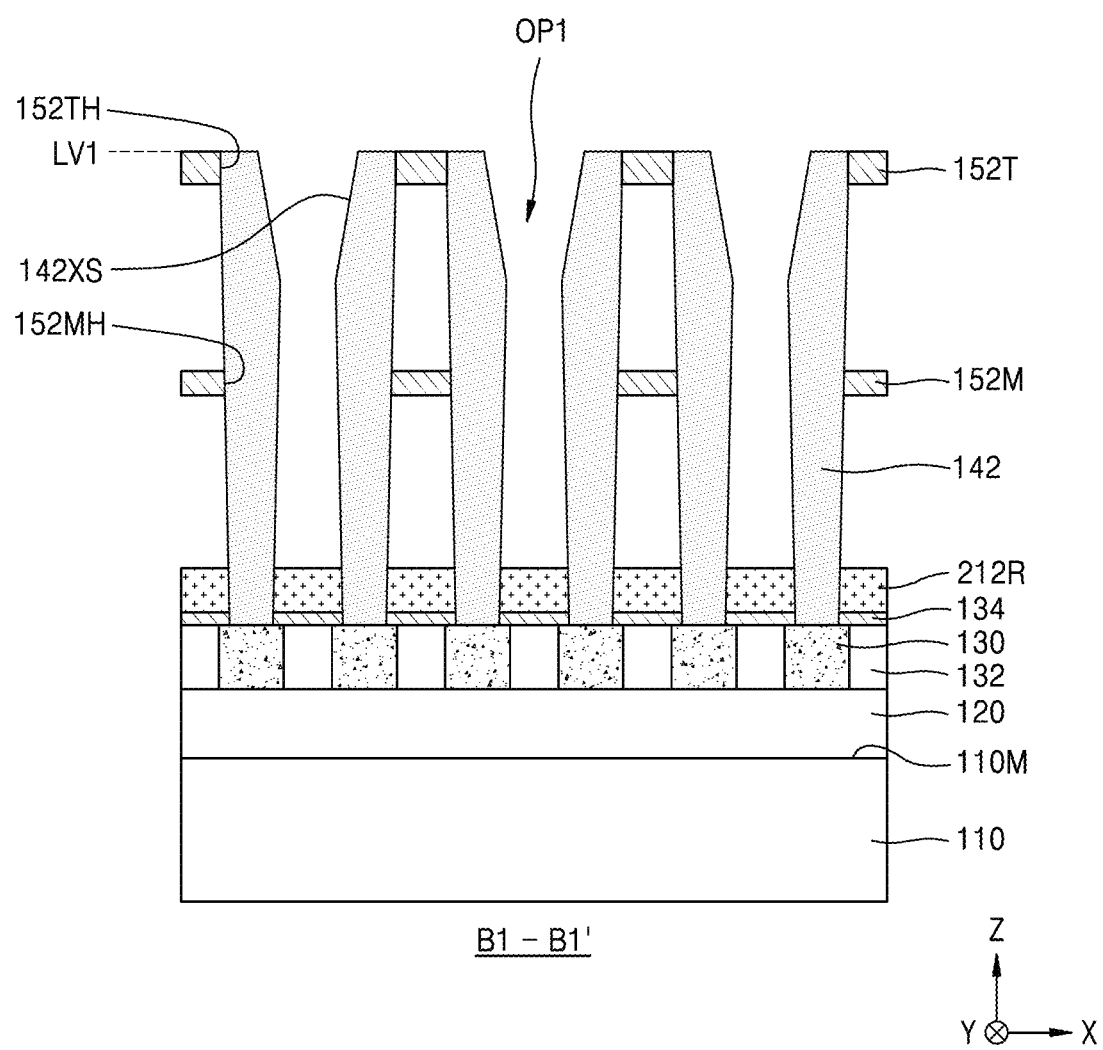

Referring to FIGS. 15A and 15B, a first mold layer remaining portion 212R may be formed by removing the second mold layer 214 and a portion of the first mold layer 212.

In example embodiments, a process for removing the portion of the first mold layer 212 and the second mold layer 214 may be an etching process using an etchant including ammonium fluoride ($NH_4F$), hydrofluoric acid (HF) and water.

In the process for removing the portion of the first mold layer 212 and the second mold layer 214, the first top supporting pattern 152T and the first middle supporting pattern 152M may not be removed, and two adjacent first lower electrode portions 142 may be connected and supported by the first top supporting pattern 152T and the first middle supporting pattern 152M. In addition, after a portion of the first mold layer 212 is removed, the first mold layer remaining portion 212R may surround a lower portion of the side wall of the first lower electrode portion 142.

Figure 16A:
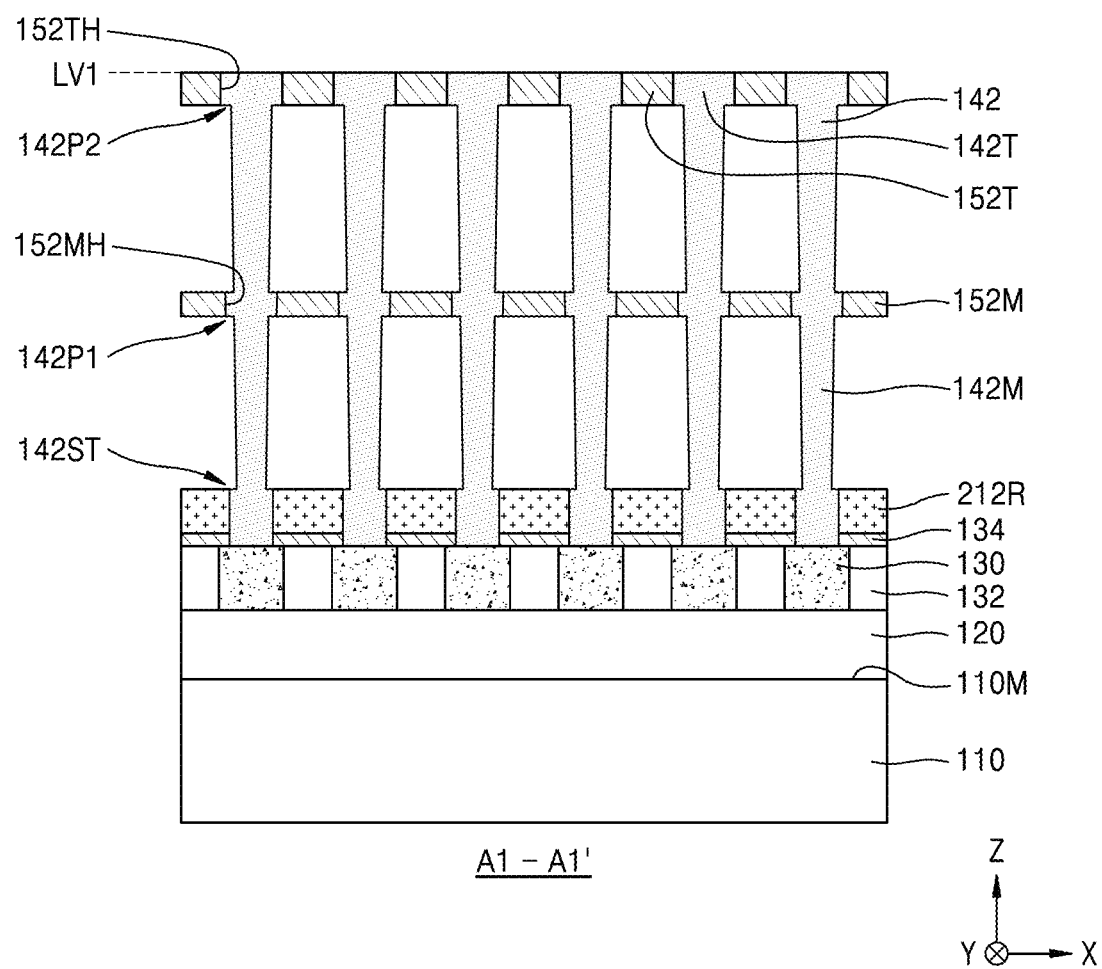
Figure 16B:
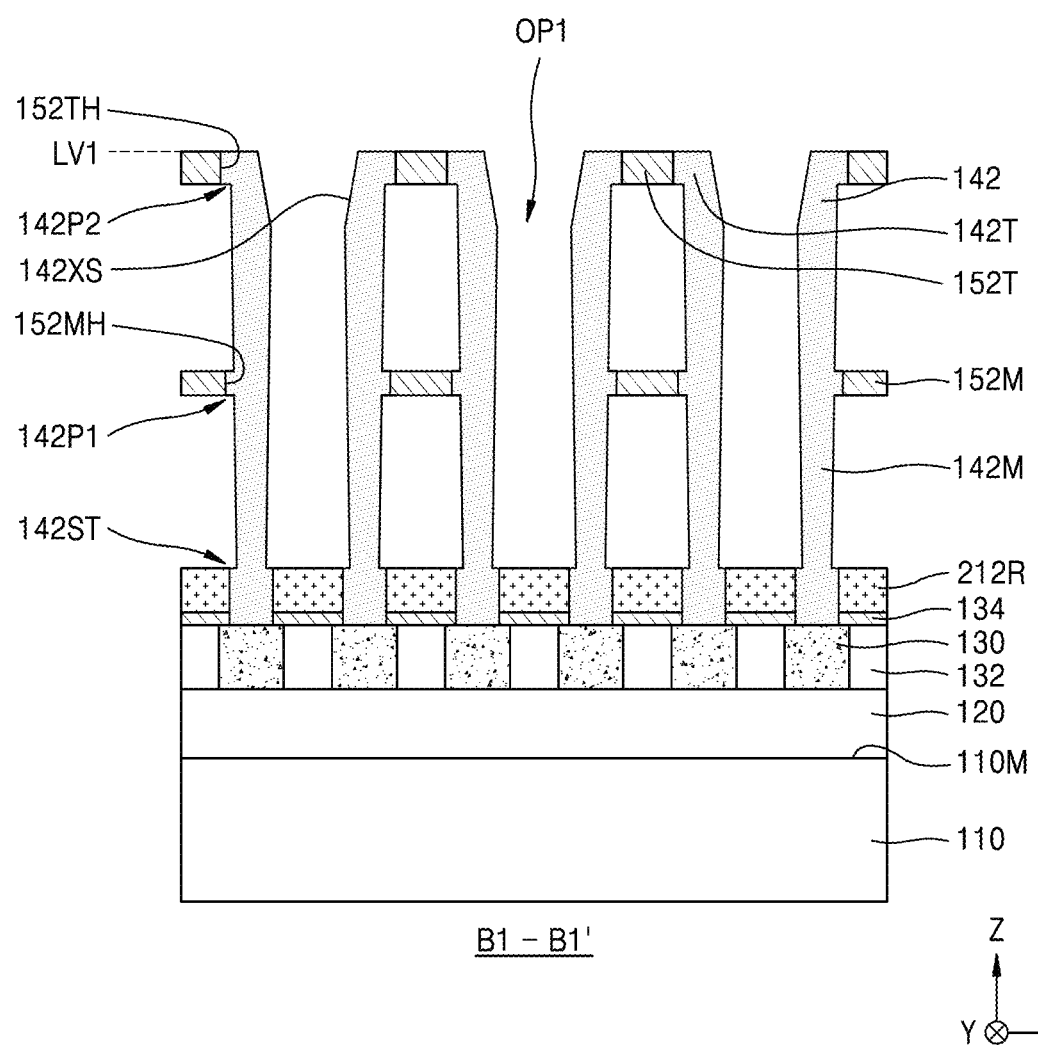

Referring to FIGS. 16A and 16B, a horizontal width of the first lower electrode portion 142 may be decreased by performing a first trimming process on the exposed portion of the first lower electrode portion 142.

In example embodiments, the first trimming process may include an isotropic dry etching or wet etching process. For example, when the first trimming process includes a wet etching process, the first trimming process may be performed by using an etchant including phosphoric acid, nitric acid, acetic acid, or combination thereof.

In example embodiments, the first trimming process may be performed such that a horizontal size of the first lower electrode portion 142 becomes from about 60% to about 90% of a horizontal size of the first lower electrode portion 142 before the first trimming process before etching.

A portion of the side wall of the first lower electrode portion 142 surrounded by the first middle supporting pattern 152M and the first top region 142T of the first lower electrode portion 142 surrounded by the first top supporting pattern 152T may not have a decrease in horizontal widths, and therefore, the first protrusion 142P1 being in contact with the first middle supporting pattern 152M and the second protrusion 142P2 being in contact with the first top supporting pattern 152T may be formed. In addition, a horizontal width of the side wall of the first lower electrode portion 142 covered by the first mold layer remaining portion 212R may not be decreased by the first trimming process, and the step portion 142ST may be formed at a same, or, substantially the same, vertical level as that of the top surface of the first mold layer remaining portion 212R.

Figure 17:
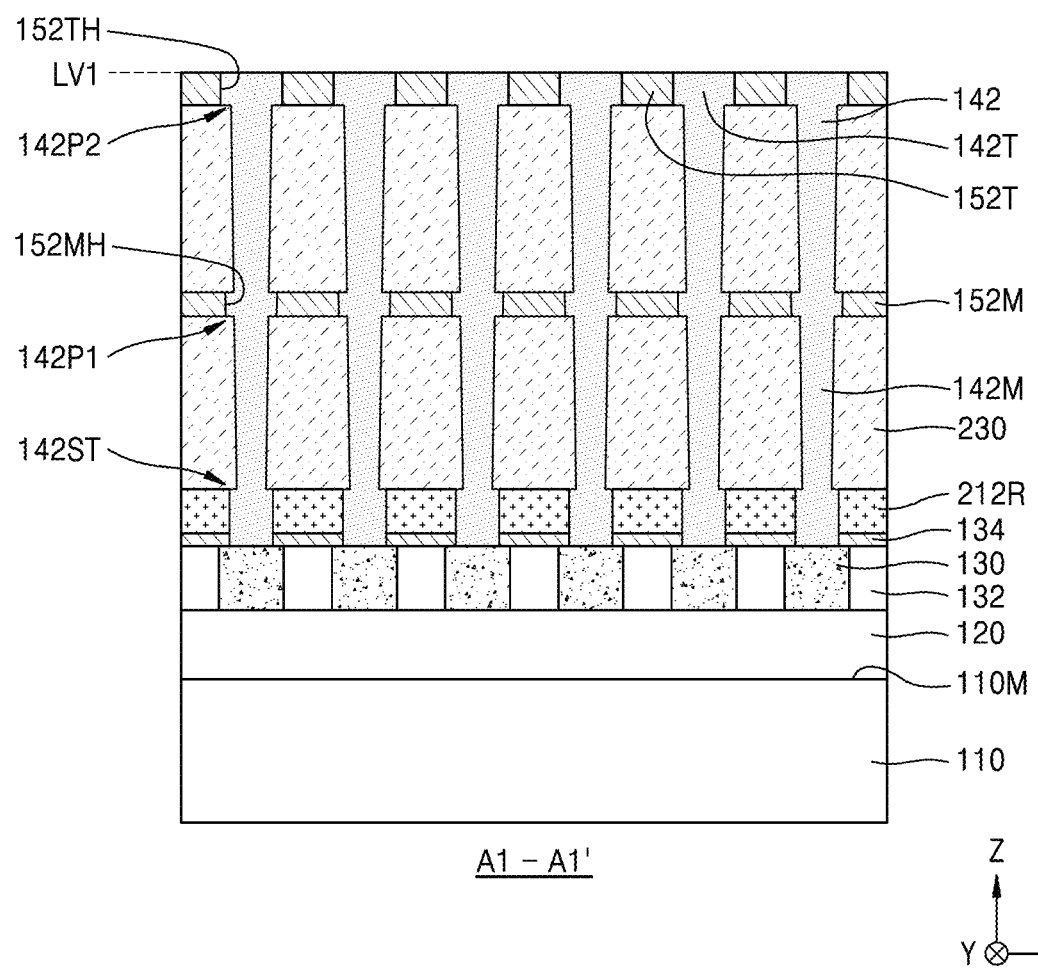

Referring FIG. 17, a protection layer 230 covering the first top supporting pattern 152T and the first middle supporting pattern 152M and filling spaces between the plurality of first lower electrode portions 142 is formed, and the top surface of the protection layer 230 may be etched back until the top surface of the first top supporting pattern 152T is exposed.

In example embodiments, the protection layer 230 may include at least one of silicon oxide, silicon oxynitride, spin-on-hardmask (SOH), and amorphous carbon layer (ACL).

Figure 18:
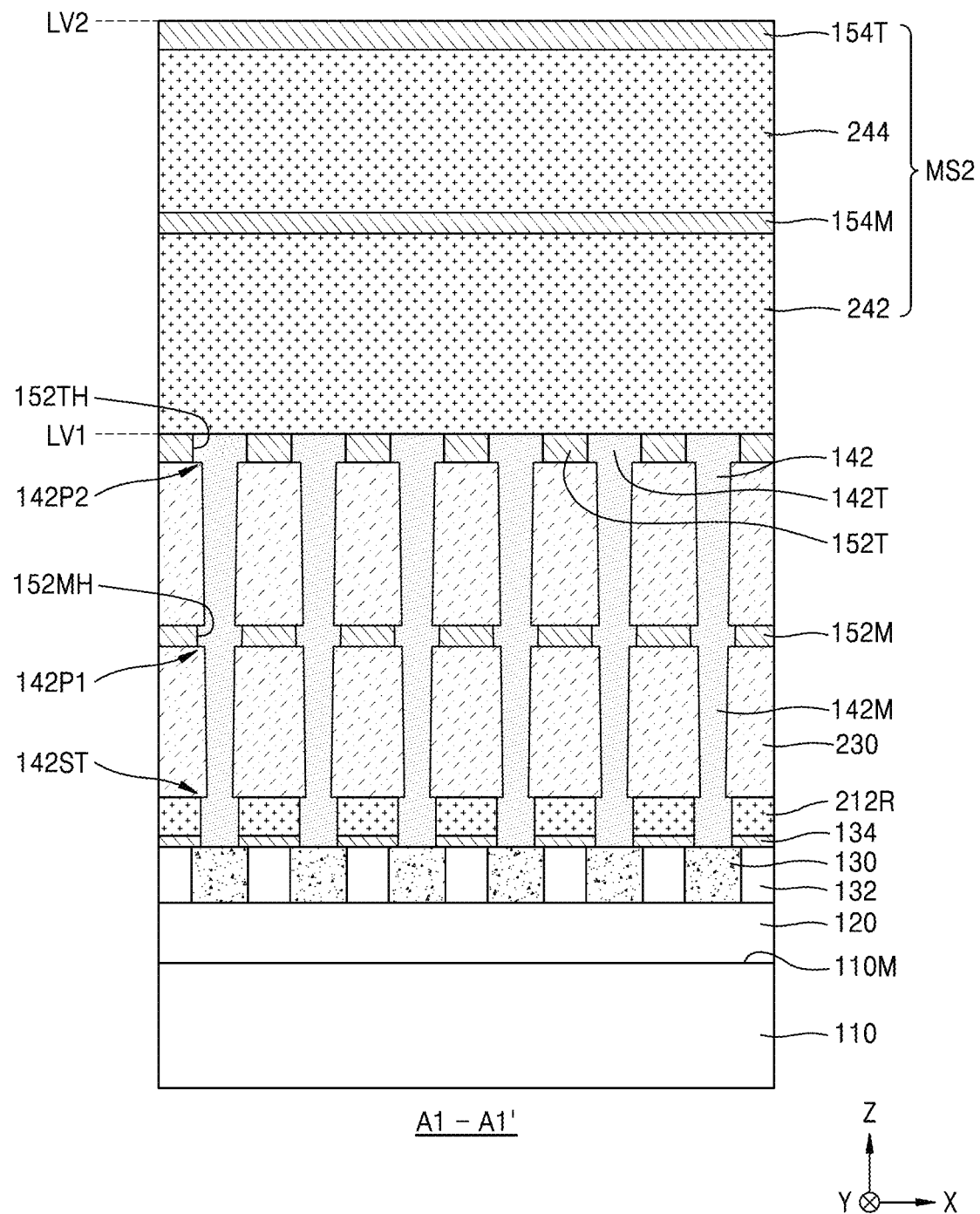

Referring to FIG. 18, a second mold stack MS2 may be formed on the first lower electrode portion 142 and the first top supporting pattern 152T. The second mold stack MS2 may include a third mold layer 242, the second middle supporting pattern 154M, a fourth mold layer 244, and the second top supporting pattern 154T.

In example embodiments, the third and fourth mold layers 242 and 244 and the second middle supporting pattern 154M may include materials having an etch selectivity ratio with respect to one another, and the third and fourth mold layers 242 and 244 and the second top supporting material 154T may include materials having an etch selectivity ratio with respect to one another. For example, when the third and fourth molding layer 242 and 244 include silicon oxide, the second middle supporting pattern 154M and the second top supporting pattern 154T may include silicon nitride, silicon oxynitride, silicon boron nitride (SiBN), or silicon carbon nitride (SiCN).

Referring to FIG. 19, the third mask pattern 252 including an opening 252H may be formed on the second top supporting pattern 154T, and the opening MSH2 penetrating the second mold stack MS2 may be formed by using the third mask pattern 252.

In example embodiments, the third mask pattern 252 may include polysilicon, silicon nitride, silicon oxide, silicon oxynitride, SOH, ACL, or a combination thereof.

The opening MSH2 may extend in the third direction (the X direction) to penetrate the second mold stack MS2, and a portion of the opening MSH2 penetrating the second top supporting pattern 154T may be referred to as the third opening 154TH, and a portion of the opening MSH2 penetrating the second middle supporting pattern 154M may be referred to as the fourth opening portion 154MH. The top surface of the first lower electrode portion 142 may be exposed to a bottom portion of the opening MSH2.

Figure 20:
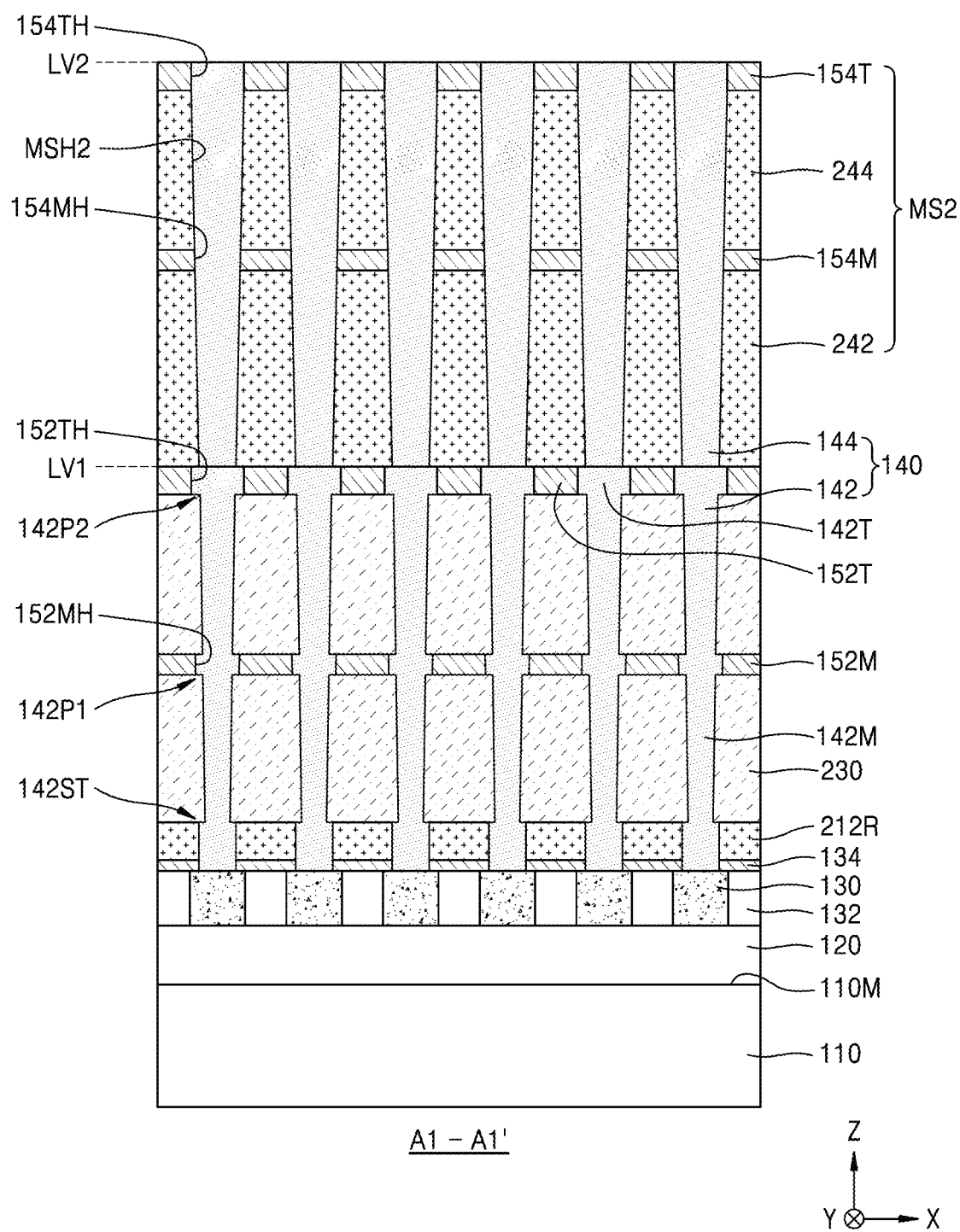

Referring to FIG. 20, a conductive layer (not shown) may be formed on the second mold stack MS2 to fill the opening MSH2, and the second lower electrode portion 144 may be formed by removing a top portion of the conductive layer until the top surface of the second top supporting pattern 154T is exposed.

Figure 21A:
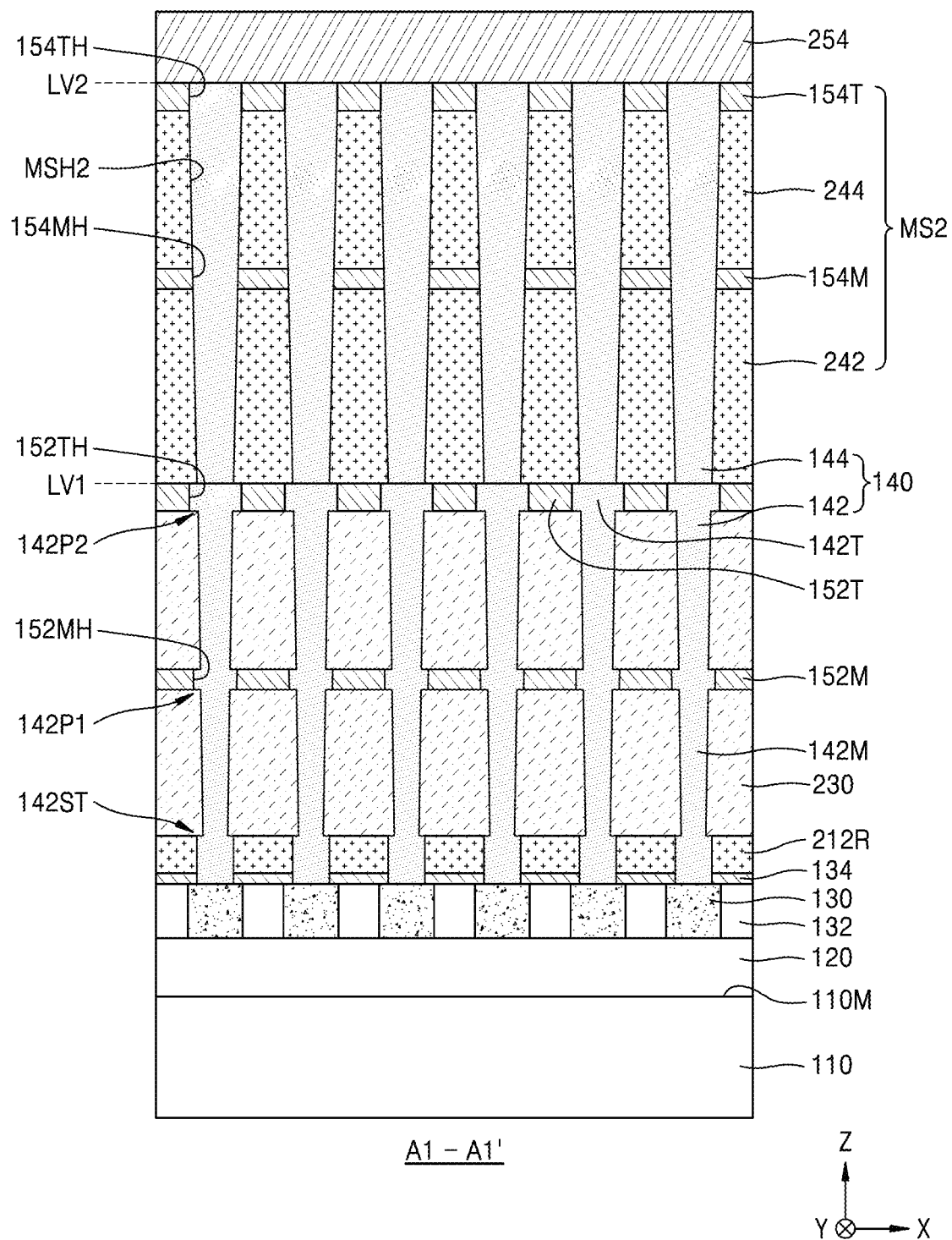
Figure 21B:
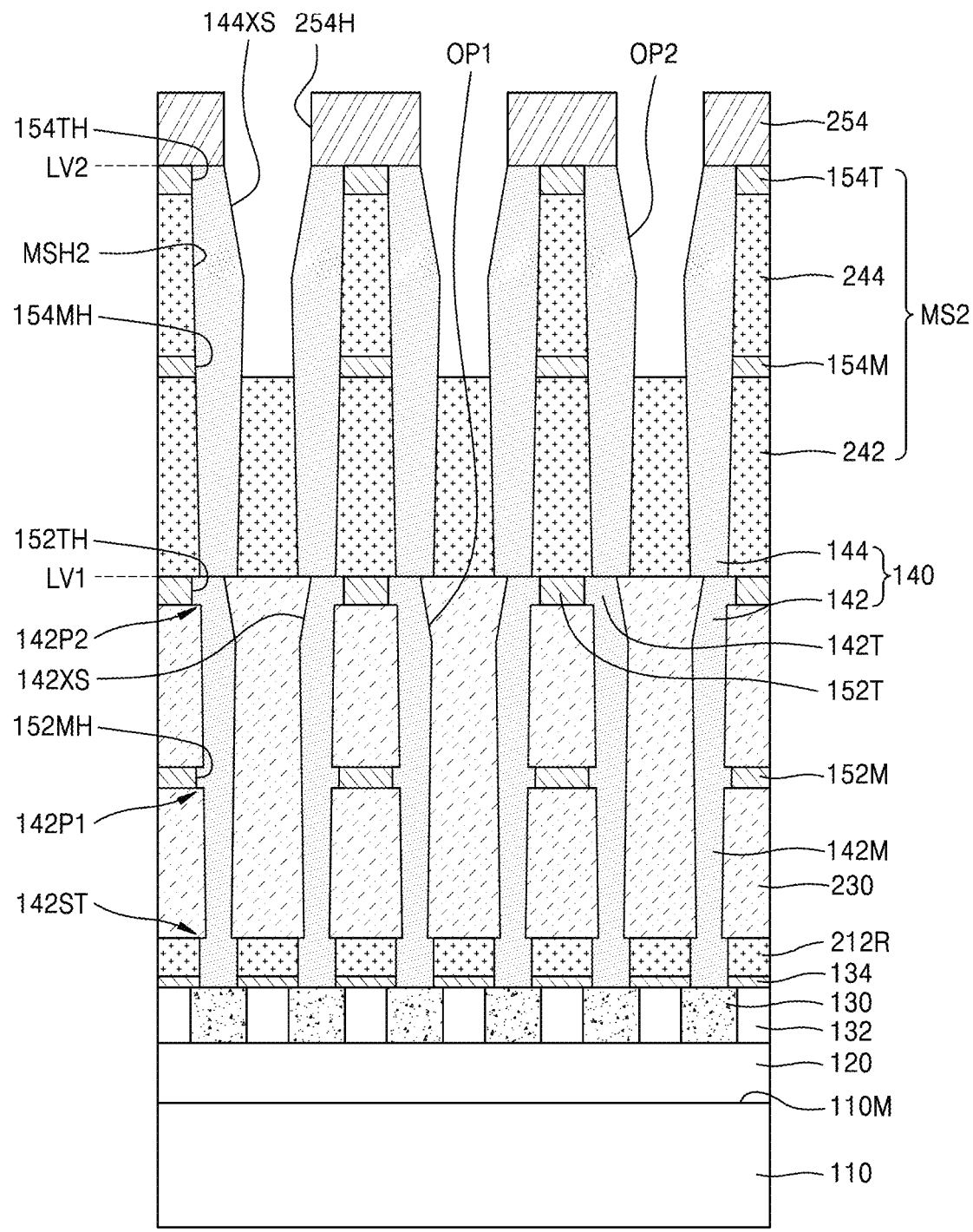

Referring to FIGS. 21A and 21B, a fourth mask pattern 254 including an opening 254H may be formed on the second lower electrode portion 144 and the second mold stack MS2. Next, the second mold opening OP2 may be formed by removing a portion of each of the second top supporting pattern 154T, the fourth mold layer 244, and the second middle supporting pattern 154 by using the fourth mask pattern 254 as an etching mask. In this case, the second mold opening OP2 may be formed to expose a portion of the top surface and a portion of the side wall of the second lower electrode portion 144.

Next, an inclined surface 144XS may be formed at an upper portion of the second lower electrode portion 144 by performing a trimming process on the upper portion of the second lower electrode portion 142 exposed by the second mold opening OP2.

Figure 22A:
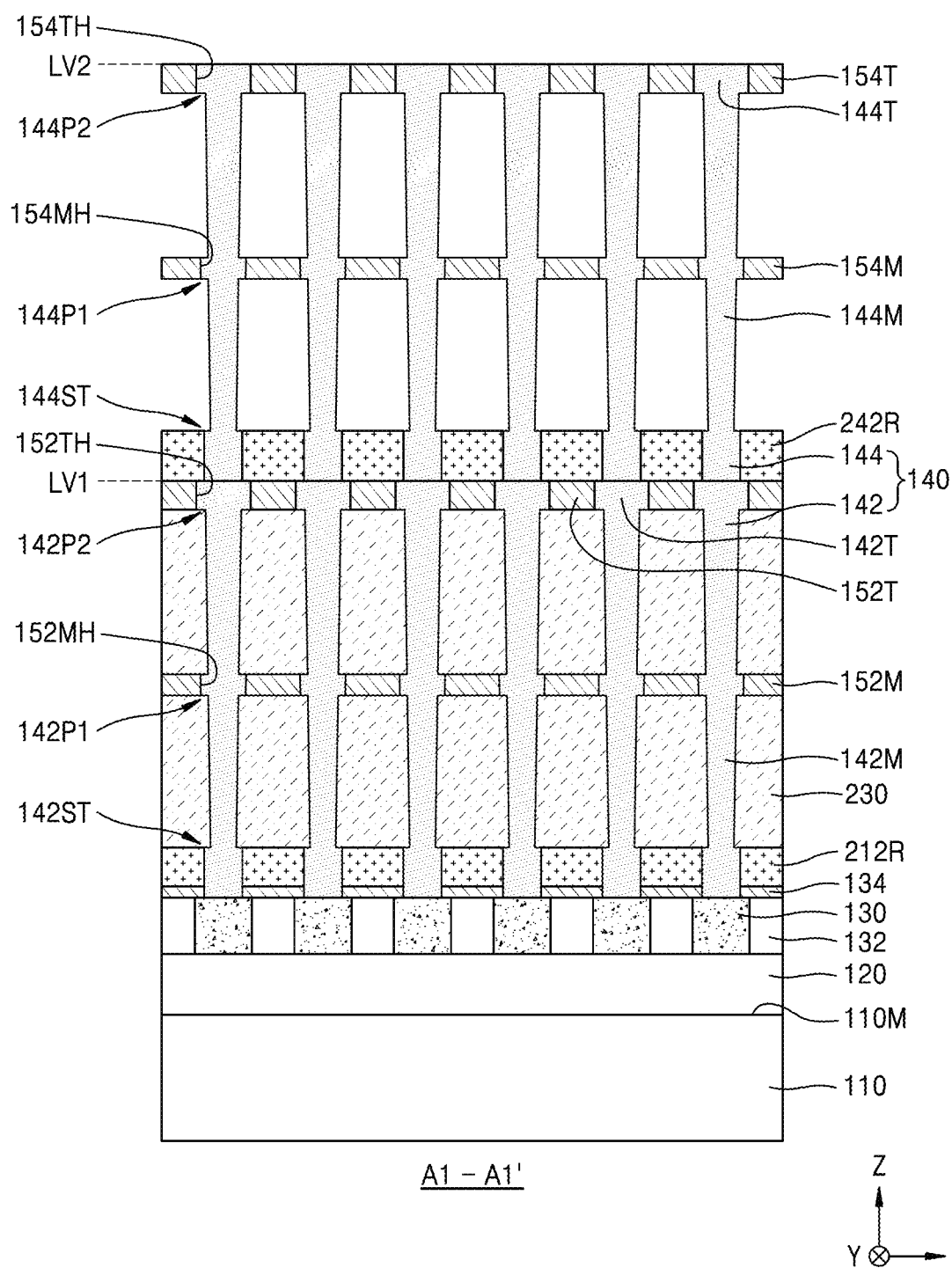
Figure 22B:
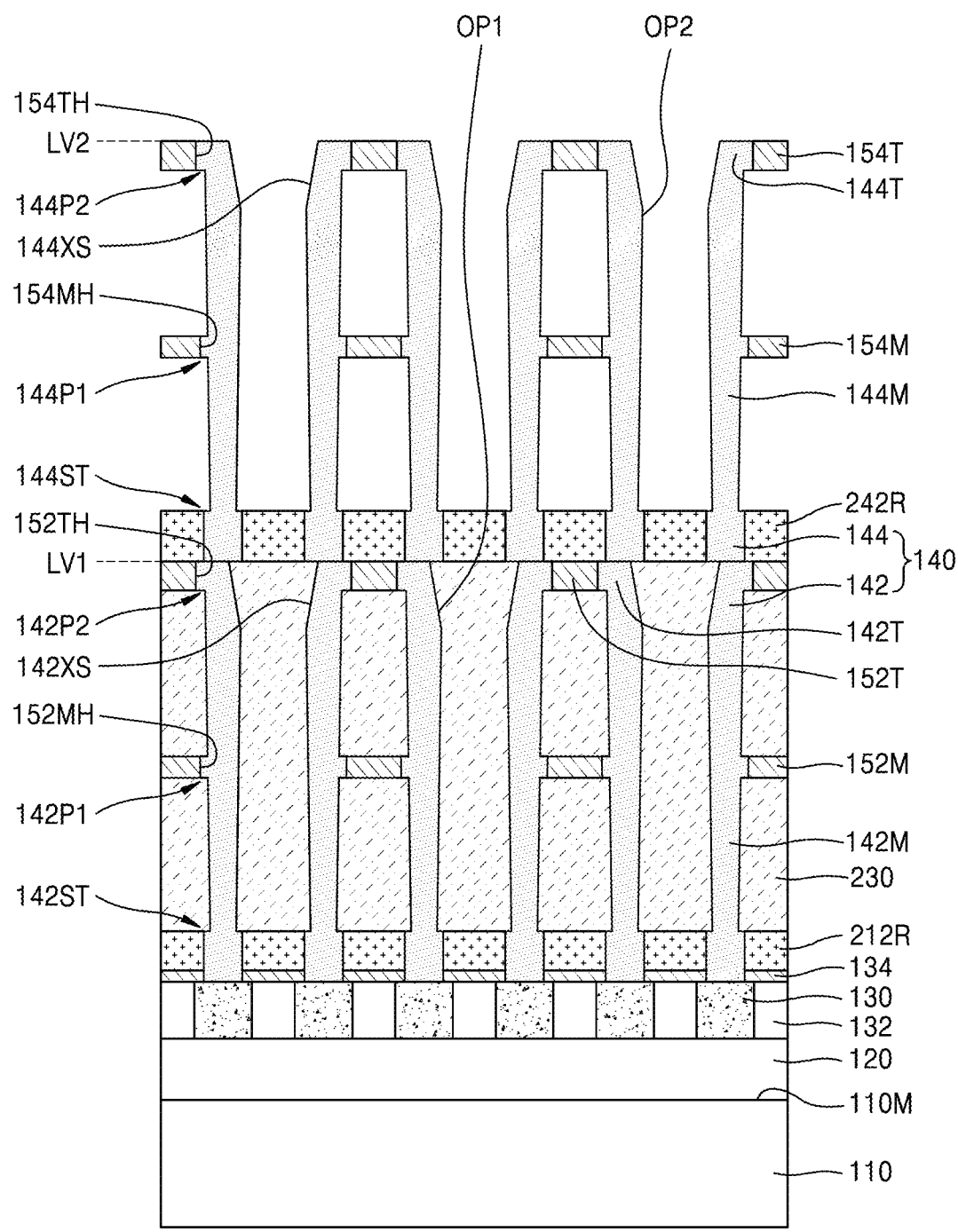

Referring to FIGS. 22A and 22B, a third mold layer remaining portion 242R may be formed by removing the fourth mold layer 244 and a portion of the third mold layer 242.

In example embodiments, a process for removing the portion of the third mold layer 242 and the fourth mold layer 244 may include an etching process using an etchant including $NH_4F$, HF and water. After a portion of the third mold layer 242, the third mold layer remaining portion 242R may surround a lower portion of the side wall of the second lower electrode portion 144.

Next, a horizontal width of the second lower electrode portion 144 may be decreased by performing a second trimming process on the exposed portion of the second lower electrode portion 144.

In example embodiments, the second trimming process may include an isotropic dry etching or wet etching process. For example, when the second trimming process includes a wet etching process, the second trimming process may be performed by using an etchant including phosphoric acid, nitric acid, acetic acid, or combination thereof.

A portion of the side wall of the second lower electrode portion 144 surrounded by the second middle supporting pattern 154M and the second top region 144T of the second lower electrode portion surrounded by the second top supporting pattern 154T may not have a decrease in horizontal widths, and therefore, the third protrusion 144P1 being in contact with the second middle supporting pattern 154M and the fourth protrusion 144P2 being in contact with the second top supporting pattern 154T may be formed. In addition, a side wall of the second lower electrode portion 144 covered by the third mold layer remaining portion 242R may also not have a decrease in a horizontal width, and the step portion 144ST may be formed at a same, or, substantially the same, vertical level as the top surface of the third mold layer remaining portion 242R.

Figure 23A:
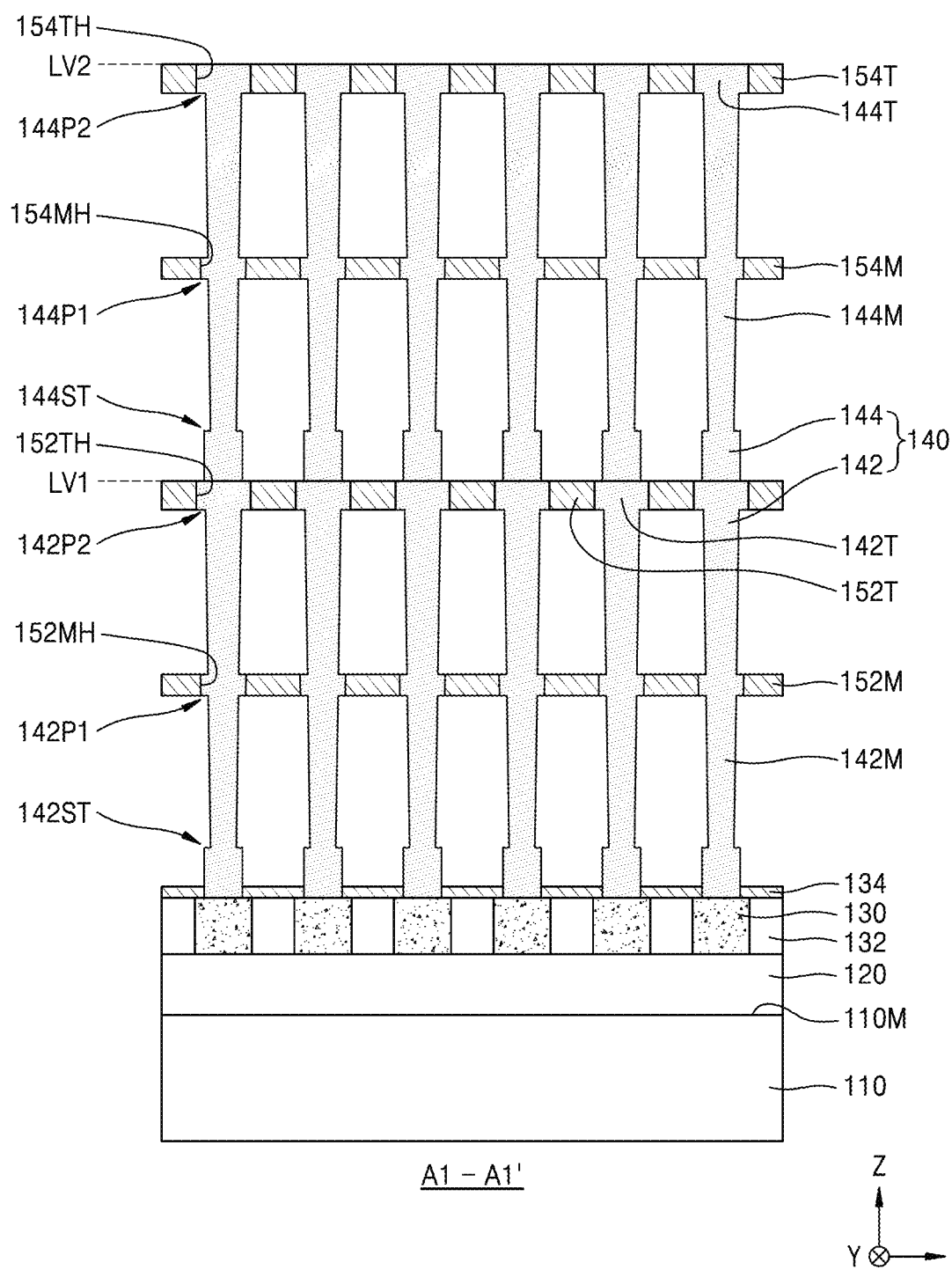
Figure 23B:
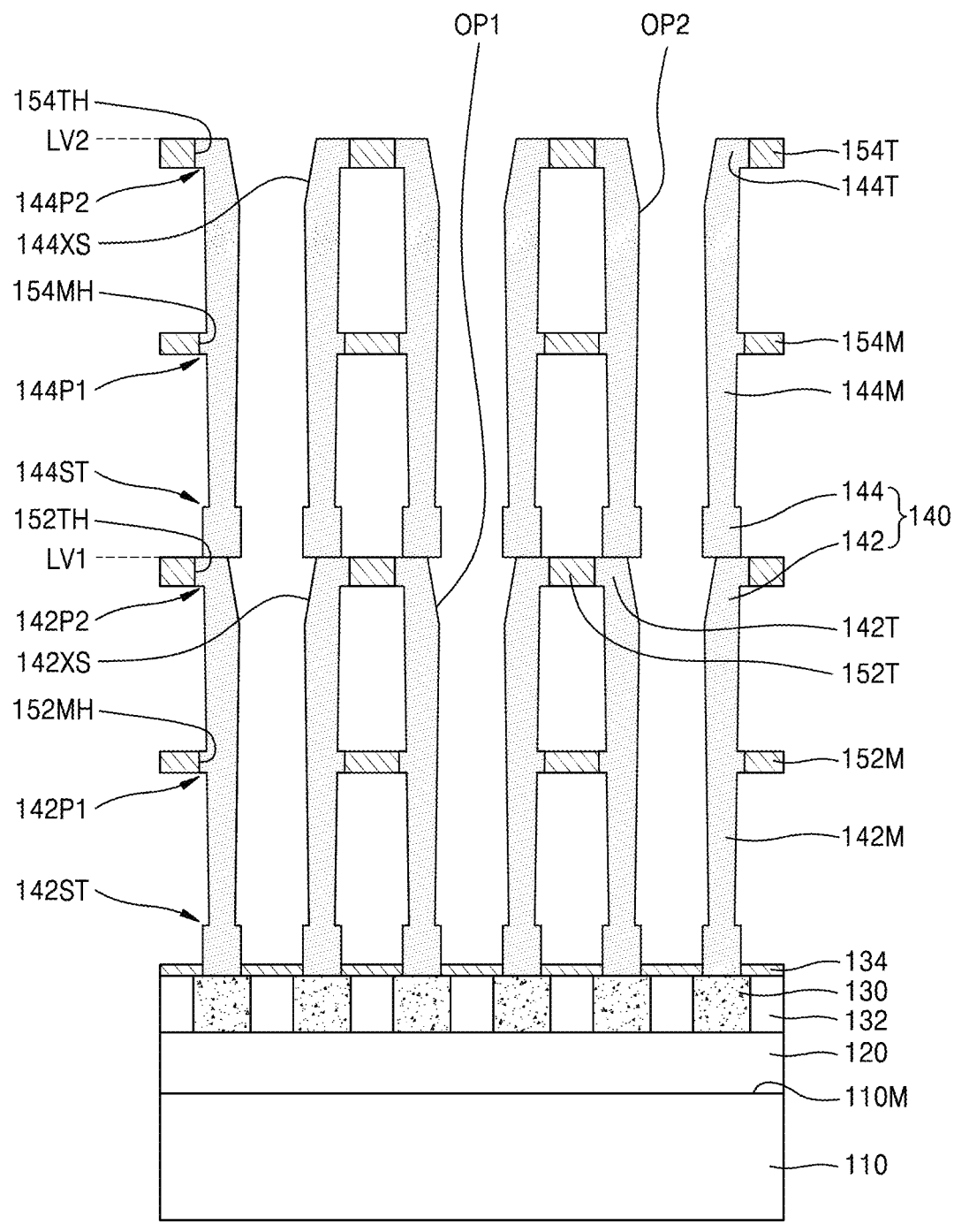

Referring to FIGS. 23A and 23B, the third mold layer remaining portion 242R (see FIG. 22A), the protection layer 230 (see FIG. 22A), and the first mold layer remaining portion 212R (see FIG. 22A) may be removed.

Figure 24A:
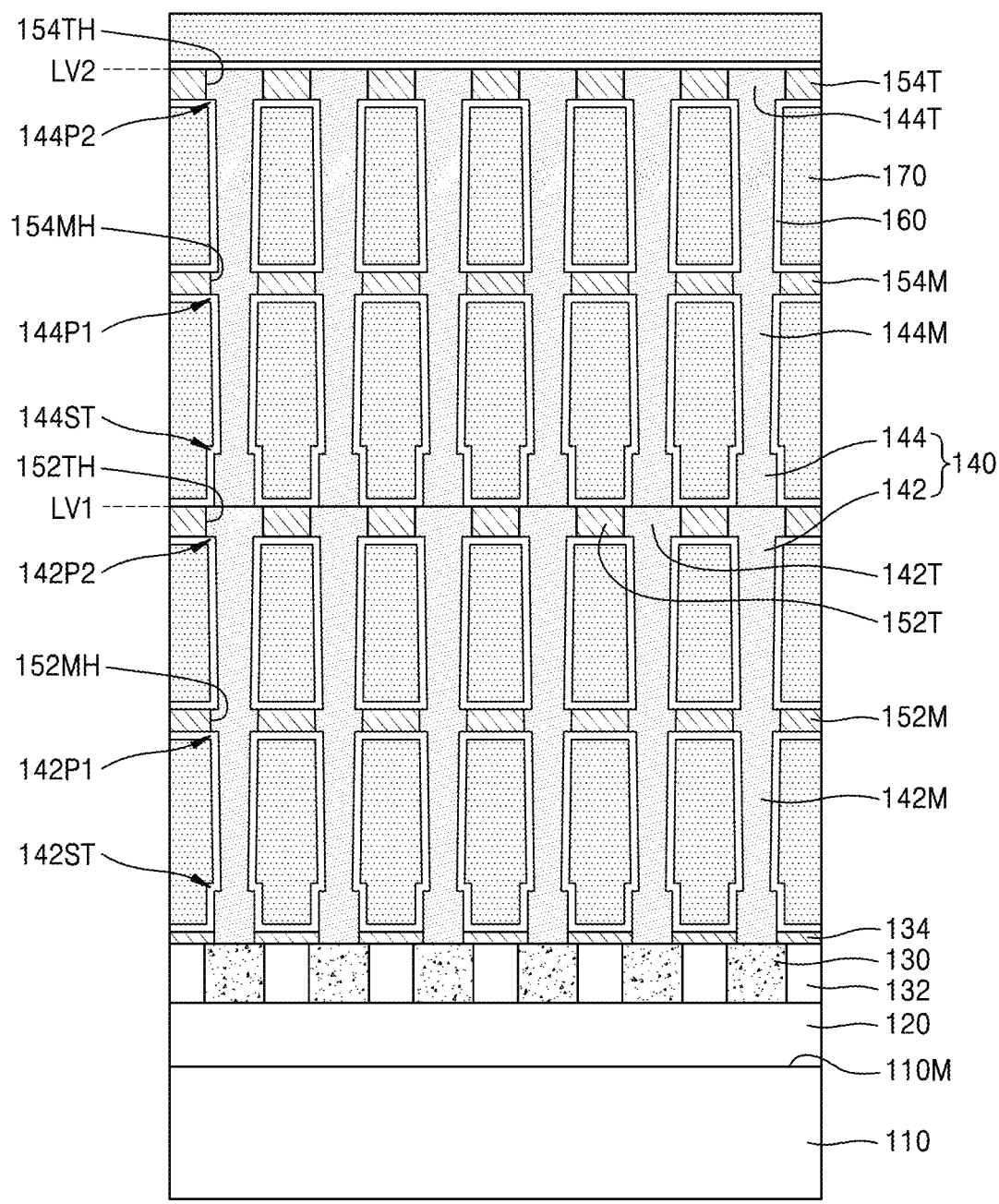
Figure 24B:
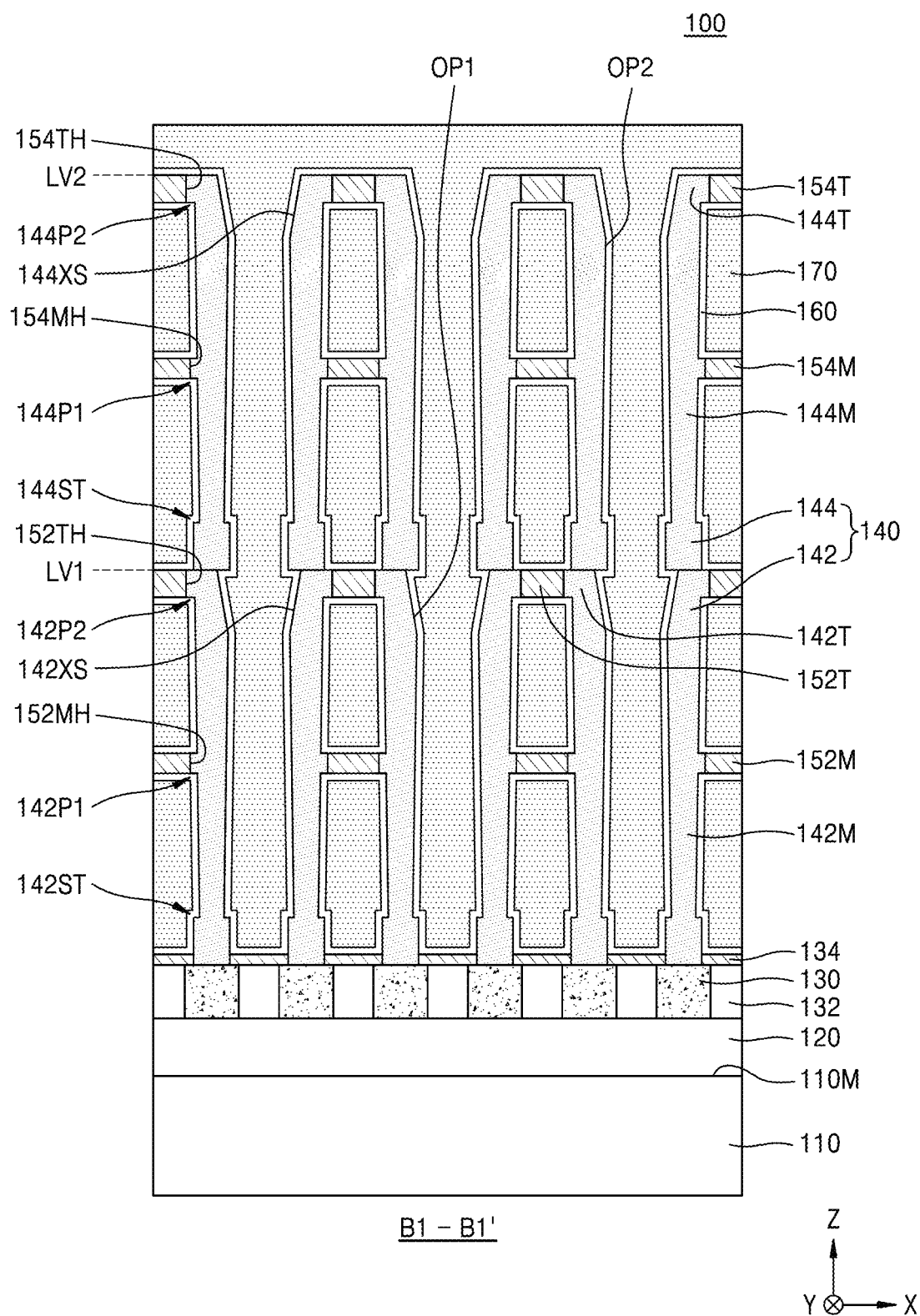

Referring to FIGS. 24A and 24B, the dielectric layer 160 may conformally formed on exposed surfaces of the first lower electrode portion 142 and the second lower electrode portion 144. In this case, the dielectric layer 160 may also be formed on exposed surfaces of the first middle supporting pattern 152M, the first top supporting pattern 152T, the second middle supporting pattern 154M, and the second top supporting pattern 154T. The dielectric layer 160 may not be formed on a portion of a surface of the first lower electrode portion 142, the portion being in contact with the first middle supporting pattern 152M and the first top supporting pattern 152T, and on a portion of a surface of the second lower electrode portion 144, the portion being in contact with the second middle supporting pattern 154M and the second top supporting pattern 154T.

Next, the upper electrode 170 covering the dielectric layer 160 may be formed.

Optionally, an annealing process may be further performed after forming the upper electrode 170.

According to a method of manufacturing the integrated circuit device 100 according to some example embodiments, the trimming process for decreasing the width of the side wall of the first lower electrode portion 142 and the trimming process for decreasing the width of the side wall of the second lower electrode portion 144 may be performed, and the first lower electrode portion 142 and the second lower electrode portion 144 may secure a sufficient separation distance with another first lower electrode portion 142 and another second lower electrode portion 144 respectively adjacent to the first lower electrode portion 142 and the second lower electrode portion. By doing so, the lower electrode 140 may have an increased height, and at the same time, occurrence of bridge failure or occurrence of the leakage current in the lower electrode 140 may be prevented or reduced. The integrated circuit device 100 may have improved electrical properties.

In FIGS. 15A and 15B, it is described as an example that a portion of the first mold layer 212 and the second mold layer 214 are removed, and the first mold layer remaining portion 212R is arranged at a level lower than that of the bottom surface of the first middle supporting pattern 152M and is formed in a relatively small height only surrounding a lower portion of the side wall of the first lower electrode portion 142. Likewise, in FIGS. 22A and 22B, it is described as an example that a portion of the third mold layer 242 and the fourth mold layer 244 are removed, and the third mold layer remaining portion 242R is arranged at a level lower than that of the bottom surface of the second middle supporting pattern 154M and is formed in a relatively small height only surrounding a lower portion of the side wall of the second lower electrode portion 144.

However, only the second mold layer 214 may be removed and the first mold layer 212 may not be removed. In this case, as the first trimming process is performed on an upper portion of the side wall of the first lower electrode portion 142A (see FIG. 4) arranged at a level higher than that of the top surface of the first middle supporting pattern 152M, and therefore, only a horizontal width of the upper portion of the side wall of the first lower electrode portion 142A may be decreased. In addition, only the fourth mold layer 244 may be removed and the third mold layer 242 may not be removed. In this case, the second trimming process may be formed on an upper portion of the side wall of the second lower electrode portion 144A (see FIG. 4) arranged at a level higher than that of the top surface of the second middle supporting pattern 154M, and thus, only a horizontal width of the upper portion of the side wall of the second lower electrode portion 144A may be decreased. By doing so, the integrated circuit device 100A described with reference to FIG. 4 may be formed.

In addition, performance of the first trimming process for decreasing the horizontal width of the first lower electrode portion 142 is explained as an example in connection with FIGS. 16A and 16B. However, unlike in FIGS. 16A and 16B, after forming the first mold layer OP1, a process of removing a portion of the first mold layer 212 and the second mold layer 214 may not be performed, and the first trimming process for decreasing the horizontal width of the first lower electrode portion 142B (see FIG. 5A) may not be performed. Next, the second mold stack MS2 may be formed on the first mold stack MS1 in which the first mold opening OP1 is formed, and the processes described with reference to FIGS. 19 through 24B may be performed. In this case, the first lower electrode portion 142B may have a side wall that has a constant slope or continuously connected along the entire height of the first lower electrode portion 142B, and therefore, the integrated circuit device 100B described with reference to FIGS. 5A and 5B may be formed.

In addition, in FIGS. 13 and 20, it is described as an example that the first lower electrode portion 142 and the second lower electrode portion 144 are formed in a pillar shape to completely fill the opening MSH1 of the first mold stack MS1 and the opening MSH2 of the second mold stack MS2. However, the first lower electrode 142 may be formed to include the first seam region SR1 therein without completely filling the opening MSH1 of the first mold stack MS1, and the second lower electrode 144 may be formed to include the second seam region SR2 without completely filling the opening MSH2 of the second mold stack MS2. In this case, the integrated circuit device 100D described with reference to FIG. 7 may be formed.

In addition, in FIG. 18, it is described as an example that the second mold stack MS2 includes the third mold layer 242 and the second middle supporting pattern 154M. However, the second mold stack MS2 may include the fourth mold layer 244 and the second top supporting pattern 154T, and the fourth mold layer 244 may be directly arranged on the first lower electrode portion 142 and the first top supporting pattern 152T (in other words, the second middle supporting pattern 154M may be omitted). In this case, the integrated circuit device 100F described with reference to FIG. 10 may be formed.

FIGS. 25 through 28 are cross-sectional views respectively showing a method of manufacturing the integrated circuit device 100C according to process order, according to example embodiments.

Figure 25:
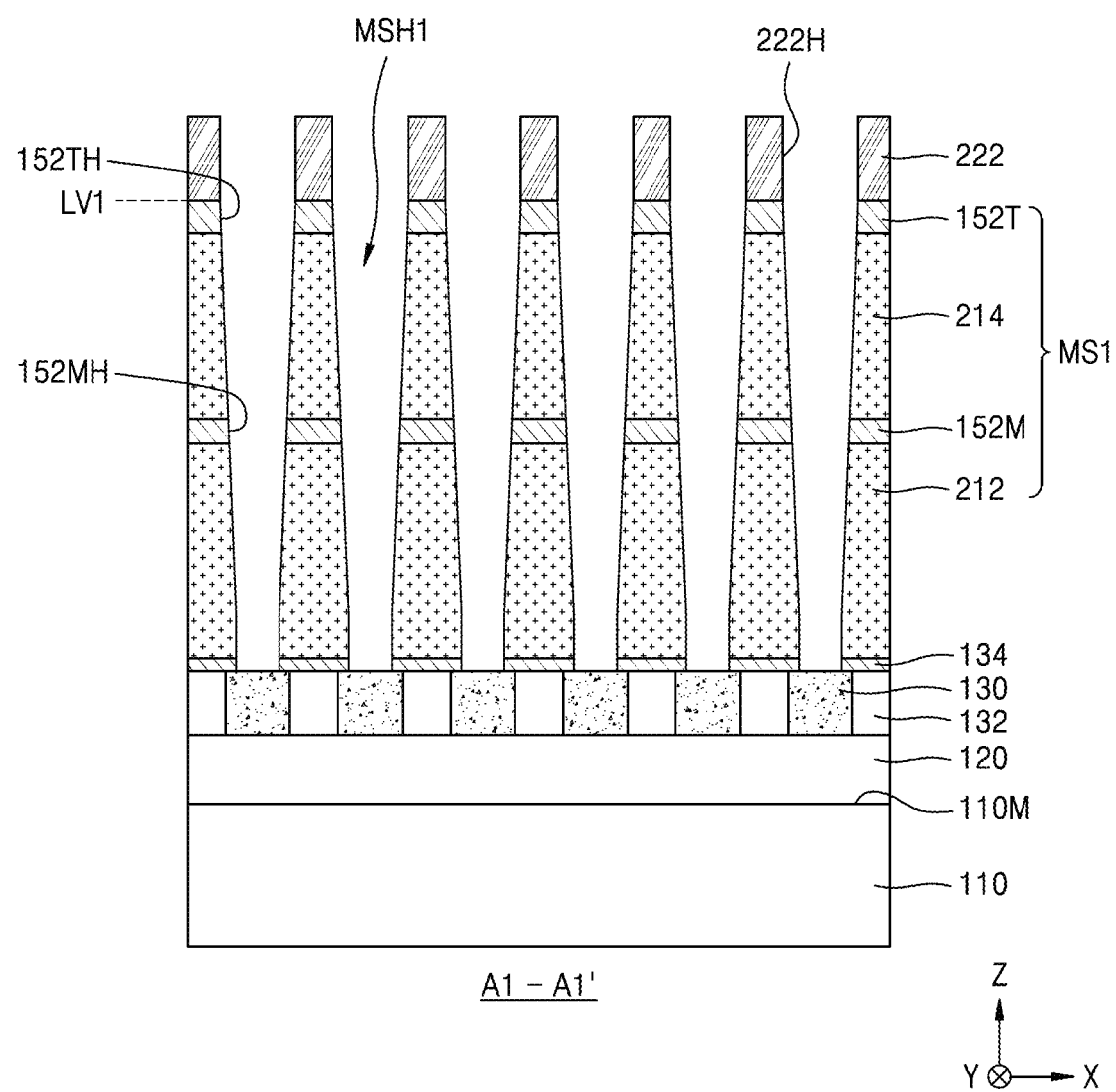
FIGS. 25 through 28 are cross-sectional views showing a manufacturing method of an integrated circuit device according to process orders, according to example embodiments.

Referring to FIG. 25, the first mask pattern 222 including the opening 222H may be formed on the first mold stack MS1. Next, the opening MSH1 penetrating the first mold stack MS1 may be formed by using the first mask pattern 222 as an etching mask.

Figure 26:
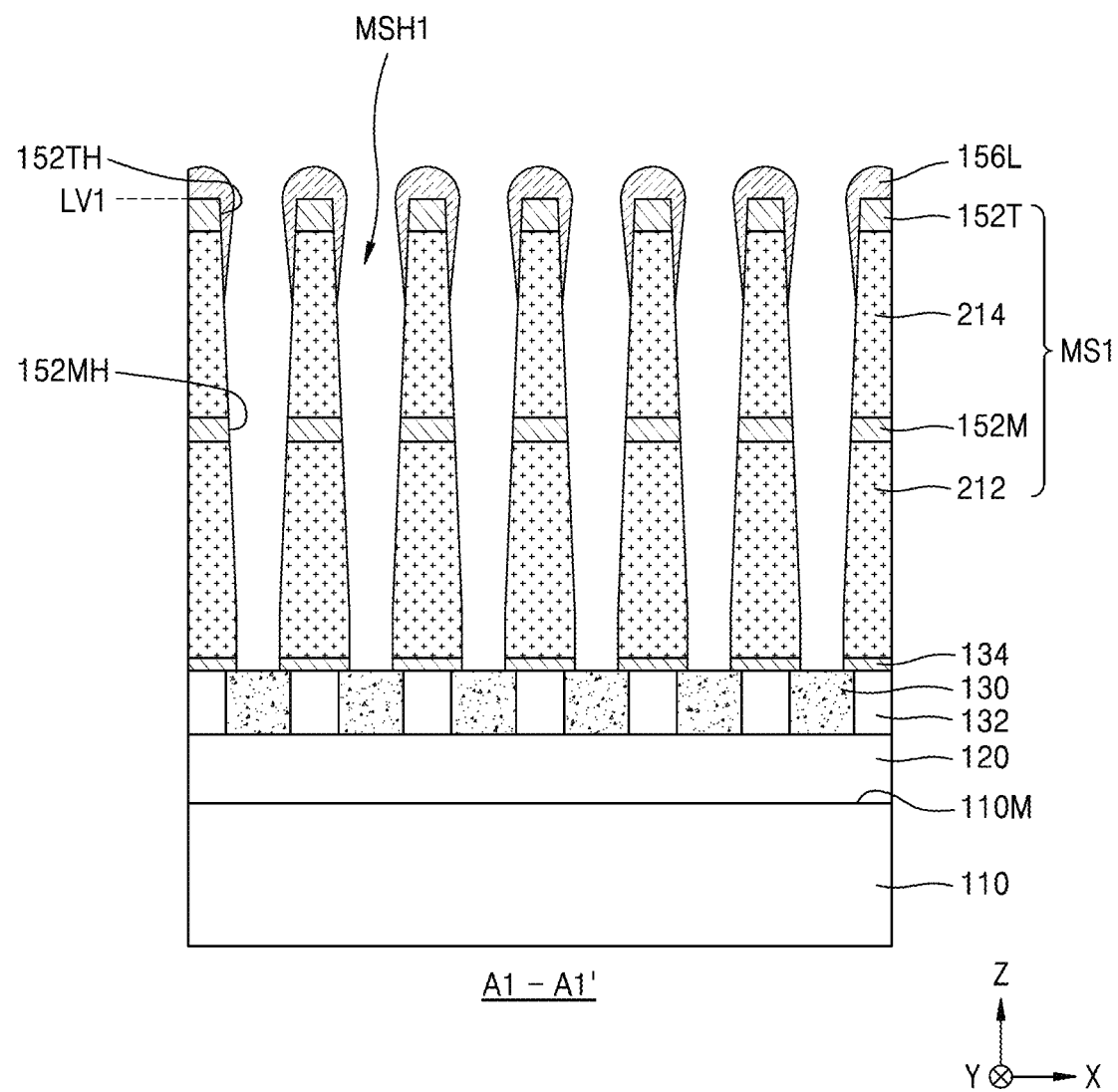

Referring to FIG. 26, the first mask pattern 222 may be removed, and the spacer film 156L may be formed on a portion of the upper portion of the first mold stack MS1 so as to cover an upper portion of the inner wall of the opening MSH1.

In example embodiments, a spacer film 156L may be formed by using silicon nitride, silicon oxynitride, silicon oxide, or a combination thereof. The spacer film 156L may be formed by using a material that has an etch selectivity ratio with respect to the first top supporting pattern 152T, and may be formed by using a material that has poor step coverage.

In example embodiments, the spacer film 156L is not conformally formed on an inner wall of the opening MSH1 and locally formed on an upper portion of the inner wall of the opening MSH1. The spacer film 156L may be formed in a way that a horizontal width of the spacer film 156L arranged at a same, or, substantially the same, level as the top surface of the first top supporting pattern 152T is greater than a horizontal width of the spacer film 156L arranged at a same, or, substantially the same, level as the top surface of the second mold layer 214. In addition, as the spacer film 156L is arranged at an upper portion of the inner wall of the opening MSH1, a horizontal width at an entrance of the opening MSH1 may be less than a horizontal width an inside or a lower portion of the opening MSH1.

Figure 27:
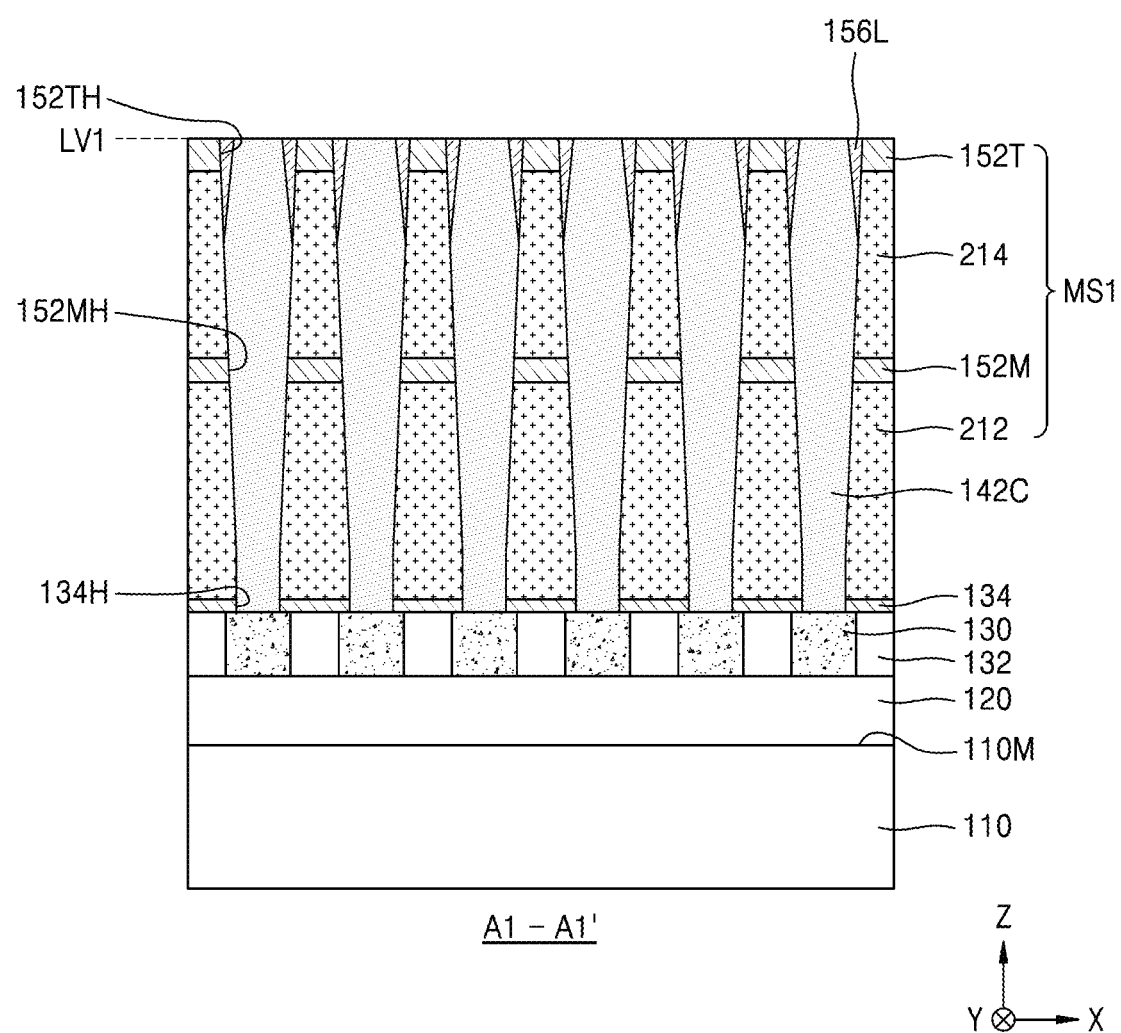

Referring to FIG. 27, the first lower electrode portion 142C may be formed by filling the openings 134H and MSH1 by using the conductive layer on the first mold stack MS1 and the spacer film 156L and removing a top portion of the conductive layer until the top surface of the first top supporting pattern 152T is exposed. In the process of removing the top portion of the conductive layer, a portion of the spacer film 156L arranged at a level higher than that of the top surface of the first top supporting pattern 152T may be removed together.

Figure 28:
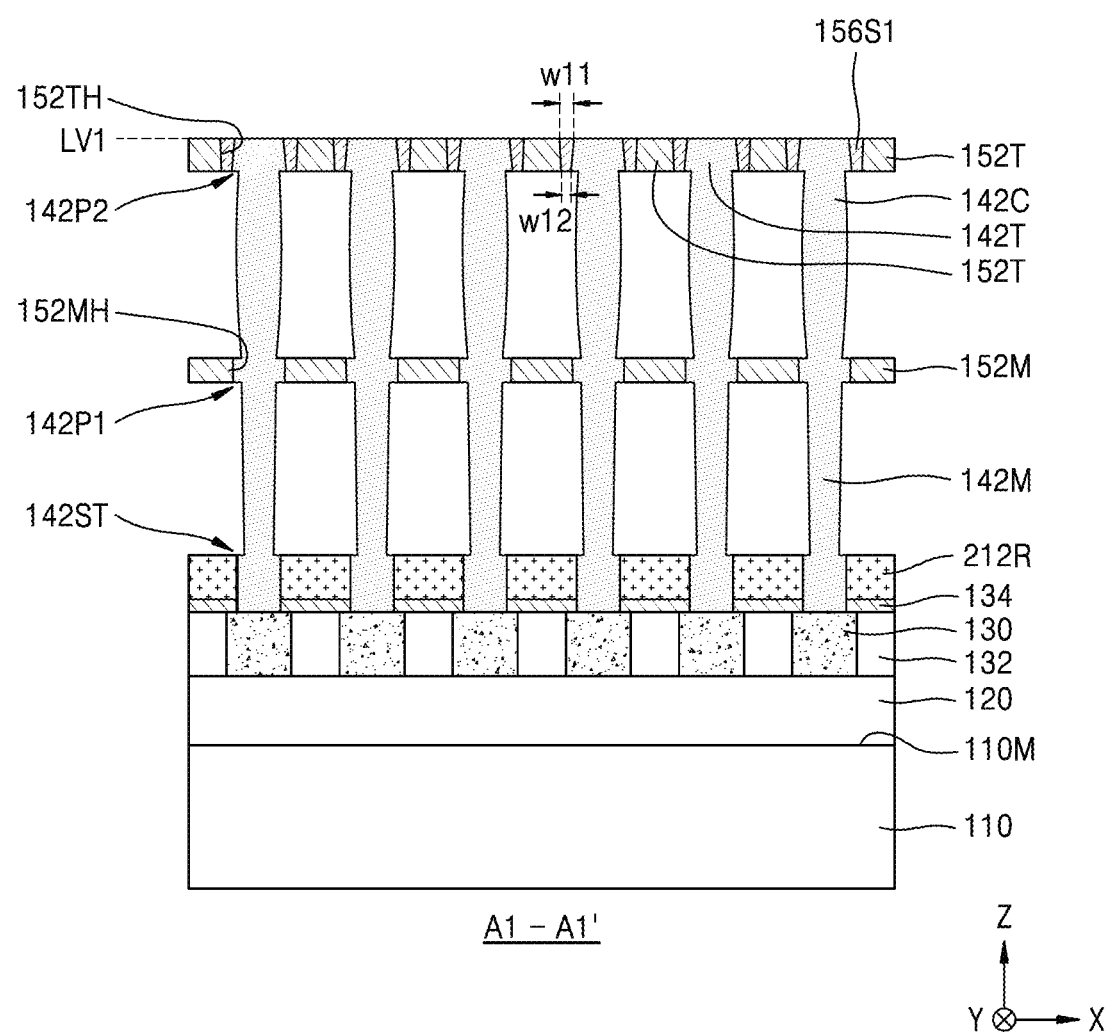

Referring to FIG. 28, the first mold opening OP1 (see FIG. 14B) may be formed by removing a portion of each of the first top supporting pattern 152T, the second mold layer 214 (see FIG. 27), and the first middle supporting pattern 152M. Next, the first mold layer remaining portion 212R may be formed by removing the second mold layer 214 (see FIG. 27) and a portion of the first mold layer 212.

As the second mold layer 214 is removed, a portion of the spacer film 156L arranged at an upper portion of the side wall of the first lower electrode portion 142C may also be exposed. A portion of the spacer film 156L arranged on the side wall of the first lower electrode portion 142C at a level lower than that of the bottom surface of the first top supporting pattern 152T may be removed, and the first spacer 156S1 may remain between the first lower electrode portion 142C and the first top supporting pattern 152T.

The first spacer 156S1 may have a top surface arranged at a same, or, substantially the same, level as that of the top surface of the first top supporting pattern 152T and a bottom surface arranged at a same, or, substantially the same, level as that of the bottom surface of the first top supporting pattern 152T. A horizontal width w11 of the top surface of the first spacer 156S1 may be greater than a horizontal width w12 of the bottom surface of the first spacer 156S1.

Next, a horizontal width of the first lower electrode portion 142C may be decreased by performing the first trimming process on the exposed portion of the first lower electrode portion 142C.

The integrated circuit device 100C may be completely formed by performing the processes described with reference to FIGS. 17 through 24B. Although not shown, a process of forming a spacer film (not shown) on a portion of the upper portion of the second mold stack MS2 for forming the second spacer 156S2 and removing the spacer film arranged on the side wall of the second lower electrode portion 144 at a level lower than that of the bottom surface of the second top supporting pattern 154T may be further performed.

According to a method of manufacturing the integrated circuit device 100C according to some example embodiments, the horizontal width of the top surface of the first lower electrode portion 142C may be decreased, and therefore, a sufficient separation distance between a first lower electrode portion 142C and another first lower electrode portion 142C adjacent thereto may be secured. By doing so, the lower electrode 140C may have an increased height, and at the same time, occurrence of bridge failure or occurrence of the leakage current in the lower electrode 140C may be prevented or reduced. The integrated circuit device 100C may have improved electrical properties.

FIGS. 29 through 33 are cross-sectional views respectively showing a method of manufacturing an integrated circuit device 100E according to process order, according to example embodiments. particularly, FIGS. 29, 30, 31A, 32A and 33A represent cross-sectional views corresponding to the cross-sectional view taken along line A2-A2' shown in FIG. 8, and FIGS. 31B, 32B, and 33B represent cross-sectional views corresponding to cross-sectional view taken along line B2-B2' shown in FIG. 2.

Figure 29:
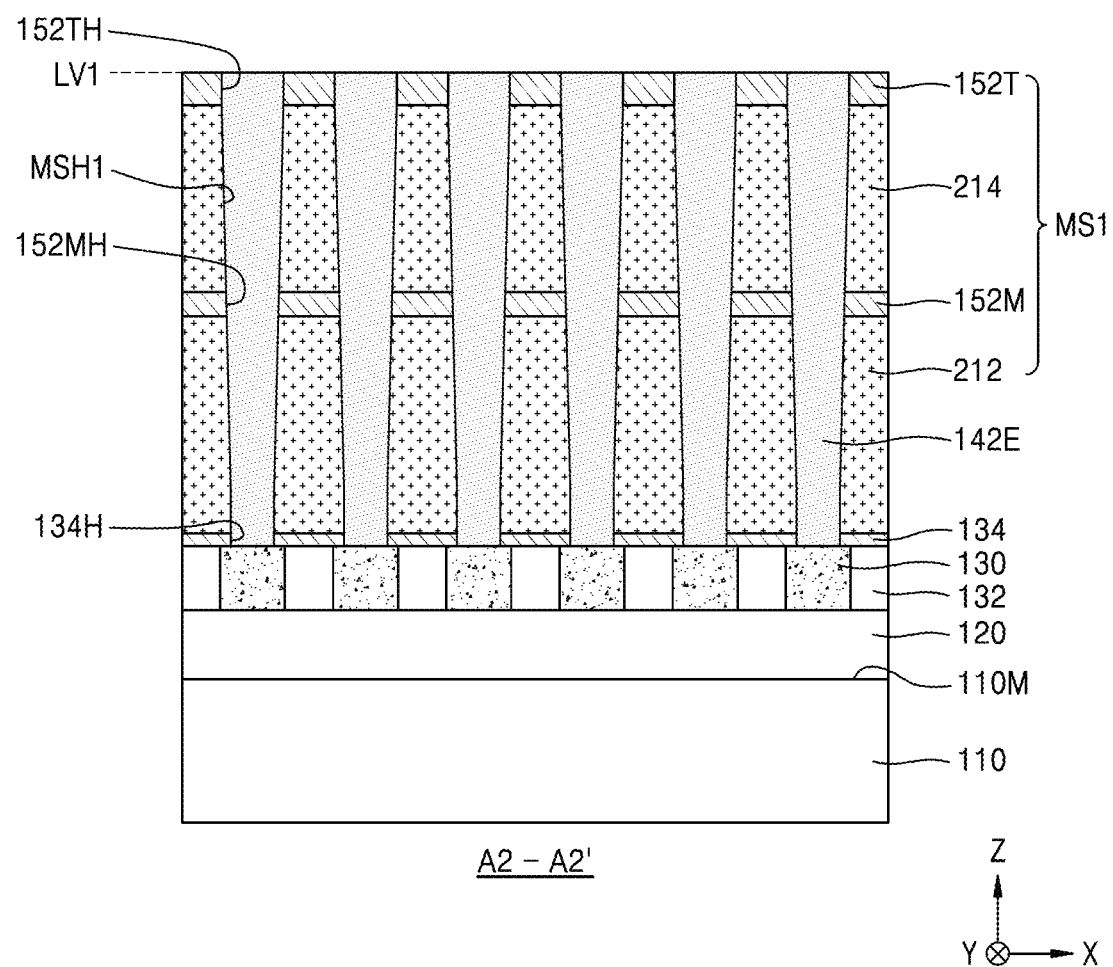

Referring to FIG. 29, the first lower electrode portion 142E may be formed by forming a conductive layer (not shown) on the landing pad 130 and the first mold stack MS1 to fill the openings 134H and MSH1 and removing a top portion of the conductive layer until the top surface of the first top supporting pattern 152T is exposed.

Figure 30:
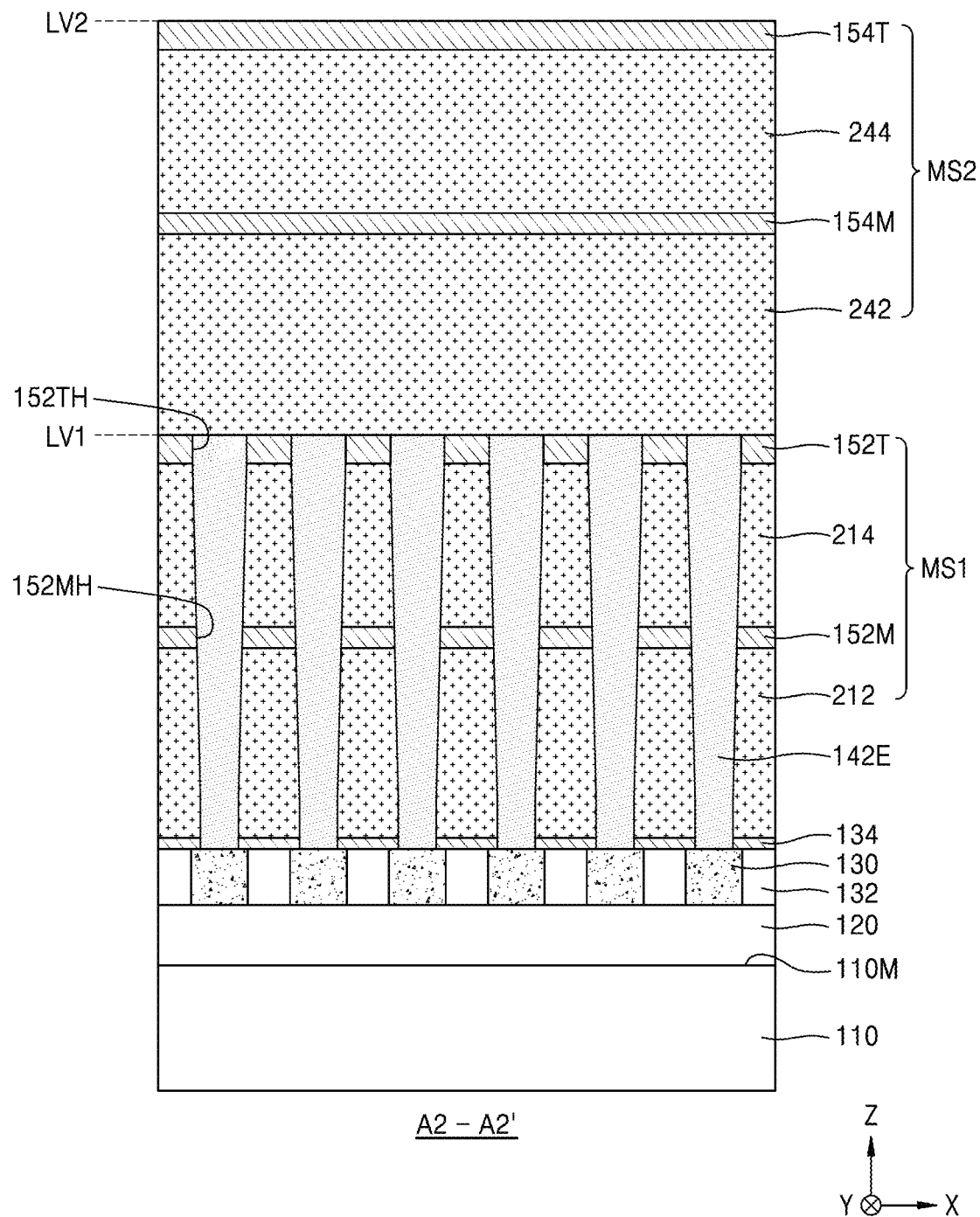

Referring to FIG. 30, the second mold stack MS2 may be formed on the first mold stack MS1 and the first lower electrode portion 142E.

Figure 31B:
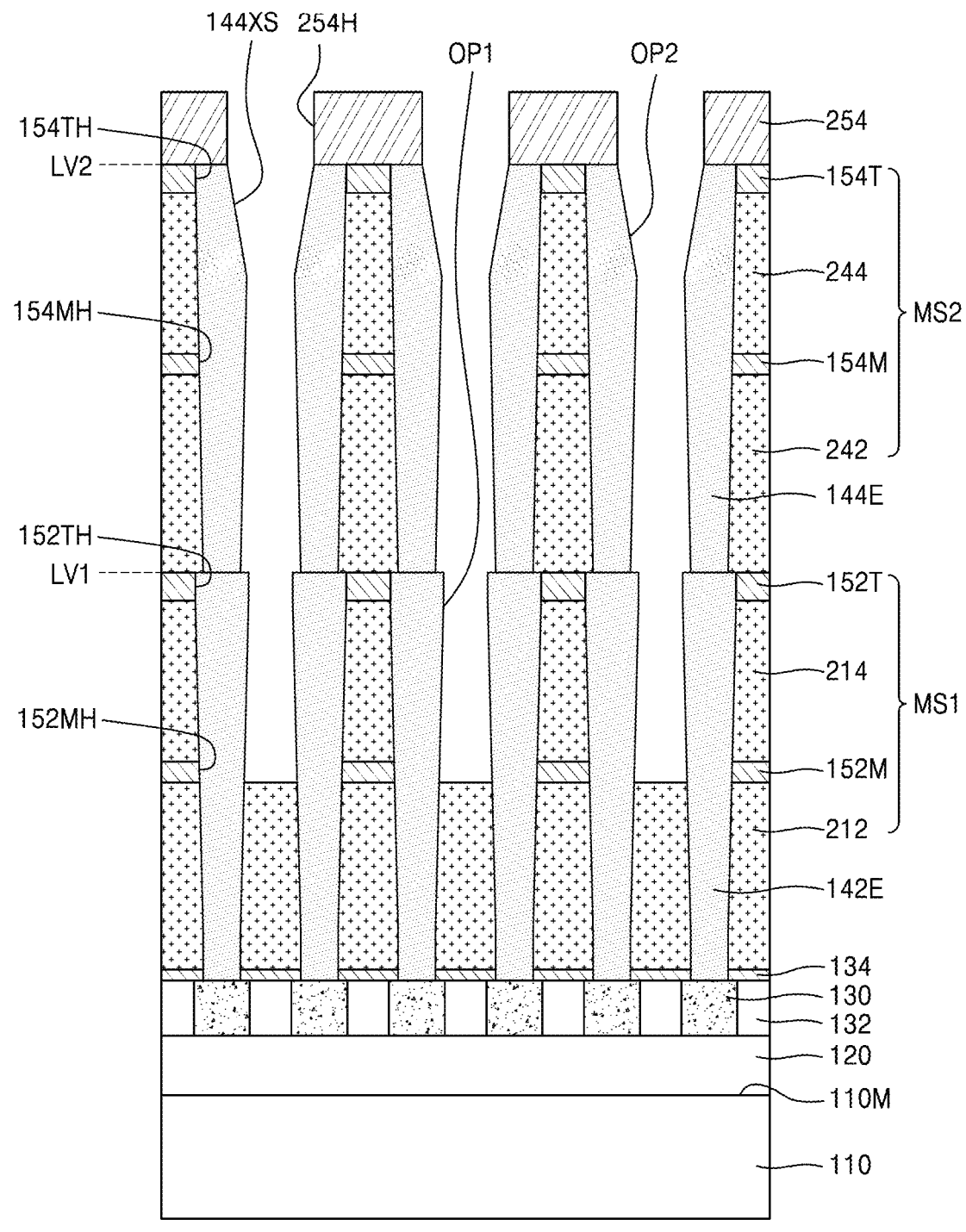

Referring to FIGS. 31A and 31B, the opening MSH2 penetrating the second mold stack MS2 may be formed. The second lower electrode portion 144E may be formed by forming a conductive layer (not shown) on the second mold stack MS2 to fill the opening MSH2 and removing a top portion of the conductive layer until the top surface of the second top supporting pattern 154T is exposed.

Next, the fourth mask pattern 254 including the opening 254H may be formed on the second lower electrode portion 144E and the second mold stack MS2. Next, the second mold opening OP2 may be formed by removing a portion of each of the second top supporting pattern 154T, the fourth mold layer 244, and the second middle supporting pattern 154 by using the fourth mask pattern 254 as an etching mask.

The first mold opening OP1 may be formed by removing the portion of the third mold layer 242 exposed at the bottom portion of the second mold opening OP2 and further etching the first top supporting pattern 152T, the second mold layer 214, and the first middle supporting pattern 152M exposed at the bottom portion of the second mold opening OP2. That is, a process for forming the second mold opening OP2 and a process for forming the first mold opening OP1 may be sequentially performed.

Next, the inclined surface 144XS may be formed at an upper portion of the second lower electrode portion 144E by performing a trimming process on the upper portion of the second lower electrode portion 144E exposed by the second mold opening OP2.

Figure 32A:
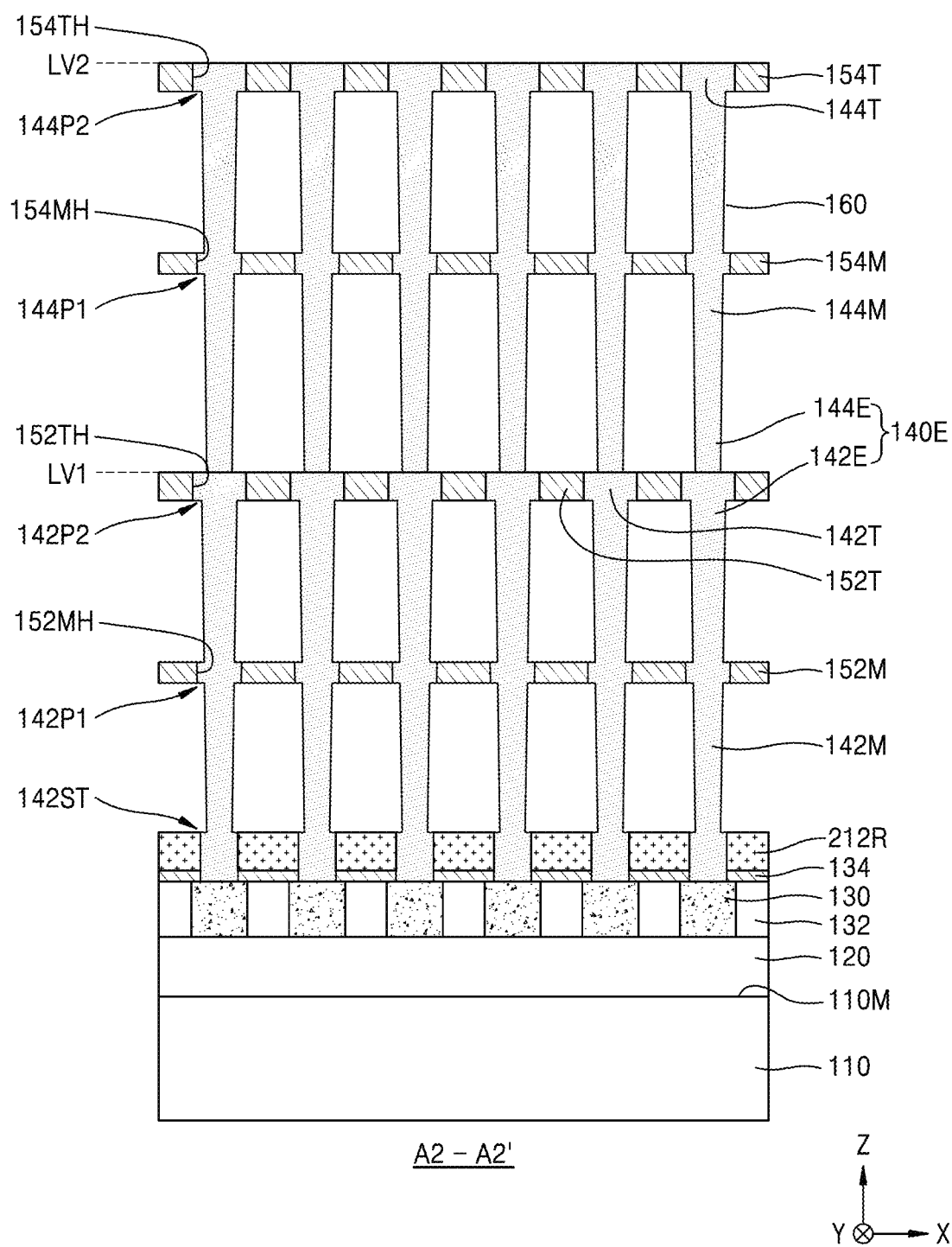
Figure 32B:
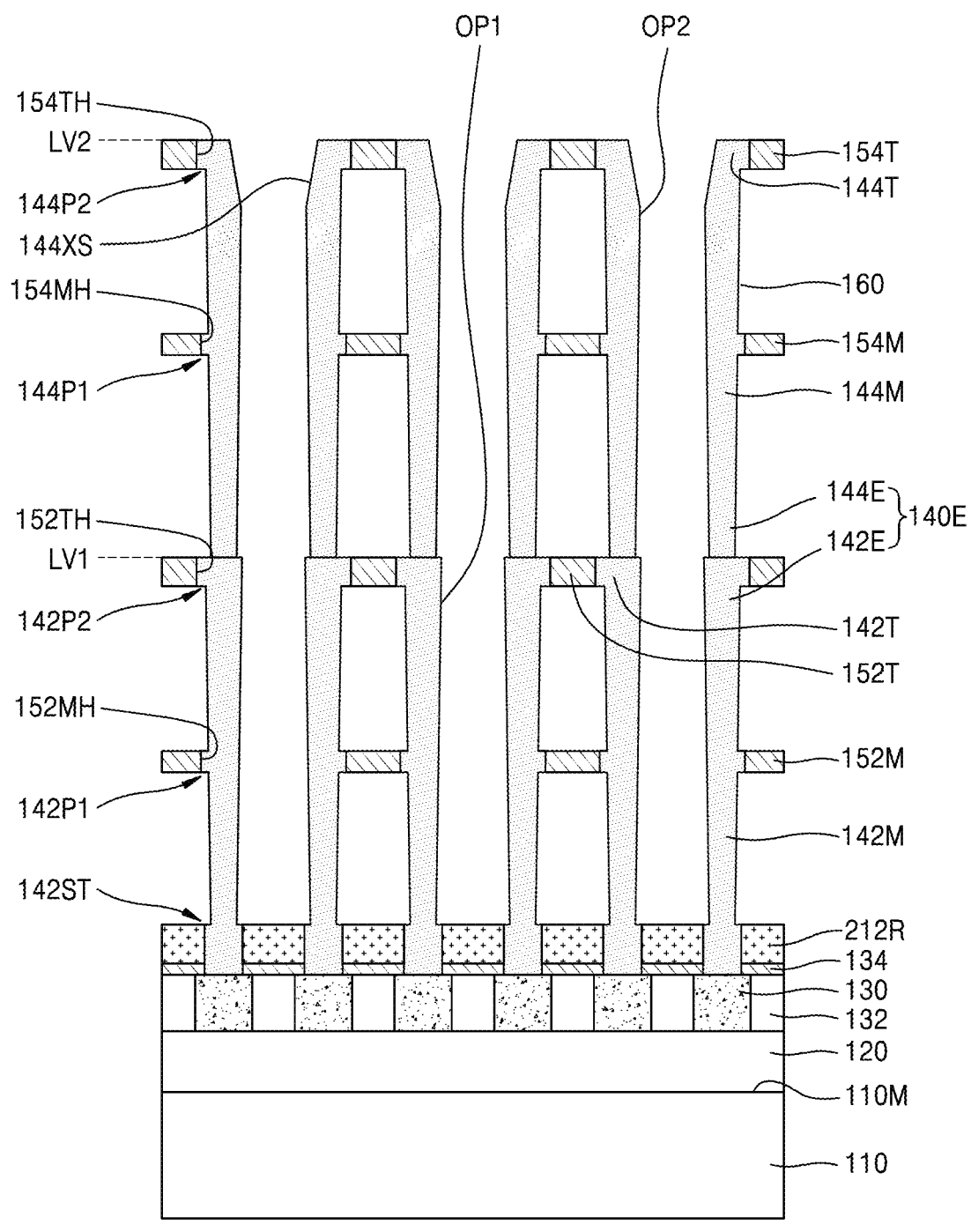

Referring to FIGS. 32A and 32B, the first mold layer remaining portion 212R may be formed by removing the fourth mold layer 244, the third mold layer 242, the second mold layer 214, and a portion of the first mold layer 212. The first mold layer remaining portion 212R may surround a lower portion of the side wall of the first lower electrode portion 142E.

Next, horizontal widths of the first lower electrode portion 142E and the second lower electrode portion 144E may be decreased by performing a trimming process on an exposed portion of the first lower electrode portion 142E and an exposed portion of the second lower electrode portion 144E.

A portion of the side wall of the first lower electrode portion 142 surrounded by the first middle supporting pattern 152M and the first top region 142T of the first lower electrode portion 142E surrounded by the first top supporting pattern may not have a decrease in horizontal widths, and therefore, the first protrusion 142P1 being in contact with the first middle supporting pattern 152M and the second protrusion 142P2 being in contact with the first top supporting pattern 152T may be formed. Likewise, a portion of the side wall of the second lower electrode portion 144E surrounded by the second middle supporting pattern 154M and the second top region 144T of the second lower electrode portion 144E surrounded by the second top supporting pattern 154T may not have a decrease in horizontal widths, and therefore, the third protrusion 144P1 being in contact with the second middle supporting pattern 154M and the fourth protrusion 144P2 being in contact with the second top supporting pattern 154T may be formed. In addition, a horizontal width of the side wall of the first lower electrode portion 142E covered by the first mold layer remaining portion 212R may not be decreased, and the step portion 142ST may be formed at a same, or, substantially the same, level as that of the top surface of the first mold layer remaining portion 212R.

Figure 33A:
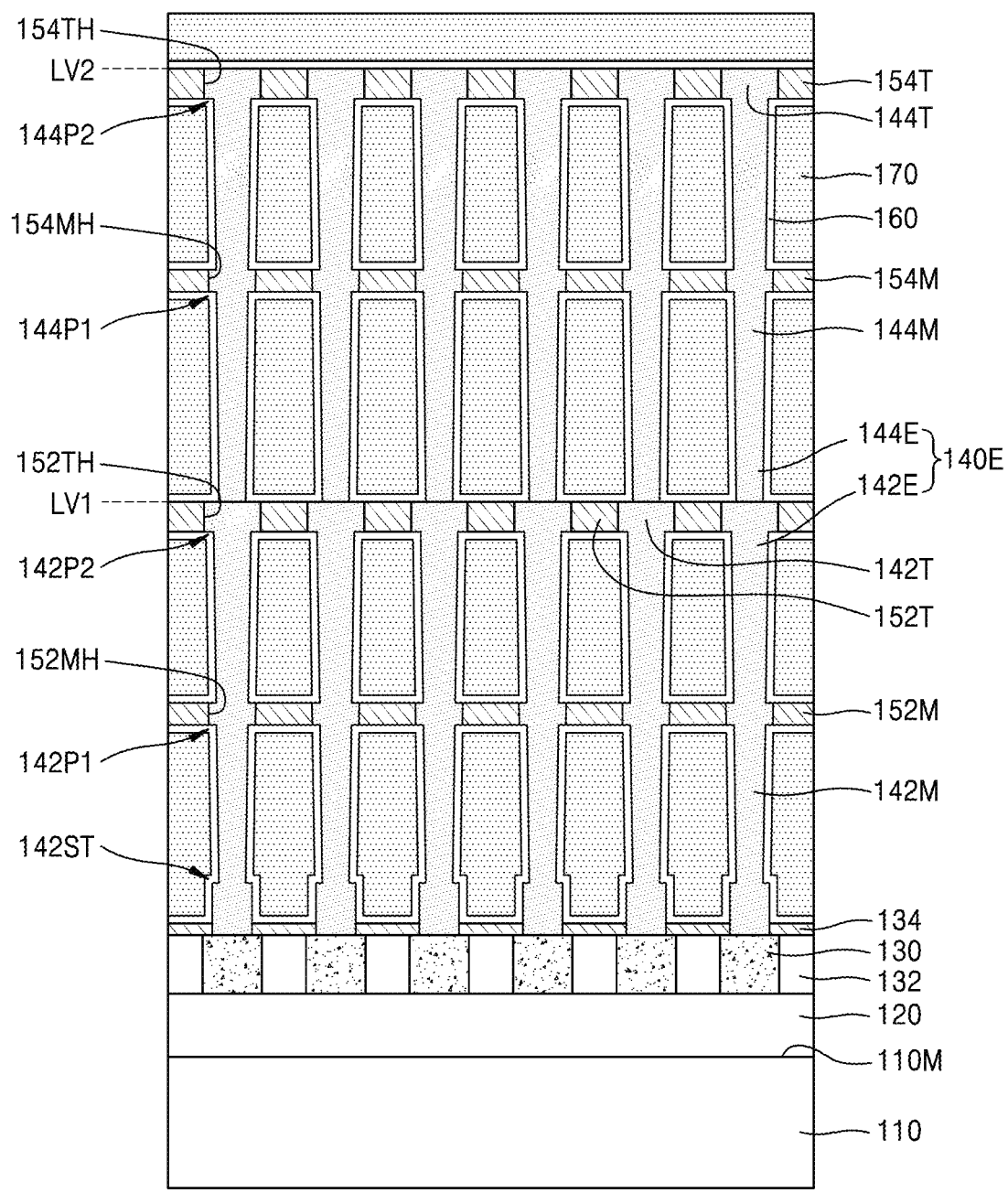
Figure 33B:
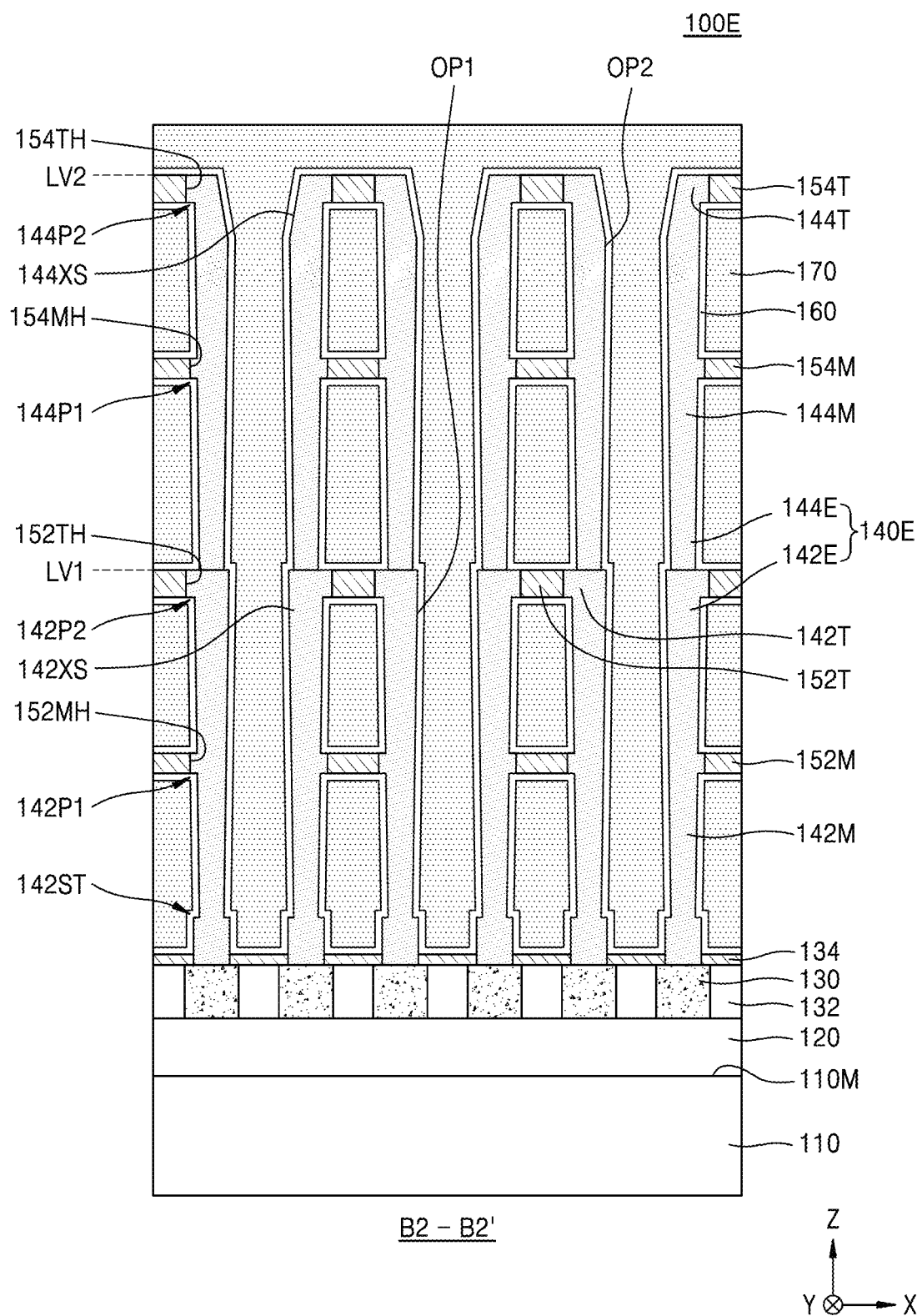

Referring to FIGS. 33A and 33B, the dielectric layer 160 may be conformally formed on the exposed surfaces of the first lower electrode portion 142E and the second lower electrode portion 144E. Next, the upper electrode 170 may be formed on the dielectric layer 160.

According to a method of manufacturing the integrated circuit device 100E according to some example embodiments, a trimming process for decreasing a width of the side wall of the first lower electrode portion 142E and a trimming process for decreasing a width of the side wall of the second lower electrode portion 144E may be simultaneously performed. The lower electrode 140E may have an increased height, and at the same time, occurrence of bridge failure or occurrence of the leakage current in the lower electrode 140E may be prevented or reduced.

While the inventive concepts has been particularly shown and described with reference to embodiments thereof, it will be understood that various changes in form and details may be made therein without departing from the spirit and scope of the following claims.

What is claimed is:

1. An integrated circuit device comprising:
   a lower electrode on a substrate, the lower electrode including
      a first lower electrode portion extending in a first direction perpendicular to a top surface of the substrate and including a first main region and a first top region, the first top region above the first main region, and
      a second lower electrode portion extending in the first direction on the first lower electrode portion and including a second main region and a second top region, the second top region above the second main region, the second lower electrode portion includes an inclined surface in the second top region;
   a first top supporting pattern surrounding at least a portion of a side wall of the first top region of the first lower electrode portion; and
   a second top supporting pattern surrounding at least a portion of a side wall of the second top region of the second lower electrode portion, the inclined surface separated from the second top supporting pattern and on an opposing face to a portion of the second top region contacting the second top supporting pattern,
   the second lower electrode portion including a protrusion protruding outward to the second top supporting pattern.

2. The integrated circuit device of claim 1, wherein the second lower electrode portion includes a step portion at a side wall of the second main region.

3. The integrated circuit device of claim 1, further comprising:
   a first middle supporting pattern surrounding at least a portion of a side wall of the first main region of the first lower electrode portion; and
   a second middle supporting pattern surrounding at least a portion of a side wall of the second main region of the second lower electrode portion,
   wherein the second lower electrode portion includes a protrusion protruding outward to the second middle supporting pattern.

4. The integrated circuit device of claim 1, wherein the first lower electrode portion includes a protrusion protruding outward to the first top supporting pattern, and
   the first lower electrode portion includes a step portion at a side wall of the first main region.

5. The integrated circuit device of claim 1, wherein the second top supporting pattern defines a second mold opening, and
   wherein the inclined surface is exposed by the second mold opening and is not surrounded by the second top supporting pattern.

6. The integrated circuit device of claim 1, wherein the first top supporting pattern defines a first mold opening, and
   the first lower electrode portion includes an inclined surface in the first top region, wherein the inclined surface is exposed by the first mold opening and is not surrounded by the first top supporting pattern.

7. The integrated circuit device of claim 6, wherein a bottom portion of the second lower electrode portion protrudes outward with respect to the inclined surface of the first lower electrode portion.

8. The integrated circuit device of claim 1, further comprising:
   a first spacer arranged between a first top supporting pattern and the first top region of the first lower electrode portion; and
   a second spacer arranged between the second top supporting pattern and the second top region of the second lower electrode portion.

9. The integrated circuit device of claim 8, wherein a top surface of the first spacer is at a same level as a top surface of the first top supporting pattern, and
   a bottom surface of the first spacer is at a same level as a bottom surface of the first top supporting pattern.

10. The integrated circuit device of claim 8, wherein a horizontal width of the first spacer at a same level as a top surface of the first top supporting pattern is greater than a horizontal width at a same level as a bottom surface of the first top supporting pattern.

11. The integrated circuit device of claim 1, wherein the first lower electrode portion includes a first seam region extending in the first direction, and
   the second lower electrode portion includes a second seam region that extends in the first direction and is not connected to the first seam region.

12. An integrated circuit device comprising:
   a lower electrode arranged on a substrate, the lower electrode including
      a first lower electrode portion extending in a first direction perpendicular to a top surface of the substrate and including a first main region and a first top region, the first top region above the first main region, and
      a second lower electrode portion extending in the first direction on the first lower electrode portion and including a second main region and a second top region, the second top region above the second main region;
   a first top supporting pattern surrounding at least a portion of a side wall of the first top region of the first lower electrode portion;

a first middle supporting pattern surrounding at least a portion of a side wall of the first main region of the first lower electrode portion; and a second top supporting pattern surrounding at least a portion of a side wall of the second top region of the second lower electrode portion, the first lower electrode portion includes a protrusion protruding outward to the first top supporting pattern, and the second lower electrode portion includes a protrusion protruding outward to the second top supporting pattern.

13. The integrated circuit device of claim 12, wherein a second height of the second lower electrode portion in the first direction is less than a first height of the first lower electrode portion in the first direction.

14. The integrated circuit device of claim 12, wherein the first lower electrode portion includes a step portion at the side wall of the first main region, and the second lower electrode portion includes a step portion at a side wall of the second main region.

15. The integrated circuit device of claim 12, wherein the second top supporting pattern defines a second mold opening, the second lower electrode portion includes an inclined surface in the second top region, wherein the inclined surface is exposed by the second mold opening and is not surrounded by the second top supporting pattern, the first top supporting pattern defines a first mold opening, and the first lower electrode portion includes an inclined surface in the first top region, wherein the inclined surface is exposed by the first mold opening and is not surrounded by the first top supporting pattern.

16. The integrated circuit device of claim 15, wherein a bottom portion of the second lower electrode portion protrudes outward with respect to the inclined surface of the first lower electrode portion.

17. The integrated circuit device of claim 12, further comprising:

a first spacer arranged between the protrusion of the first lower electrode portion and the first top supporting pattern; and a second spacer between the protrusion of the second lower electrode portion and the second top supporting pattern.

18. An integrated circuit device comprising:

a lower electrode arranged on a substrate, the lower electrode including a first lower electrode portion extending in a first direction perpendicular to a top surface of the substrate, and a second lower electrode portion extending in a second direction on the first lower electrode portion;

a first top supporting pattern surrounding an upper portion of a side wall of the first lower electrode portion;

a first middle supporting pattern surrounding a portion of the side wall of the first lower electrode portion at a vertical level lower than a bottom surface of the first top supporting pattern; and a second top supporting pattern surrounding an upper portion of a side wall of the second lower electrode portion, the second lower electrode portion including a protrusion that is in contact with the second top supporting pattern, and the side wall of the first lower electrode portion including a step portion at a vertical lower than a bottom surface of the first middle supporting pattern.

19. The integrated circuit device of claim 18, further comprising a second middle supporting pattern surrounding a portion of the side wall of the second lower electrode portion at a vertical level lower than a bottom surface of the second top supporting pattern, wherein the second lower electrode portion includes a protrusion that is in contact with the second middle supporting pattern.

20. The integrated circuit device of claim 19, wherein the side wall of the second lower electrode portion includes a step portion at a vertical level lower than a bottom surface of the second middle supporting pattern.

* * * * *